United States Patent
Cantoro et al.

(10) Patent No.: US 10,453,756 B2
(45) Date of Patent: Oct. 22, 2019

(54) METHOD FOR MANUFACTURING A SEMICONDUCTOR DEVICE INCLUDING A PAIR OF CHANNEL SEMICONDUCTOR PATTERNS

(71) Applicant: SAMSUNG ELECTRONICS CO., LTD., Suwon-si, Gyeonggi-Do (KR)

(72) Inventors: Mirco Cantoro, Suwon-si (KR); Maria Toledano Luque, Hwaseong-si (KR); Yeoncheol Heo, Suwon-si (KR); Dong Il Bae, Bupyeong-Gu (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/937,037

(22) Filed: Mar. 27, 2018

(65) Prior Publication Data

US 2018/0218950 A1    Aug. 2, 2018

Related U.S. Application Data

(63) Continuation of application No. 15/415,012, filed on Jan. 25, 2017, now Pat. No. 9,953,883.

(30) Foreign Application Priority Data

Apr. 11, 2016  (KR) .......................... 10-2016-0044380
Jul. 5, 2016   (KR) .......................... 10-2016-0084926

(51) Int. Cl.
*H01L 21/308*     (2006.01)
*H01L 21/8238*    (2006.01)
(Continued)

(52) U.S. Cl.
CPC .. *H01L 21/823821* (2013.01); *H01L 21/0217* (2013.01); *H01L 21/02167* (2013.01);
(Continued)

(58) Field of Classification Search
None
See application file for complete search history.

(56) References Cited

U.S. PATENT DOCUMENTS 7,575,962 B2    8/2009   Cho et al.
7,638,381 B2    12/2009  Cheng et al.
(Continued)

FOREIGN PATENT DOCUMENTS

KR    10-1146588    5/2012
KR    10-1367988    2/2014
(Continued)

OTHER PUBLICATIONS

Nakaharai et al., "Characterization of 7-nm-thick strained Ge-on-insulator layer fabricated by Ge-condensation technique", Applied Physics Letters vol. 83, No. 17, Oct. 27, 2003, pp. 3516-3518.

*Primary Examiner* — Bilkis Jahan
(74) *Attorney, Agent, or Firm* — F. Chau & Associates, LLC

(57) ABSTRACT

A method for manufacturing a semiconductor device includes forming a semiconductor layer on a substrate, the semiconductor layer including a first semiconductor material and a second semiconductor material, patterning the semiconductor layer to form a preliminary active pattern, oxidizing at least two sidewalls of the preliminary active pattern to form an oxide layer on each of the at least two sidewalls of the preliminary active pattern, at least two upper patterns and a semiconductor pattern being formed in the preliminary active pattern when the oxide layers are formed, the semiconductor pattern being disposed between the at least two upper patterns, and removing the semiconductor pattern to form an active pattern, the active pattern including the at least two upper patterns. A concentration of the second semiconductor material in each of the at least two upper (Continued)

patterns is higher than a concentration of the second semiconductor material in the semiconductor pattern.

9 Claims, 69 Drawing Sheets

(51) Int. Cl.
    *H01L 21/02*     (2006.01)
    *H01L 21/306*     (2006.01)
    *H01L 21/311*     (2006.01)
    *H01L 27/092*     (2006.01)
    *H01L 29/423*     (2006.01)
    *H01L 29/66*     (2006.01)
    *H01L 29/78*     (2006.01)
    *H01L 27/11*     (2006.01)
    *H01L 29/06*     (2006.01)
    *H01L 29/08*     (2006.01)
    *H01L 29/165*     (2006.01)
    *H01L 29/161*     (2006.01)
    *H01L 29/417*     (2006.01)

(52) U.S. Cl.
    CPC .. *H01L 21/02233* (2013.01); *H01L 21/02532* (2013.01); *H01L 21/02639* (2013.01); *H01L 21/308* (2013.01); *H01L 21/30604* (2013.01); *H01L 21/31111* (2013.01); *H01L 21/823807* (2013.01); *H01L 27/0924* (2013.01); *H01L 29/42376* (2013.01); *H01L 29/66636* (2013.01); *H01L 29/7848* (2013.01); *H01L 21/02255* (2013.01); *H01L 21/02612* (2013.01); *H01L 27/092* (2013.01); *H01L 27/1104* (2013.01); *H01L 29/0649* (2013.01); *H01L 29/0847* (2013.01); *H01L 29/161* (2013.01); *H01L 29/165* (2013.01); *H01L 29/41791* (2013.01); *H01L 29/66545* (2013.01)

(56) References Cited

U.S. PATENT DOCUMENTS

| | | | |
|---|---|---|---|
| 8,017,463 B2 | 9/2011 | Chang | |
| 8,053,299 B2 | 11/2011 | Xu | |
| 8,716,156 B1 | 5/2014 | Pawlak et al. | |
| 8,828,818 B1 | 9/2014 | Rodder | |
| 8,841,178 B1 | 9/2014 | Basker et al. | |
| 8,847,281 B2 | 9/2014 | Cea et al. | |
| 9,093,326 B2 | 7/2015 | Cheng et al. | |
| 9,093,533 B2 | 7/2015 | Cheng et al. | |
| 9,142,418 B1 | 9/2015 | Jung et al. | |
| 9,159,835 B2 | 10/2015 | Kavalieros et al. | |
| 9,257,556 B2 | 2/2016 | Xu et al. | |
| 9,299,840 B2 | 3/2016 | Xu | |
| 2009/0065877 A1* | 3/2009 | Tsuchiaki | H01L 21/32 257/410 |
| 2009/0090934 A1* | 4/2009 | Tezuka | H01L 27/1211 257/190 |
| 2009/0261381 A1 | 10/2009 | Kim et al. | |
| 2010/0197121 A1* | 8/2010 | Kim | H01L 27/10817 438/486 |
| 2012/0264268 A1* | 10/2012 | Lee | H01L 27/11526 438/289 |
| 2013/0224936 A1* | 8/2013 | Lee | H01L 21/823431 438/492 |
| 2014/0027860 A1 | 1/2014 | Glass et al. | |
| 2015/0132920 A1 | 5/2015 | Vellianitis et al. | |
| 2015/0140756 A1* | 5/2015 | Yu | H01L 29/66795 438/275 |
| 2015/0187946 A1* | 7/2015 | Park | H01L 29/66795 257/368 |
| 2015/0194525 A1 | 7/2015 | Xu et al. | |
| 2015/0214345 A1* | 7/2015 | Wan | H01L 29/7848 257/105 |
| 2015/0228853 A1 | 8/2015 | Chen et al. | |
| 2015/0333069 A1* | 11/2015 | Kim | H01L 27/10814 257/334 |
| 2016/0181425 A1 | 6/2016 | Bai et al. | |
| 2017/0117192 A1* | 4/2017 | Min | H01L 21/823821 |
| 2017/0294359 A1 | 10/2017 | Cantoro et al. | |

FOREIGN PATENT DOCUMENTS

| | | |
|---|---|---|
| KR | 10-1408875 | 6/2014 |
| KR | 10-2014-0112368 | 9/2014 |
| KR | 10-2015-0023440 | 3/2015 |
| KR | 10-1536530 | 7/2015 |
| KR | 10-2015-0091027 | 8/2015 |
| KR | 10-1553442 | 9/2015 |

* cited by examiner

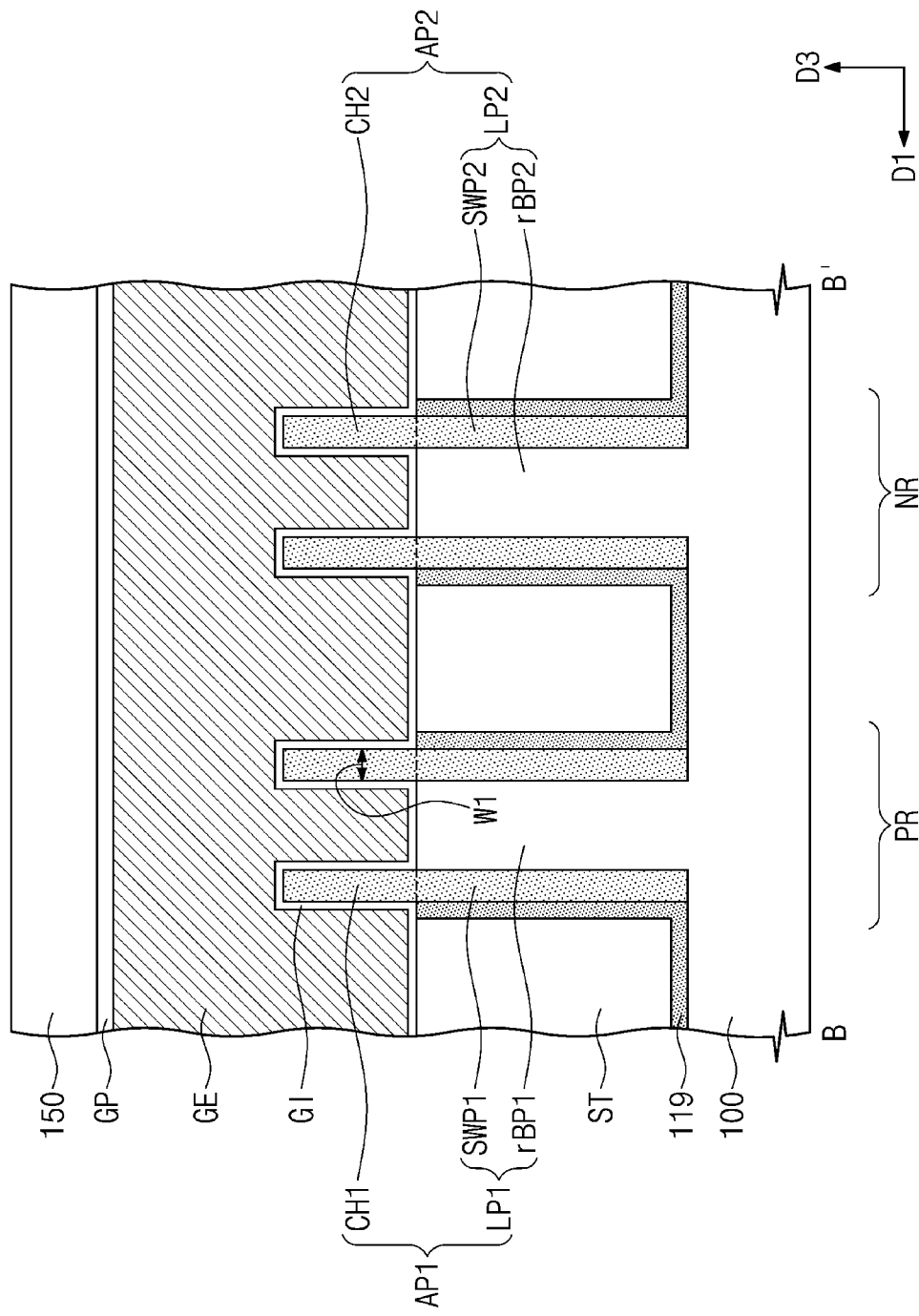

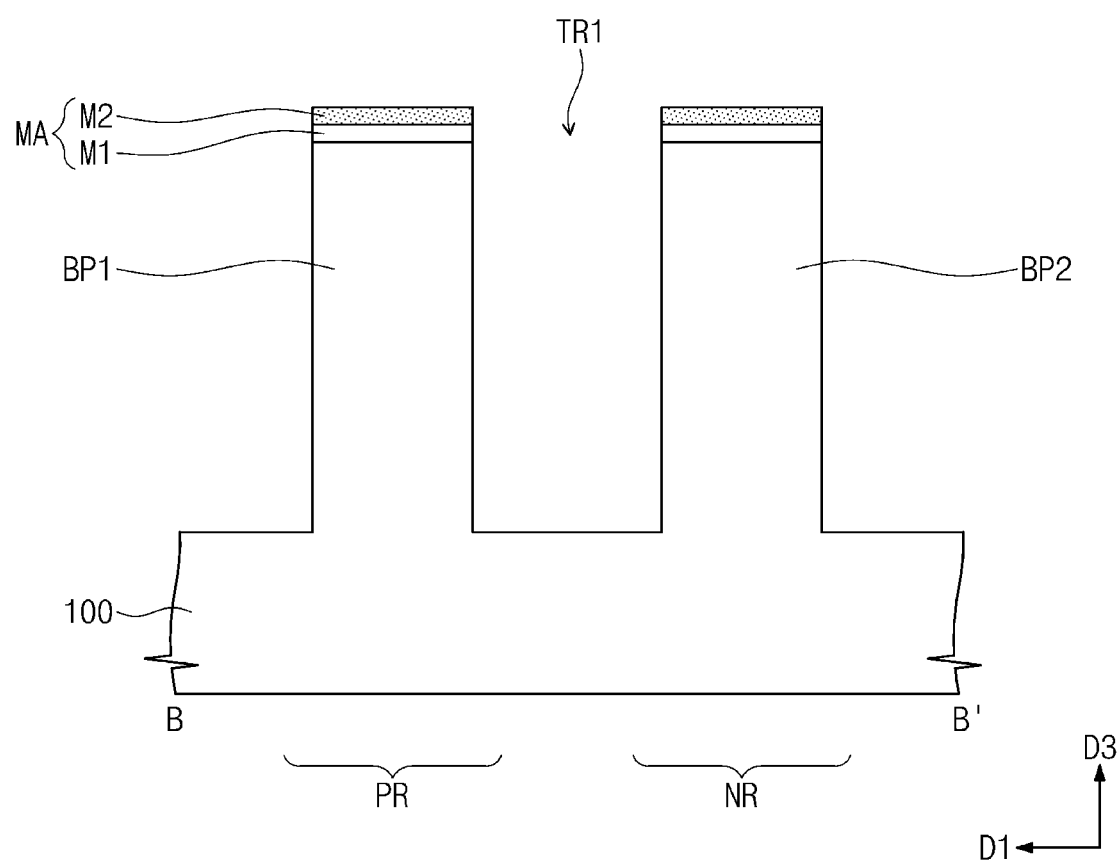

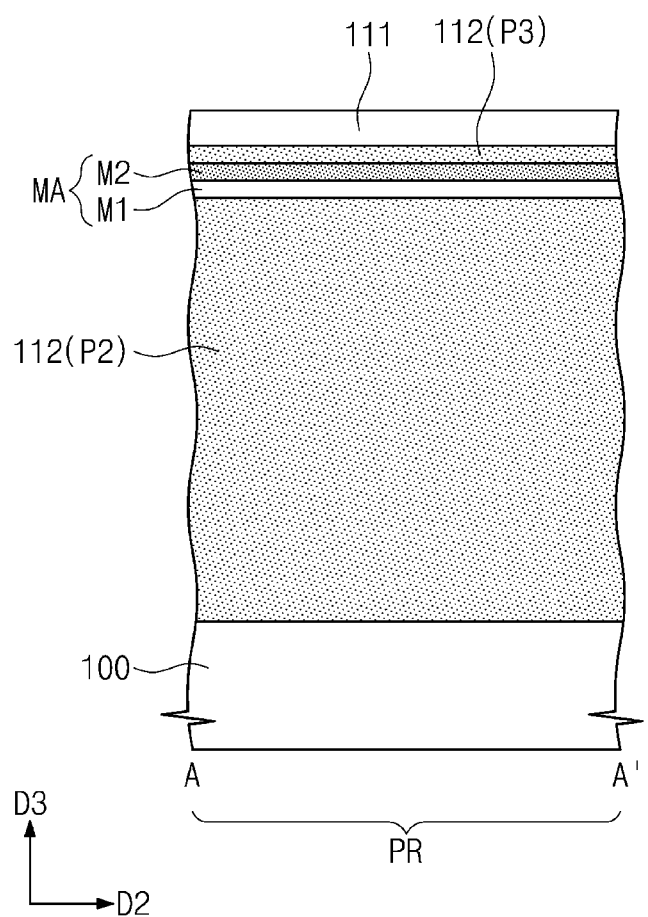

METHOD FOR MANUFACTURING A SEMICONDUCTOR DEVICE INCLUDING A PAIR OF CHANNEL SEMICONDUCTOR PATTERNS

CROSS-REFERENCE TO RELATED APPLICATIONS

This U.S. non-provisional Patent Application is a Continuation of Co-Pending U.S. patent application Ser. No. 15/415,012, filed on Jan. 25, 2017, which claims priority under 35 U.S.C. § 119 to Korean Patent Application Nos. 10-2016-0044380 and 10-2016-0084926, respectively filed in the Korean Intellectual Property Office on Apr. 11, 2016, and Jul. 5, 2016, the disclosures of which are incorporated by reference herein in their entireties.

TECHNICAL FIELD

Exemplary embodiments of the inventive concept relate to a semiconductor device and more particularly, to a semiconductor device including a field effect transistor and a method for manufacturing the same.

DISCUSSION OF THE RELATED ART

Semiconductor devices are widely used in the electronics industry due to their low manufacturing cost, widespread applicability and small size. A semiconductor device may include a semiconductor memory device used to store logical data, a semiconductor logic device used to process logic data, and/or a hybrid semiconductor device which may be used to store and process logic data. When a size of a semiconductor device is reduced, a larger number of semiconductor devices can be included in an electronic device, and/or the electronic device can be made smaller. However, as the size of a semiconductor device is reduced, the reliability of the semiconductor device may decrease and the production cost of the semiconductor device may increase.

SUMMARY

According to an exemplary embodiment of the inventive concept, a method for manufacturing a semiconductor device includes forming a semiconductor layer on a substrate, the semiconductor layer including a first semiconductor material and a second semiconductor material, patterning the semiconductor layer to form a preliminary active pattern, oxidizing at least two sidewalls of the preliminary active pattern to form an oxide layer on each of the at least two sidewalls of the preliminary active pattern, wherein at least two upper patterns and a semiconductor pattern are formed in the preliminary active pattern when the oxide layers are formed, the semiconductor pattern being disposed between the at least two upper patterns, and removing the semiconductor pattern to form an active pattern, the active pattern including the at least two upper patterns. A concentration of the second semiconductor material in each of the at least two upper patterns is higher than a concentration of the second semiconductor material in the semiconductor pattern.

According to an exemplary embodiment of the inventive concept, a method for manufacturing a semiconductor device includes forming an active pattern on a substrate, and forming a gate electrode intersecting the active pattern, the gate electrode extending in a first direction. The forming of the active pattern includes forming a lower pattern and a pair of channel patterns on the lower pattern. The lower pattern includes a first semiconductor material. Each of the pair of channel patterns includes a second semiconductor material different from the first semiconductor material. A first portion of the gate electrode is disposed between the pair of channel patterns. A width of the first portion of the gate electrode, measured along the first direction, decreases in a direction away from the substrate.

According to an exemplary embodiment of the inventive concept, a semiconductor device includes a substrate, an active pattern disposed on the substrate, the active pattern including a lower pattern and a pair of channel patterns disposed on the lower pattern, and a gate electrode intersecting the pair of channel patterns and extending in a first direction. The lower pattern includes a first semiconductor material. Each of the pair of channel patterns includes a second semiconductor material different from the first semiconductor material. The gate electrode includes a first portion disposed between the pair of channel patterns. A width of the first portion of the gate electrode decreases in a direction perpendicular to a surface of the substrate facing the gate electrode, the width of the first portion being measured along the first direction.

According to an exemplary embodiment of the inventive concept, a method for manufacturing a semiconductor device includes forming a base pattern protruding from a substrate, forming a semiconductor layer covering the base pattern, oxidizing the semiconductor layer to form an oxide layer, and forming a channel semiconductor layer between the oxide layer and the substrate and between the oxide layer and the base pattern, patterning the channel semiconductor layer to form a pair of channel semiconductor patterns on opposing sidewalls of the base pattern, and removing a portion of the base pattern disposed between the pair of channel semiconductor patterns to form an active pattern, the active pattern including the pair of channel semiconductor patterns. The base pattern includes a first semiconductor material. The semiconductor layer includes the first semiconductor material and a second semiconductor material different from the first semiconductor material.

According to an exemplary embodiment of the inventive concept, a method for manufacturing a semiconductor device includes forming an active pattern, and forming a gate electrode intersecting the active pattern, the gate electrode extending in the first direction. The active pattern includes a lower pattern protruding from a substrate, and a pair of channel patterns spaced apart from each other in a first direction on the lower pattern. The forming of the active pattern includes forming a semiconductor layer including a first semiconductor material and a second semiconductor material on the substrate, and performing an oxidation process to form an oxide layer of the first semiconductor material and to form a first layer on the oxide layer or at a side of the oxide layer, wherein the second semiconductor material is concentrated in the first layer. Each of the pair of channel patterns includes at least a portion of the first layer.

BRIEF DESCRIPTION OF THE DRAWINGS

The above and other features of the inventive concept will become more apparent by describing in detail exemplary embodiments thereof in conjunction with the accompanying drawings, in which:

FIGS. 14A, 14B, and 14C are cross-sectional views taken along lines A-A', B-B', and C' C' of FIG. 1, respectively, illustrating a semiconductor device according to an exemplary embodiment of the inventive concept;

FIGS. 15B, 16B, 17B, 18B, 19B, 20B, 21B, and 22B are cross-sectional views taken along lines A-A' of FIGS. 15A, 16A, 17A, 18A, 19A, 20A, 21A, and 22A, respectively;

FIGS. 15C, 16C, 17C, 18C, 19C, 20C, 21C, and 22C are cross-sectional views taken along lines B-B' of FIGS. 15A, 16A, 17A, 18A, 19A, 20A, 21A, and 22A, respectively;

DETAILED DESCRIPTION OF THE EMBODIMENTS

Figure 1:
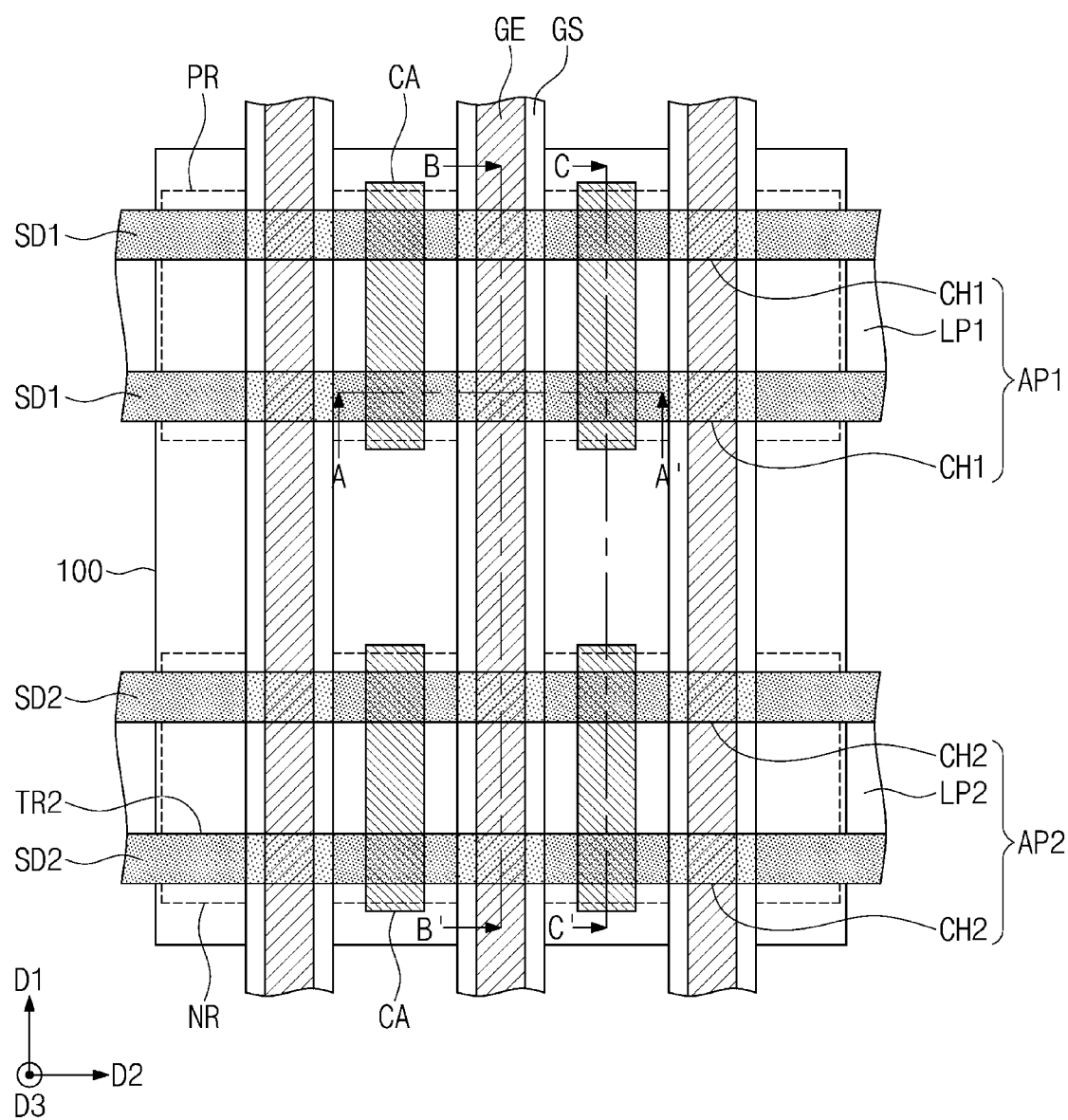
FIG. 1 is a plan view illustrating a semiconductor device according to an exemplary embodiment of the inventive concept.

Exemplary embodiments of the inventive concept will be described hereinafter in detail with reference to the accompanying drawings. The proportions of elements in the drawings may be exaggerated for clarity. Like reference numerals may refer to like elements throughout the specification.

Figure 2A:
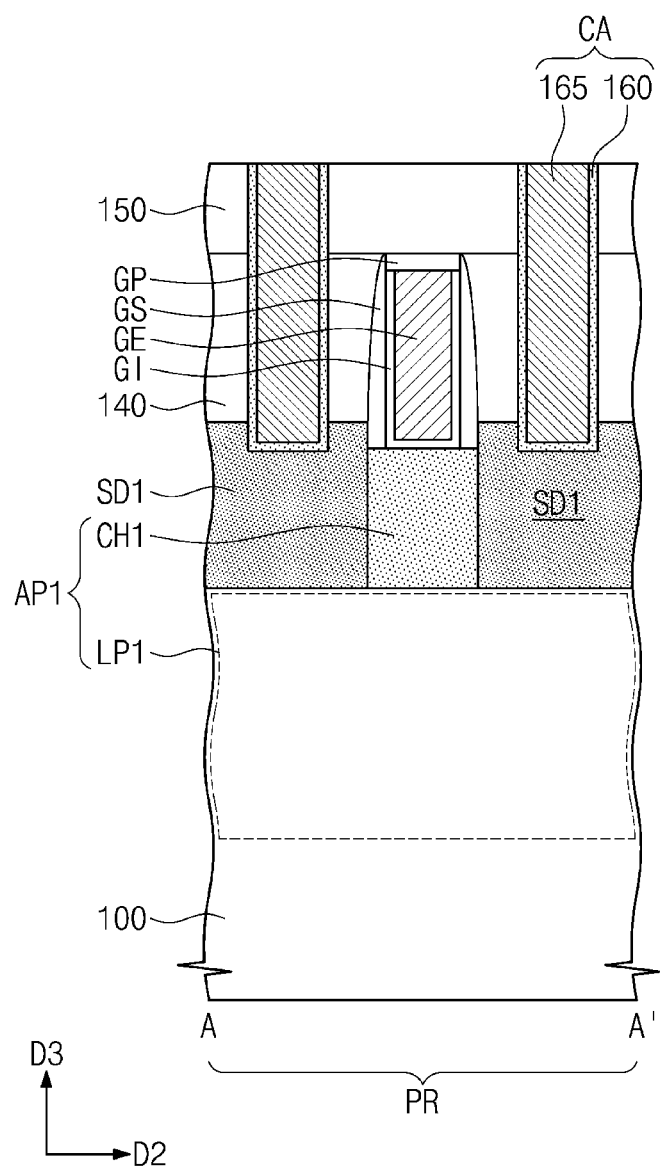
FIGS. 2A, 2B, and 2C are cross-sectional views taken along lines A-A', B-B', and, C-C' of FIG. 1, respectively.
Figure 2B:
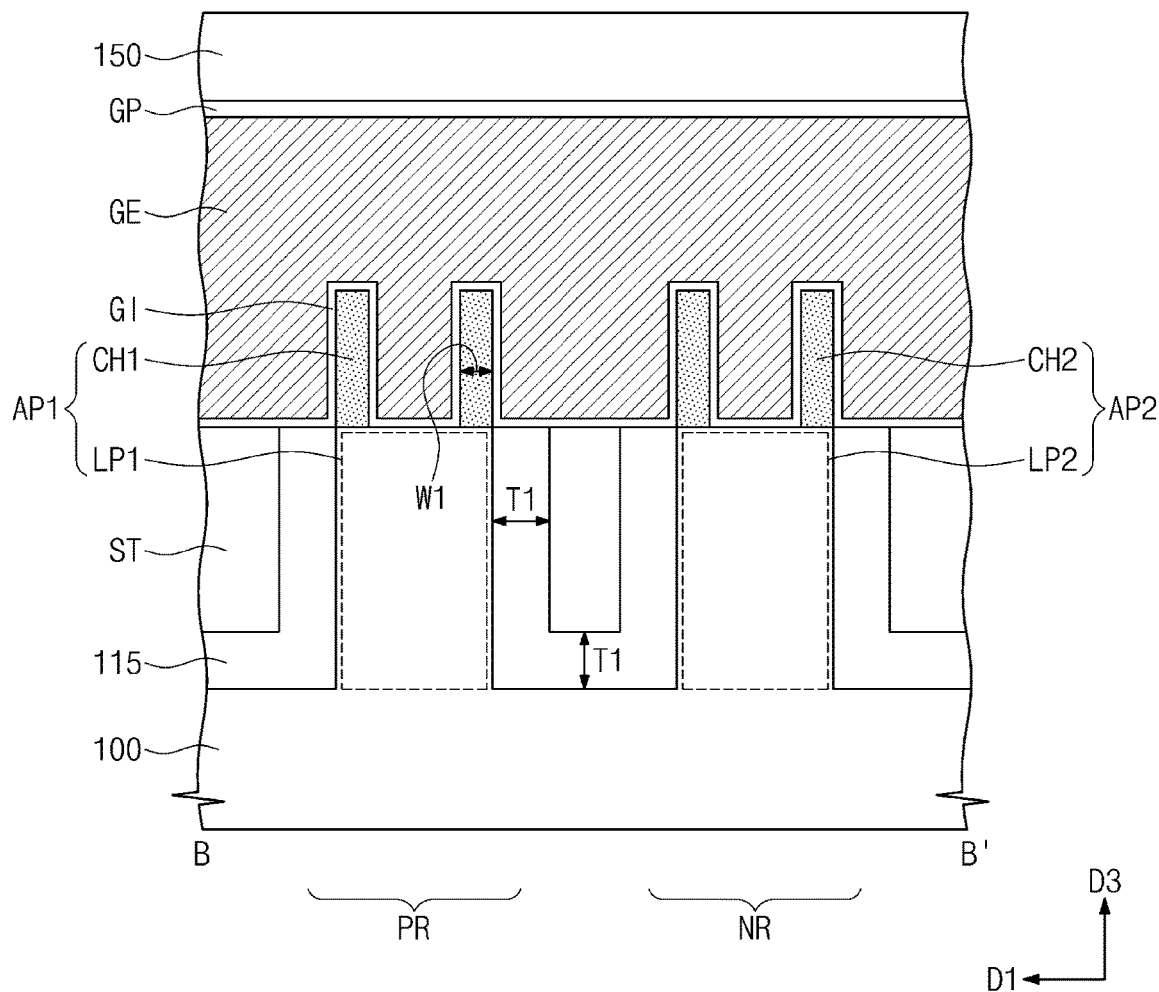
Figure 2C:
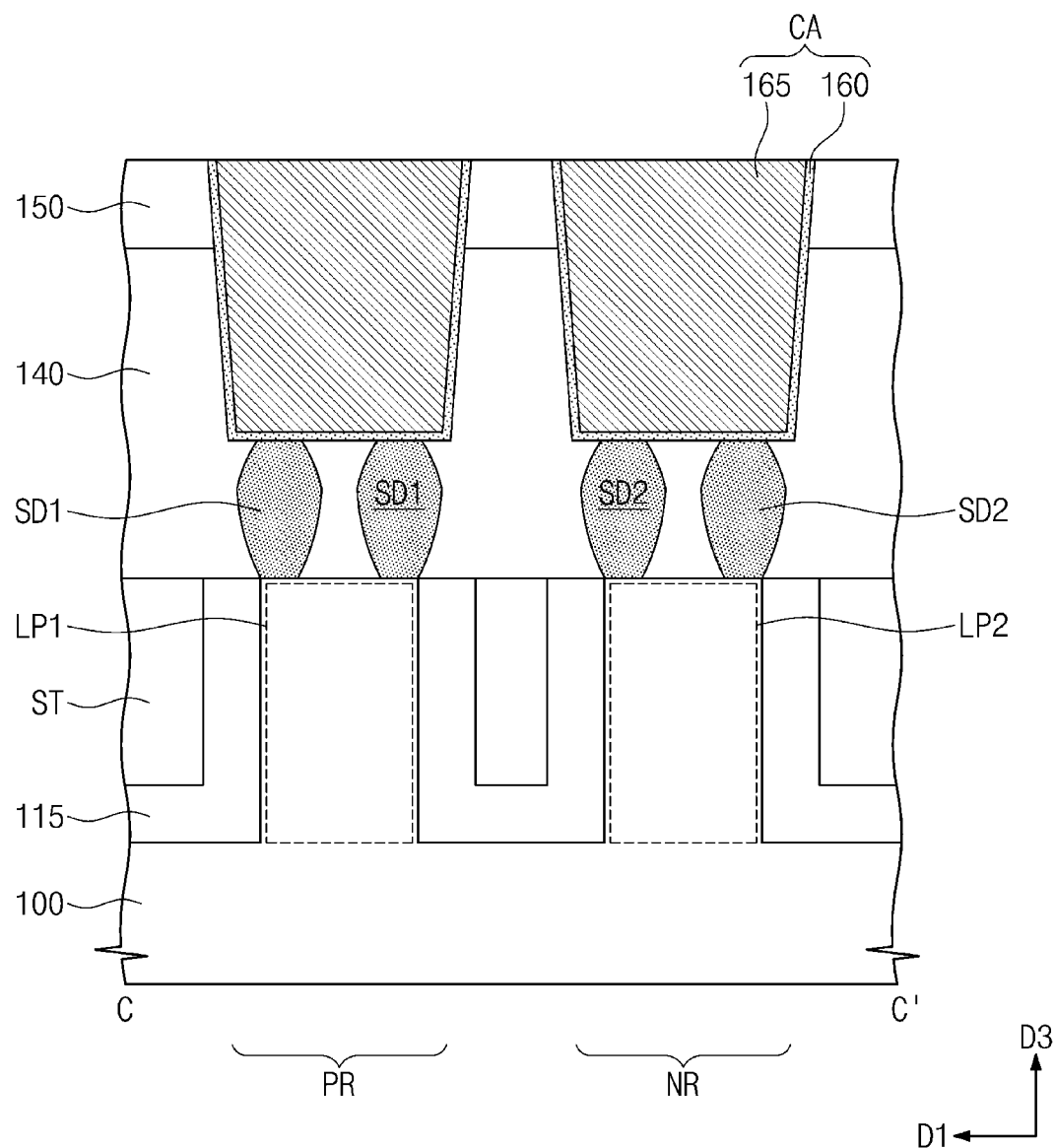

FIG. 1 is a plan view illustrating a semiconductor device according to an exemplary embodiment of the inventive concept, FIGS. 2A, 2B, and 2C are cross-sectional views taken along lines A-A', B-B', and, C-C' of FIG. 1, respectively.

Referring to FIGS. 1, 2A, 2B, and 2C, a substrate 100 may include a p-type metal oxide semiconductor field-effect transistor (PMOSFET) region PR and an n-type metal oxide semiconductor field-effect transistor (NMOSFET) region NR. In an exemplary embodiment of the inventive concept, the substrate 100 may be a silicon substrate. The PMOSFET region PR may be an active region on which P-channel transistors are disposed, and the NMOSFET region NR may be an active region on which N-channel transistors are disposed. In an exemplary embodiment of the inventive concept, the substrate 100 may include a plurality of PMOSFET regions PR and a plurality of NMOSFET regions NR. In an exemplary embodiment of the inventive concept, each of the PMOSFET regions PR and each of the NMOSFET regions NR may be arranged along a first direction D1.

According to an exemplary embodiment of the inventive concept, one PMOSFET region PR and one NMOSFET region NR may be included in a cell region. In an exemplary embodiment of the inventive concept, the cell region may be a memory cell region on which a plurality of memory cells for storing data are formed. For example, memory cell transistors constituting static random-access memory (SRAM) cells may be disposed on the cell region of the substrate 100. The cell region may be a portion of an SRAM cell, for example. Alternatively, the cell region may be a logic cell region on which logic transistors included in a logic circuit of a semiconductor device are disposed. For example, the logic transistors, constituting a processor core or an input/output (I/O) terminal, may be disposed on the cell region of the substrate 100. The cell region may be a portion of the processor core or the I/O terminal, for example.

A first active pattern AP1 may be disposed on the PMOSFET region PR. The first active pattern AP1 may extend in a second direction D2 intersecting the first direction D1. A second active pattern AP2, extending in the second direction D2, may be disposed on the NMOSFET region NR. In FIG. 1, it is shown that one first active pattern AP1 is disposed in one PMOSFET region PR and that one second active pattern AP2 is disposed in one NMOSFET region NR. However, the inventive concept is not limited thereto. For example, in an exemplary embodiment of the inventive concept, two or more first active patterns AP1 may be disposed in one PMOSFET region PR, and two or more second active patterns AP2 may be disposed in one NMOSFET region NR.

The first active pattern AP1 may include a first lower pattern LP1 and first channel patterns CH1 disposed on the first lower pattern LP1. The second active pattern AP2 may include a second lower pattern LP2 and second channel patterns CH2 disposed on the second lower pattern LP2. The first and second lower patterns LP1 and LP2 may extend (e.g., protrude) in a third direction D3 perpendicular to a top surface of the substrate 100. For example, the first and second lower patterns LP1 and LP2 may vertically protrude from the substrate 100. In addition, each of the first and second lower patterns LP1 and LP2 may have a line or bar shape extending in the second direction D2 when viewed in a plan view. In this disclosure, vertical protrusion may refer to protrusion of an element in the third direction D3, perpendicular to a top surface of the substrate 100.

According to an exemplary embodiment of the inventive concept, the first and second lower patterns LP1 and LP2 may be portions of the substrate 100. For example, the first and second lower patterns LP1 and LP2 may include the same semiconductor material as the substrate 100. The first and second lower patterns LP1 and LP2 may include a first semiconductor material. For example, the first semiconductor material may be silicon (Si). The first lower pattern LP1 may have N-type conductivity, and the second lower pattern LP2 may have P-type conductivity.

Device isolation patterns ST may be disposed at both sides of each of the first and second lower patterns LP1 and LP2. In an exemplary embodiment of the inventive concept, at least one device isolation pattern ST may fill a space between the first and second lower patterns LP1 and LP2. For example, the device isolation patterns ST may include at least one of silicon oxide or silicon oxynitride.

Oxide patterns 115 may be disposed between the first lower pattern LP1 and the device isolation pattern ST and between the second lower pattern LP2 and the device isolation pattern ST, respectively. Each of the oxide patterns 115 may include a vertical portion that directly covers a sidewall, extending in the second direction D2, of the first or second lower pattern LP1 or LP2. In addition, each of the oxide patterns 115 may further include a horizontal portion that directly covers a portion of the top surface of the substrate 100. The vertical portion may have a first thickness T1, and the horizontal portion may also have the first thickness T1. For example, the oxide patterns 115 may be conformally formed. The oxide patterns 115 may include an oxide of the first semiconductor material. For example, the oxide patterns 115 may include silicon oxide.

A top surface of the first lower pattern LP1 may be disposed at substantially the same elevation or level as a top surface of the second lower pattern LP2. For example, the top surfaces of the first and second lower patterns LP1 and LP2 may be coplanar. For example, the top surfaces of the first and second lower patterns LP1 and LP2 may be coplanar. Top surfaces of the oxide patterns 115 may be substantially coplanar with top surfaces of the device isolation patterns ST. In an exemplary embodiment of the inventive concept, the top surfaces of the first and second lower patterns LP1 and LP2 may be disposed at substantially the same elevation or level as the top surfaces of the device isolation patterns ST and the top surfaces of the oxide patterns 115. In this case, the top surfaces of the first and second lower patterns LP1 and LP2 may be coplanar with the top surfaces of the device isolation patterns ST and the top surfaces of the oxide patterns 115. In an exemplary embodiment of the inventive concept, even though not shown in the drawings, the top surfaces of the first and second lower patterns LP1 and LP2 may be disposed at a higher elevation or level with respect to the substrate 100 (e.g., with respect to a surface of the substrate 100 disposed opposite to the oxide patterns 115) than the top surfaces of the device isolation patterns ST and the top surfaces of the oxide patterns 115. In an exemplary embodiment of the inventive concept, even though not shown in the drawings, the top surfaces of the first and second lower patterns LP1 and LP2 may be disposed at a lower elevation or level (e.g., with respect to a surface of the substrate 100 disposed opposite to the oxide patterns 115) than the top surfaces of the device isolation patterns ST and the top surfaces of the oxide patterns 115.

The first channel patterns CH1 may vertically protrude from the first lower pattern LP1 between the device isolation patterns ST and between the oxide patterns 115. For example, the first channel patterns CH1 may have fin shapes. The second channel patterns CH2 may vertically protrude from the second lower pattern LP2 between the device isolation patterns ST and between the oxide patterns 115. For example, the second channel patterns CH2 may have fin shapes.

As illustrated in FIG. 2B, a pair of the first channel patterns CH1 may be spaced apart from each other in the first direction D1 on the first lower pattern LP1. For example, the pair of first channel patterns CH1 may be disposed on both side portions of the first lower pattern LP1, respectively, when viewed from a cross-sectional view taken in the first direction D1. In an exemplary embodiment of the inventive concept, a sidewall of one of the pair of first channel patterns CH1 may be aligned with a first sidewall of the first lower pattern LP1, and a sidewall of the other of the pair of first channel patterns CH1 may be aligned with a second sidewall of the first lower pattern LP1, the second sidewall of the first lower pattern LP1 facing the first sidewall of the first lower pattern LP1. However, the inventive concept is not limited thereto. Each of the first channel patterns CH1 may have a first width W1 in the first direction D1. In an exemplary embodiment of the inventive concept, the first width W1 may be smaller than the first thickness T1 of the oxide pattern 115. A pair of the second channel patterns CH2 may be spaced apart from each other in the first direction D1 on the second lower pattern LP2. For example, the pair of second channel patterns CH2 may be disposed on both side portions of the second lower pattern LP2, respectively, when viewed from a cross-sectional view taken in the first direction D1. In an exemplary embodiment of the inventive concept, a sidewall of one of the pair of second channel patterns CH2 may be aligned with a first sidewall of the second lower pattern LP2, and a sidewall of the other of the pair of second channel patterns CH2 may be aligned with a second sidewall of the second lower pattern LP2, the second sidewall of the second lower pattern LP2 facing the first sidewall of the second lower pattern LP2. However, the inventive concept is not limited thereto. Each of the second channel patterns CH2 may have the first width W1 in the first direction D1.

According to an exemplary embodiment of the inventive concept, the first and second channel patterns CH1 and CH2 may include a second semiconductor material. The second semiconductor material may be different from the first semiconductor material. For example, the first and second channel patterns CH1 and CH2 may include a different semiconductor material from the first and second lower patterns LP1 and LP2. In an exemplary embodiment of the inventive concept, the first and second channel patterns CH1 and CH2 may further include the first semiconductor material. For example, the first and second channel patterns CH1 and CH2 may include a compound of the first semiconductor material and the second semiconductor material. In the first and second channel patterns CH1 and CH2, a concentration (e.g., atomic percentage (at %)) of the second semiconductor material may be higher than a concentration (e.g., atomic percentage (at %)) of the first semiconductor material. However, the inventive concept is not limited thereto. The second semiconductor material may include, for example, germanium (Ge). Thus, the first and second channel patterns CH1 and CH2 may include germanium (Ge) or silicon-germanium (SiGe). The first channel patterns CH1 may have N-type conductivity, and the second channel patterns CH2 may have P-type conductivity.

In an exemplary embodiment of the inventive concept, the concentration of the second semiconductor material may be changed along the first direction D1 in each of the first and second channel patterns CH1 and CH2. For example, the germanium concentration of a portion of the first channel pattern CH1 adjacent to the oxide pattern 115 may be higher than the germanium concentration of another portion of the first channel pattern CH1 at a center of the first lower pattern LP1. The germanium concentration of a portion of the second channel pattern CH2 adjacent to the oxide pattern 115 may be higher than the germanium concentration of another portion of the second channel pattern CH2 at a center of the second lower pattern LP2. In an exemplary embodiment of the inventive concept, an average concentration of germanium of the first and second channel patterns CH1 and CH2 may range from about 20 at % to about 100 at %. In an exemplary embodiment of the inventive concept, the average concentration of germanium of the first and second channel patterns CH1 and CH2 may range from about 50 at % to about 999 at %.

Gate electrodes GE may extend in the first direction D1 on the substrate 100 to intersect the first and second active patterns AP1 and AP2. The gate electrodes GE may be spaced apart from each other in the second direction D2. Each of the gate electrodes GE may cover top surfaces and sidewalls of the first channel patterns CH1 and top surfaces and sidewalls of the second channel patterns CH2. For example, the gate electrodes GE may have a tri-gate structure. In addition, each of the gate electrodes GE may also cover the top surface of the first lower pattern LP1 disposed between the pair of first channel patterns CH1, and the top surface of the second lower pattern LP2 disposed between the pair of second channel patterns CH2. Furthermore, each of the gate electrodes GE may extend in the first direction D1 to intersect the device isolation patterns ST.

A gate insulating pattern G1 may be disposed under each of the gate electrodes GE, and gate spacers GS may be disposed on both sidewalls of each of the gate electrodes GE. In addition, a capping pattern GP may be disposed to cover a top surface of each of the gate electrodes GE. The gate insulating pattern G1 may extend between the gate electrode GE and the gate spacers GS. In addition, the gate insulating pattern G1 may horizontally (e.g., along the first direction D1 and/or the second direction D2) extend along a bottom surface of the gate electrode GE to directly cover the device isolation patterns ST and the oxide patterns 115.

The gate electrodes GE may include a doped semiconductor material, a conductive metal nitride (e.g., titanium nitride or tantalum nitride), or a metal (e.g., aluminum or tungsten). The gate insulating patterns G1 may include a silicon oxide, silicon oxynitride, and/or a high-k dielectric material having a dielectric constant higher than that of silicon oxide. For example, the high-k dielectric material may include hafnium oxide, hafnium silicate, zirconium oxide, and/or zirconium silicate. The capping patterns GP and the gate spacers GS may include a silicon oxide, silicon nitride, and/or silicon oxynitride.

First source/drain patterns SD1 may be disposed on the first lower pattern LP1 at both sides of the gate electrode GE, and second source/drain patterns SD2 may be disposed on the second lower pattern LP2 at both sides of the gate electrode GE. For example, each of the first channel patterns CH1 may be disposed under the gate electrode GE in a cross-sectional view and may be disposed between the first source/drain patterns SD1 adjacent to each other in a plan view. Each of the second channel patterns CH2 may be disposed under the gate electrode GE in a cross-sectional view and may be disposed between the second source/drain patterns SD2 adjacent to each other in a plan view. As illustrated in FIG. 2C, a pair of the first source/drain patterns SD1 may be disposed on both side portions of the first lower pattern LP1, respectively, when viewed from a cross-sectional view taken in the first direction D1. In addition, a pair of the second source/drain patterns SD2 may be disposed on both side portions of the second lower pattern LP2, respectively. In an exemplary embodiment of the inventive concept, unlike as shown in FIG. 2C, the pair of first source/drain patterns SD1 may be connected to each other to constitute a single first source/drain pattern SD1. In this case, a pair of the first channel patterns CH1 may be in contact with the single first source/drain pattern SD1. Likewise, the pair of second source/drain patterns SD2 may be connected to each other to constitute a single second source/drain pattern SD2.

The first source/drain patterns SD1 may be epitaxial patterns epitaxially grown on the first lower pattern LP1. Each of the first channel patterns CH1 may be disposed between a pair of the first source/drain patterns SD1 adjacent to each other in the second direction D2. Top surfaces of the first source/drain patterns SD1 may be disposed at a higher elevation or level than top surfaces of the first channel patterns CH1, with respect to a surface of the substrate 100 disposed opposite to the oxide patterns 115. The second source/drain patterns SD2 may be epitaxial patterns epitaxially grown on the second lower pattern LP2. Each of the second channel patterns CH2 may be disposed between a pair of the second source/drain patterns SD2 adjacent to each other in the second direction D2. Top surfaces of the second source/drain patterns SD2 may be disposed at a higher elevation or level than top surfaces of the second channel patterns CH2, with respect to a surface of the substrate 100 disposed opposite to the oxide patterns 115.

The first source/drain patterns SD1 may be the epitaxial patterns and may include a material providing a compressive strain to the first channel patterns CH1 disposed therebetween. The second source/drain patterns SD2 may be the epitaxial patterns and may include a material providing a tensile strain to the second channel patterns CH2 disposed therebetween. Since the first and second source/drain patterns SD1 and SD2 provide the compressive strain and the tensile strain to the first and second channel patterns CH1 and CH2, respectively, the mobility of carriers generated in the first and second channel patterns CH1 and CH2 may be increased when the field effect transistors are operated. For example, when the first and second channel patterns CH1 and CH2 include germanium (Ge) or silicon-germanium (SiGe), each of the first and second source/drain patterns SD1, and SD2 may include silicon (Si), germanium (Ge), and/or silicon-germanium (SiGe). In this case, a silicon concentration and/or a germanium concentration in the first source/drain patterns SD1 may be different from a silicon concentration and/or a germanium concentration in the second source/drain patterns SD2. The first source/drain patterns SD1 disposed on the PMOSFET region PR may have a P-type conductivity, and the second source/drain patterns SD2 disposed on the NMOSFET region NR may have an N-type conductivity.

A first interlayer insulating layer 140 may be disposed on the substrate 100. The first interlayer insulating layer 140 may cover sidewalls (e.g., outer sidewalls) of the gate spacers GS and the first and second source/drain patterns SD1 and SD2. A top surface of the first interlayer insulating layer 140 may be substantially coplanar with top surfaces of the capping patterns GP. A second interlayer insulating layer 150 may be disposed on the first interlayer insulating layer 140. For example, each of the first and second interlayer insulating layers 140 and 150 may include at least one of a silicon oxide layer and/or a silicon oxynitride layer.

Source/drain contacts CA may be disposed at both sides of at least one of the gate electrodes GE. The source/drain contacts CA may penetrate the second interlayer insulating layer 150 and the first interlayer insulating layer 140 to be electrically connected to the first and second source/drain patterns SD1 and SD2, respectively. A first source/drain contact CA may intersect at least one of the first source/drain patterns SD1 when viewed in a plan view. A second source/ drain contact CA may intersect at least one of the second source/drain patterns SD2 when viewed in a plan view.

Each of the source/drain contacts CA may include a first conductive pattern 160 and a second conductive pattern 165 disposed on the first conductive pattern 160. The first conductive pattern 160 may be a barrier conductive pattern. For example, the first conductive pattern 160 may include a titanium nitride, tungsten nitride, and/or tantalum nitride. The second conductive pattern 165 may be a metal pattern. For example, the second conductive pattern 165 may include tungsten, titanium, and/or tantalum. Even though not shown in the drawings, a metal silicide layer may be disposed between each of the source/drain contacts CA and each of the first and second source/drain patterns SD1 and SD2. For example, the metal silicide layer may include titanium-silicide, tantalum-silicide, and/or tungsten-silicide.

Even though not shown in the drawings, interconnection lines may be disposed on the second interlayer insulating layer 150 to be connected to the source/drain contacts CA, respectively. The interconnection lines may include a conductive material.

In the semiconductor device, according to an exemplary embodiment of the inventive concept, the first channel patterns CH1 and/or the second channel patterns CH2 containing a high concentration of the second semiconductor material may be disposed on the substrate 100, the substrate 100 including the first semiconductor material. The second semiconductor material may include materials that increase electrical characteristics of field effect transistors.

Figure 8A:
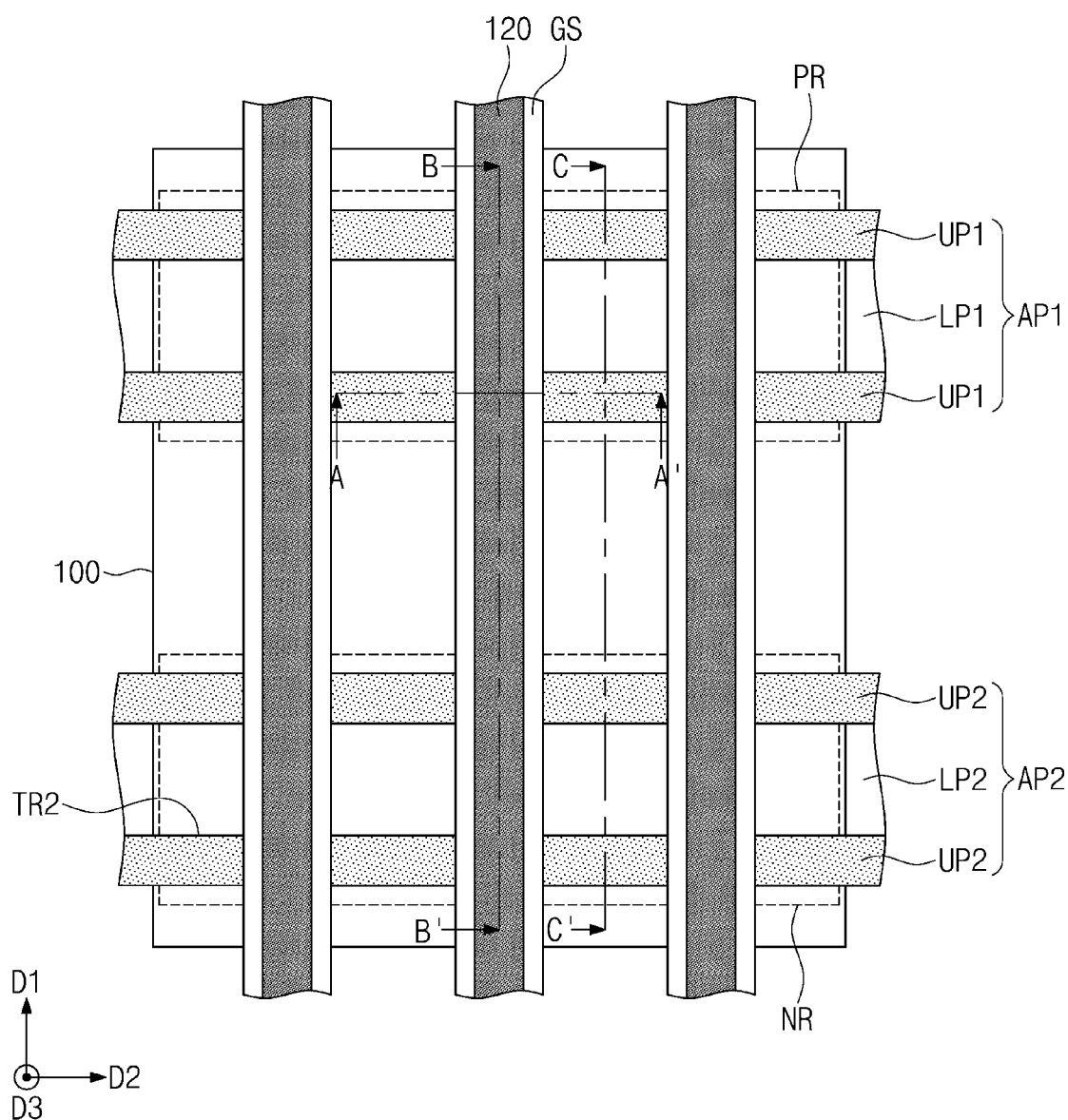
Figure 8B:
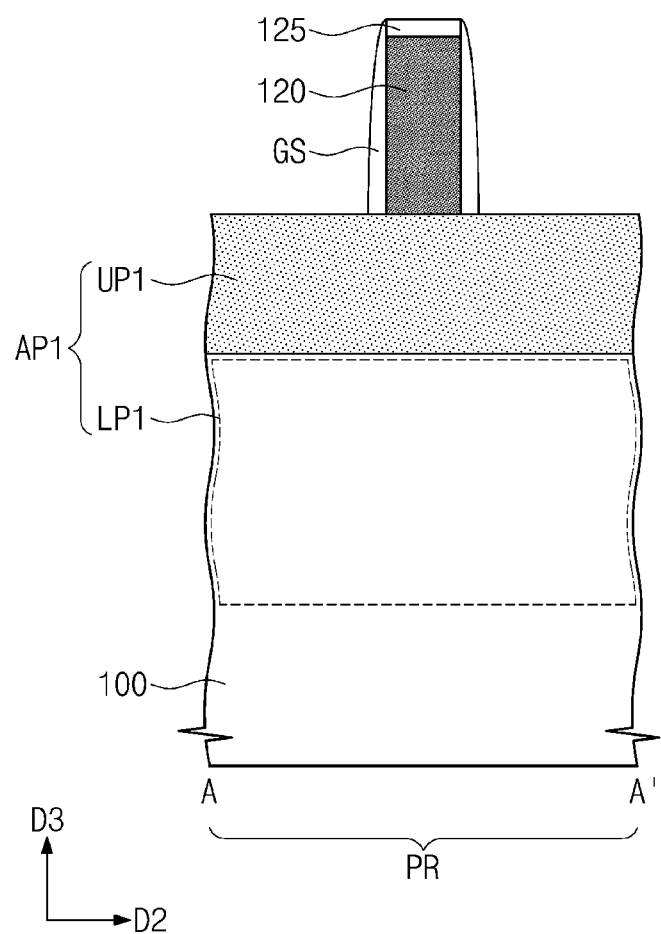
Figure 8C:
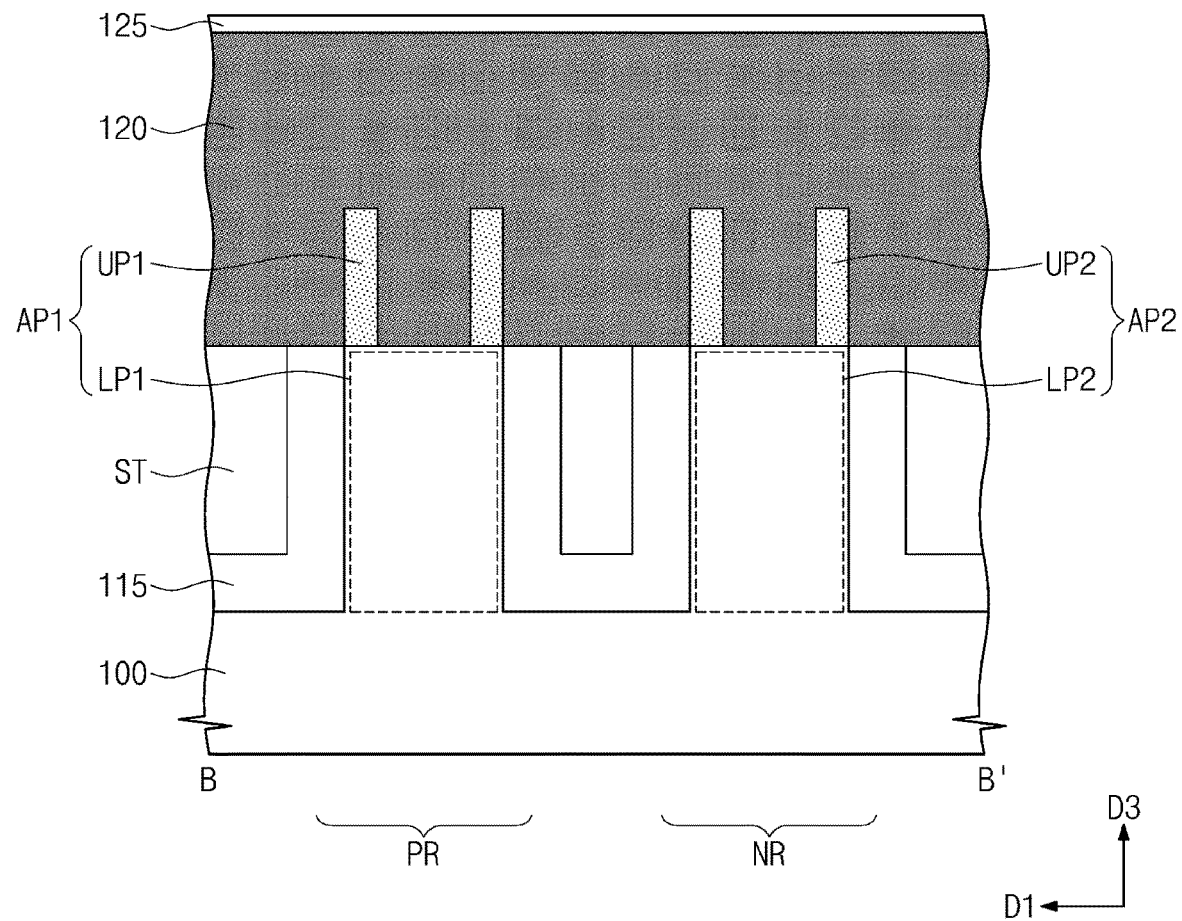
Figure 8D:
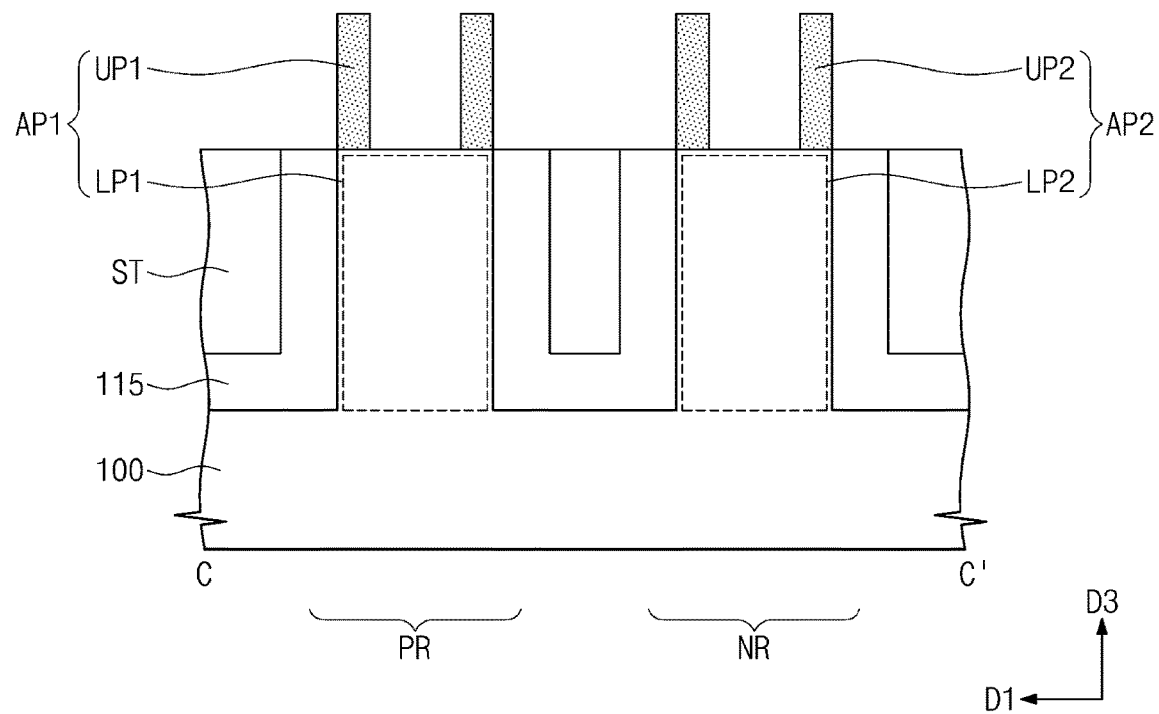
FIGS. 8D, 9D, and 10D are cross-sectional views taken along lines C-C' of FIGS. 8A, 9A, and 10A, respectively.
Figure 9A:
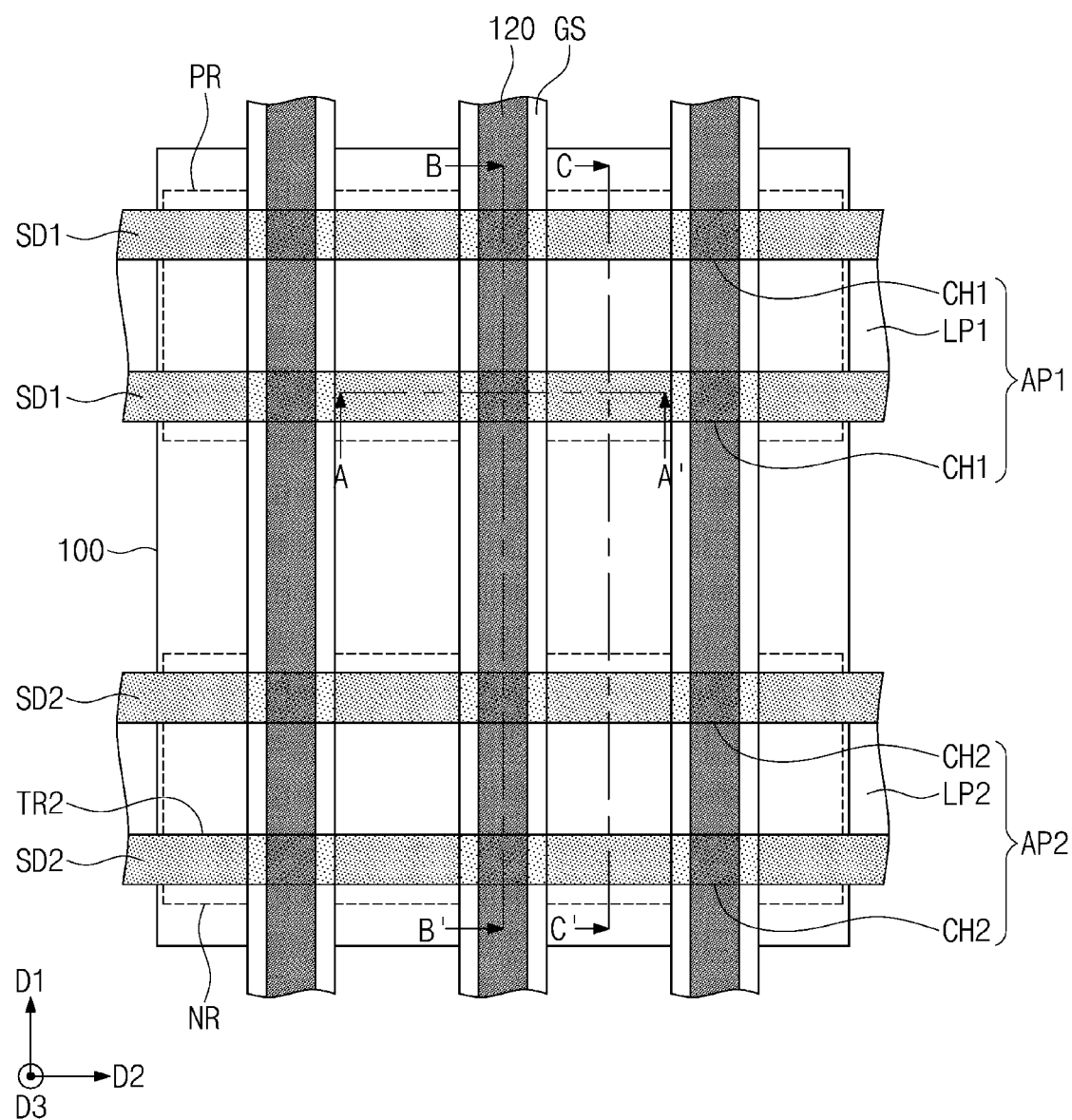
Figure 9B:
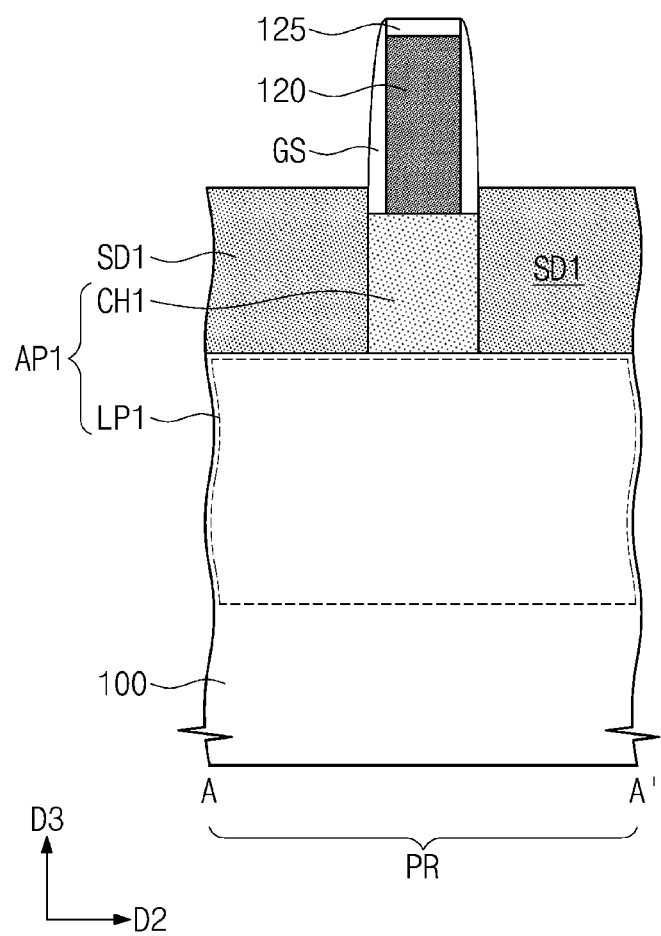
Figure 9C:
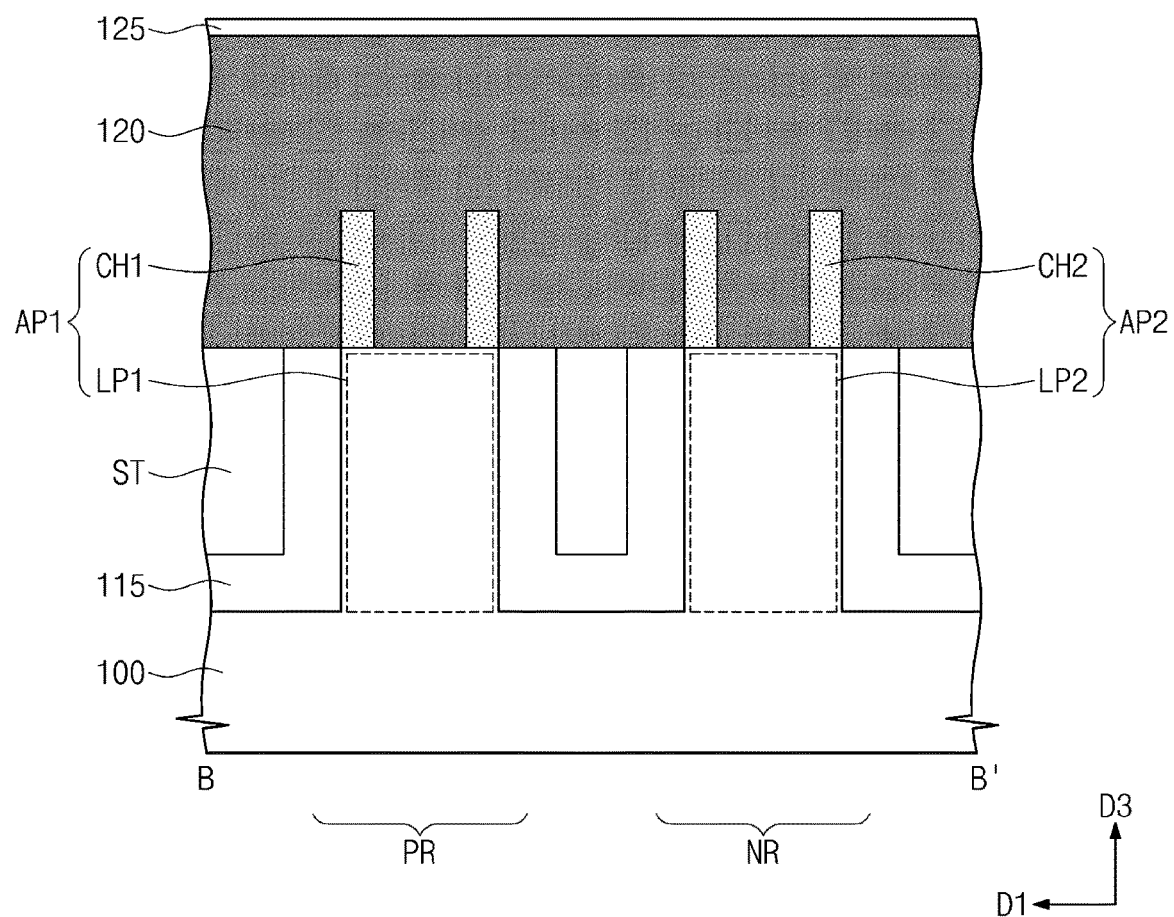
Figure 9D:
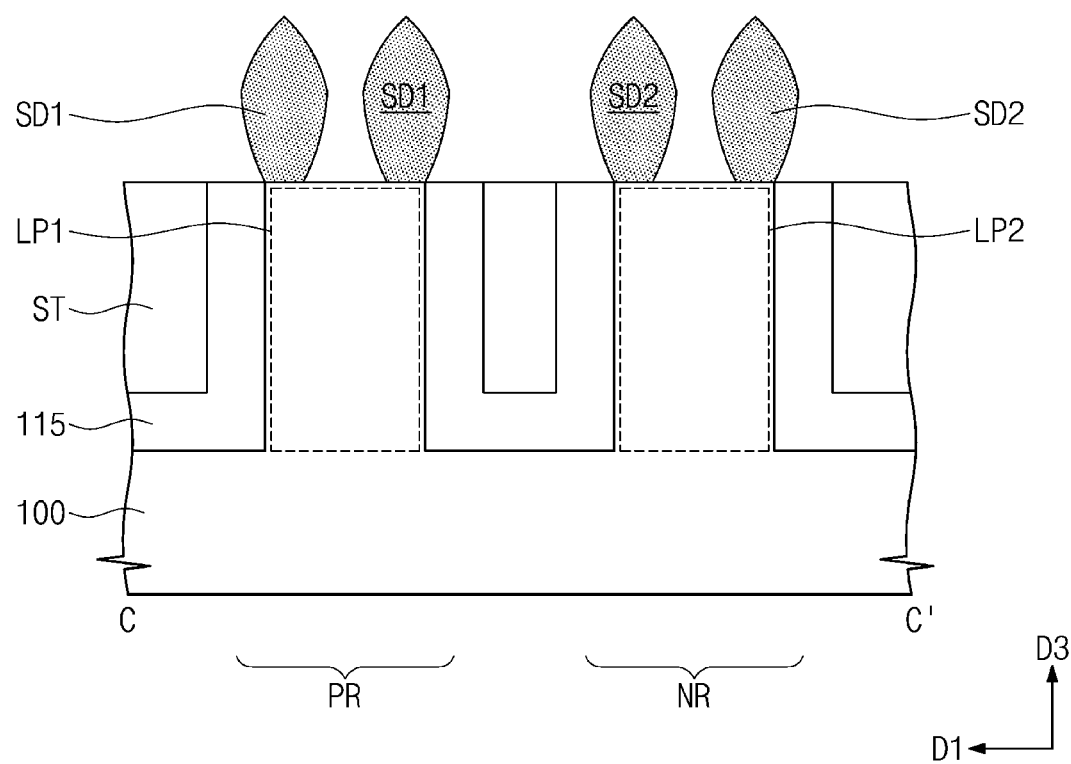
Figure 10A:
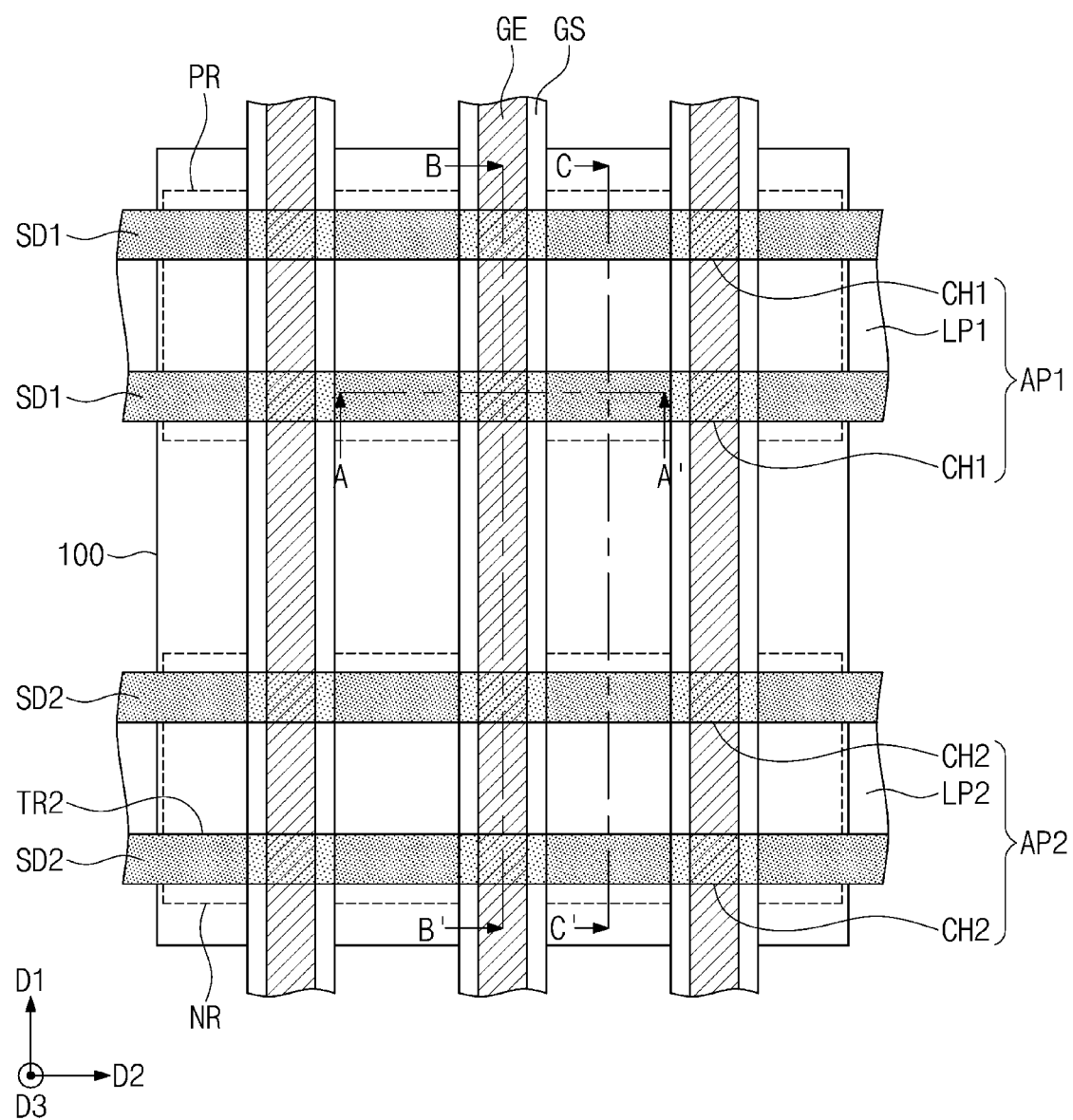
Figure 10B:
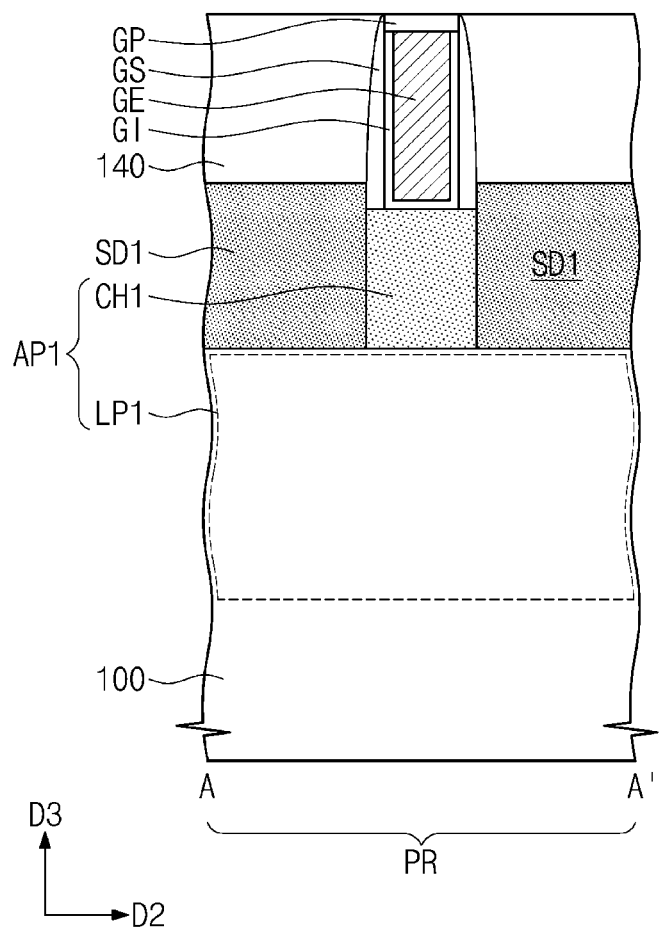
Figure 10C:
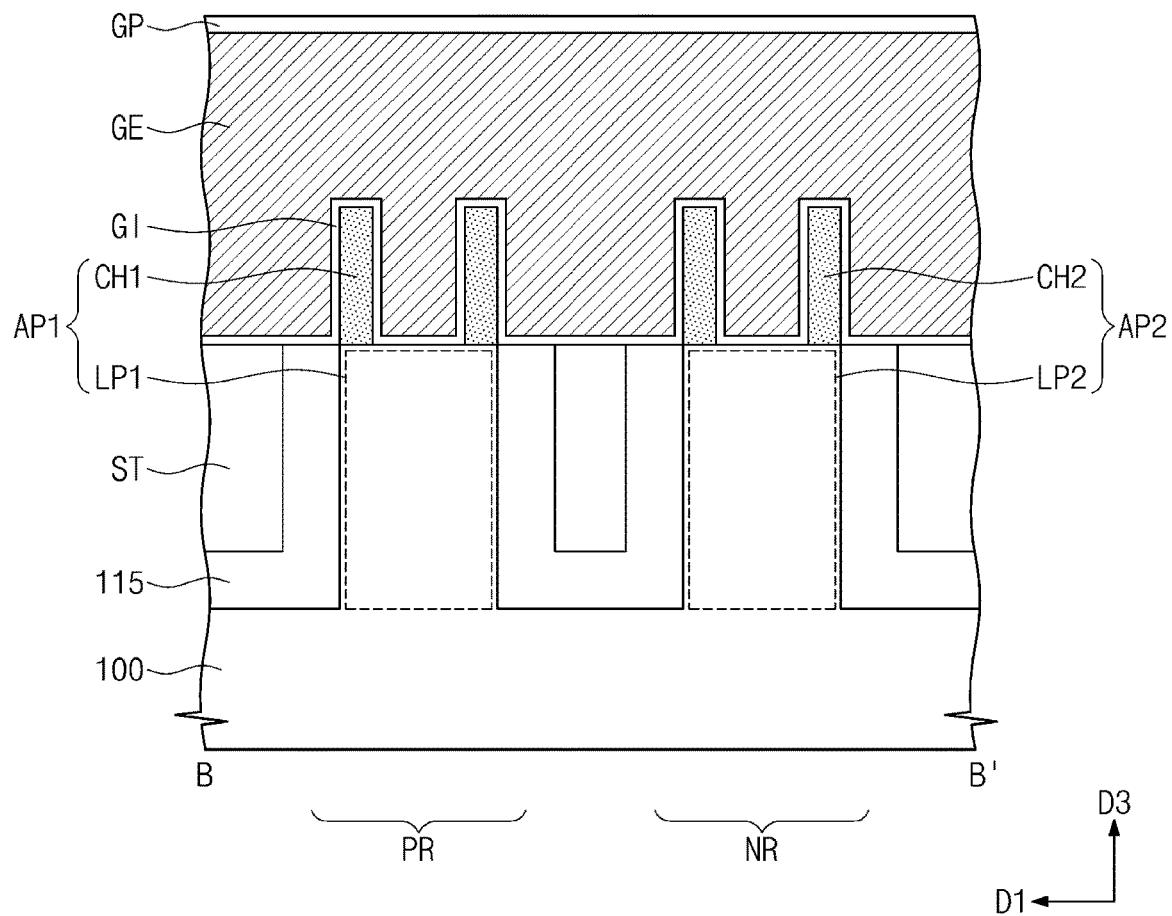
Figure 10D:
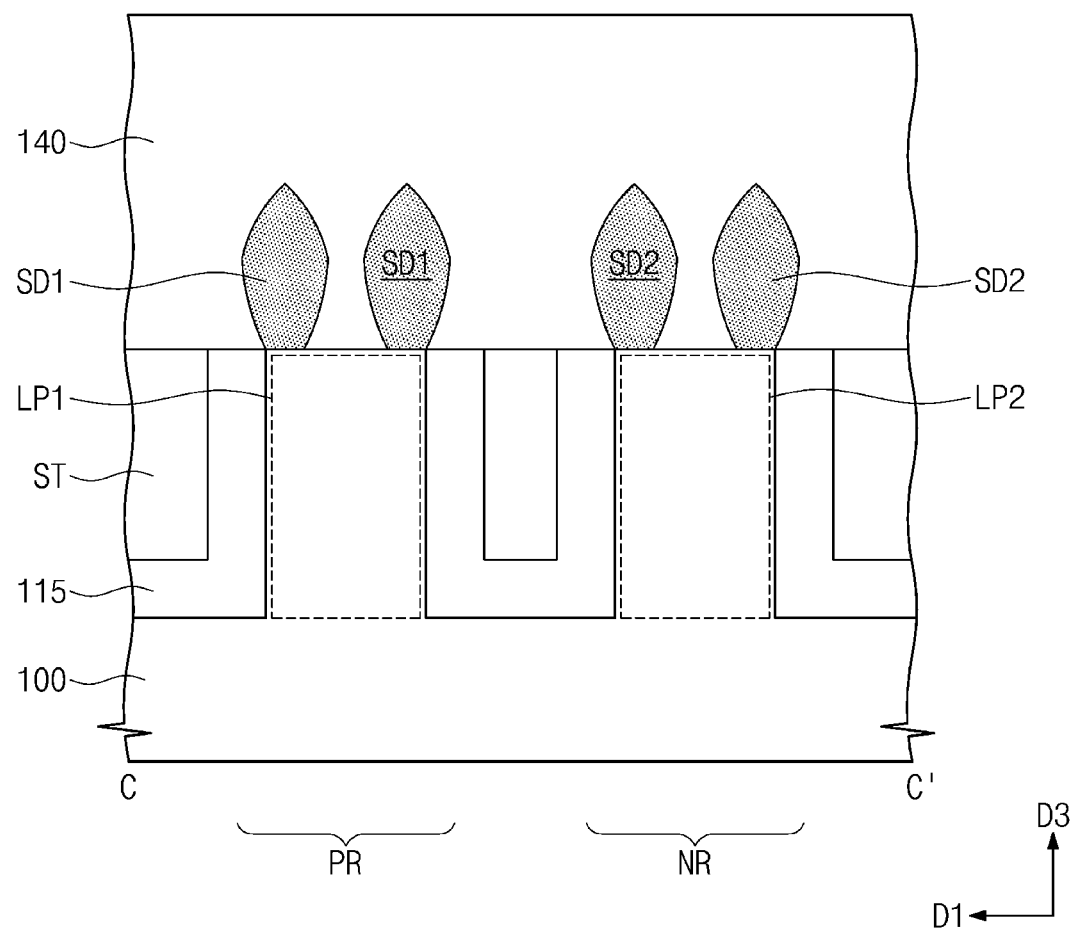

FIGS. 3A, 4A, 5A, 6A, 7A, 8A, 9A, and 10A are plan views illustrating a method for manufacturing a semiconductor device, according to an exemplary embodiment of the inventive concept. FIGS. 3B, 4B, 5B, 6B, 7B, 8B, 9B, and 10B are cross-sectional views taken along lines A-A' of FIGS. 3A, 4A, 5A, 6A, 7A, 8A, 9A, and 10A, respectively. FIGS. 3C, 4C, 5C, 6C, 7C, 8C, 9C, and 10C are cross-sectional views taken along lines B-B' of FIGS. 3A, 4A, 5A, 6A, 7A, 8A, 9A, and 10A, respectively. FIGS. 8D, 9D, and 10D are cross-sectional views taken along lines C-C' of FIGS. 8A, 9A, and 10A, respectively.

Figure 3A:
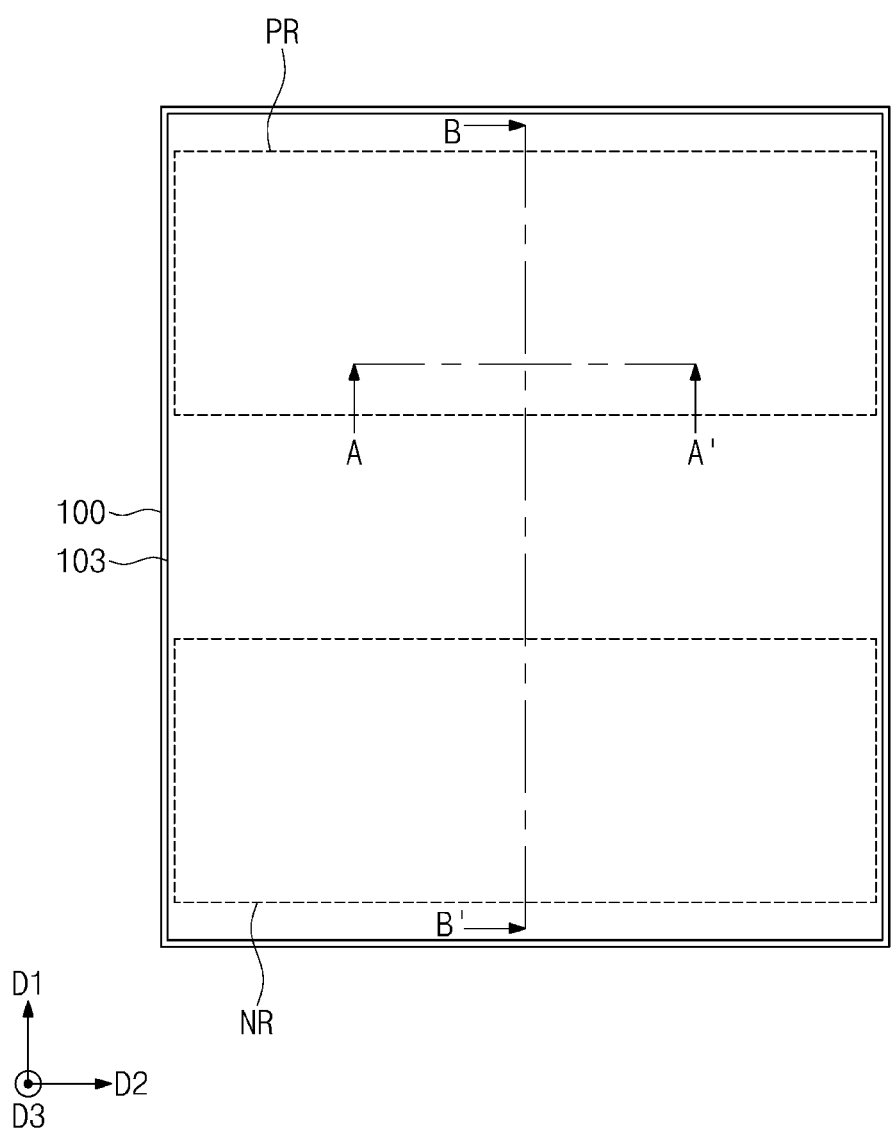
FIGS. 3A, 4A, 5A, 6A, 7A, 8A, 9A, and 10A are plan views illustrating a method for manufacturing a semiconductor device, according to an exemplary embodiment of the inventive concept.
Figure 3B:
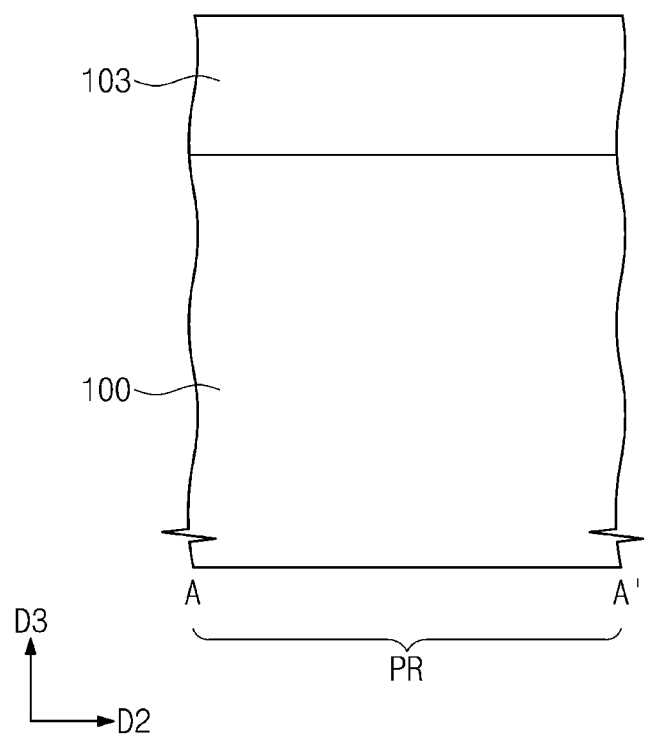
FIGS. 3B, 4B, 5B, 6B, 7B, 8B, 9B, and 10B are cross-sectional views taken along lines A-A' of FIGS. 3A, 4A, 5A, 6A, 7A, 8A, 9A, and 10A, respectively.
Figure 3C:
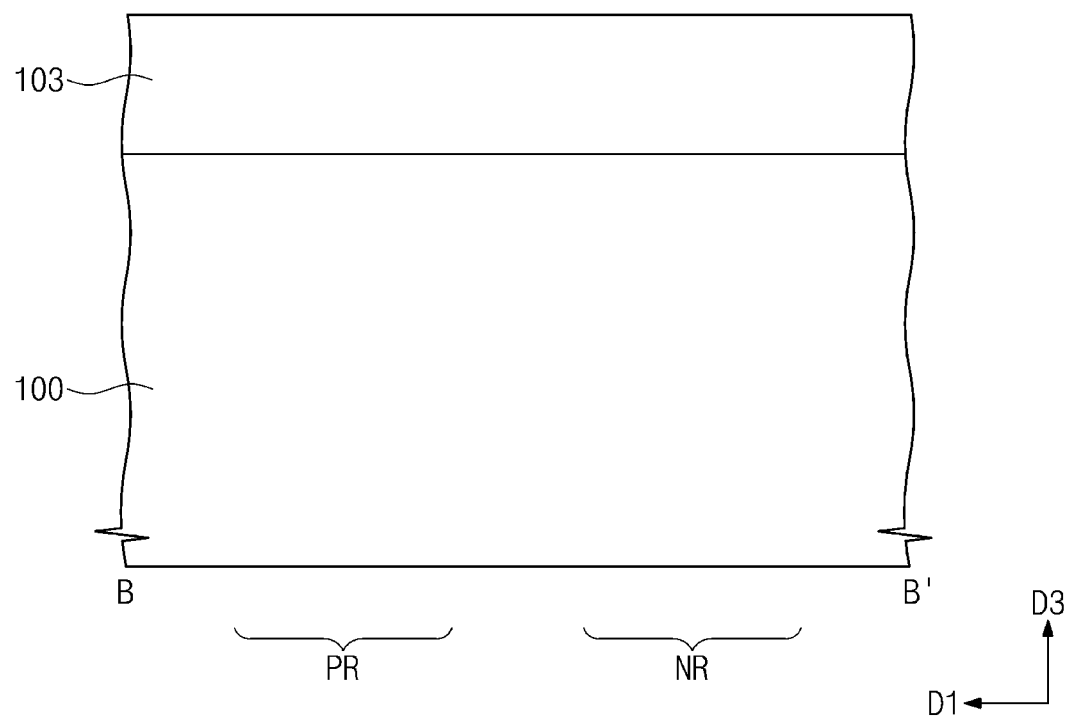
FIGS. 3C, 4C, 5C, 6C, 7C, 8C, 9C, and 10C are cross-sectional views taken along lines B-B' of FIGS. 3A, 4A, 5A, 6A, 7A, 8A, 9A, and 10A, respectively.

Referring to FIGS. 3A to 3C, a semiconductor layer 103 may be formed on an entire top surface of a substrate 100. The semiconductor layer 103 may be formed by a selective epitaxial growth (SEG) process using the top surface of the substrate 100 as a seed layer. For example, the substrate 100 may be a silicon substrate, and the semiconductor layer 103 may include a first semiconductor material (e.g., silicon) and a second semiconductor material (e.g., germanium). For example, the semiconductor layer 103 may include a compound of the first semiconductor material and the second semiconductor material. The semiconductor layer 103 may include, for example, silicon-germanium (SiGe). In this case, to reduce or minimize occurrence of defects caused by a difference in lattice constant between the substrate 100 and the semiconductor layer 103, an average concentration of germanium in the semiconductor layer 103 may be lower than 20 at %.

The substrate 100 may include a PMOSFET region PR and an NMOSFET region NR. Detailed descriptions to the PMOSFET region PR and the NMOSFET region NR may be the same as described with reference to FIGS. 1 and 2A to 2C.

Figure 4A:
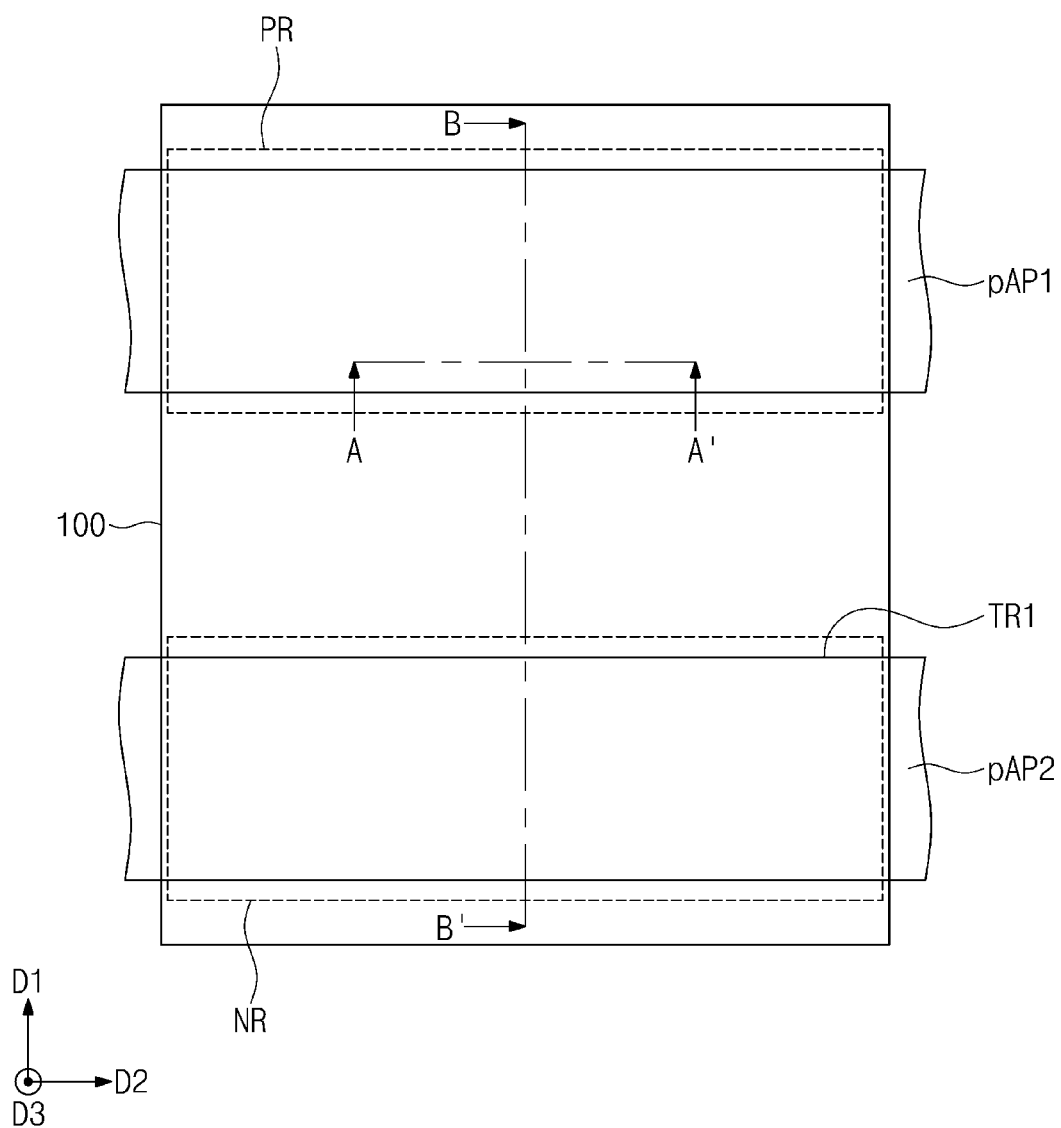
Figure 4B:
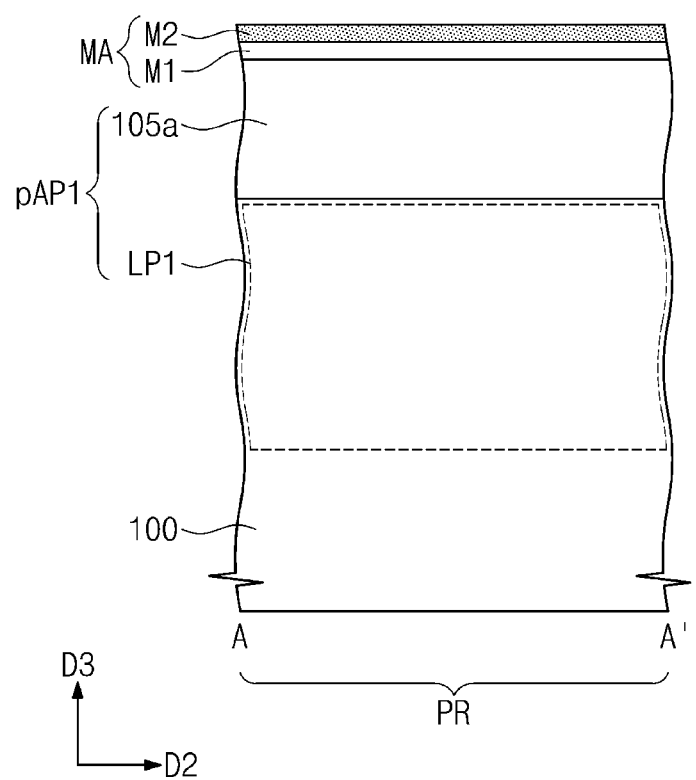
Figure 4C:
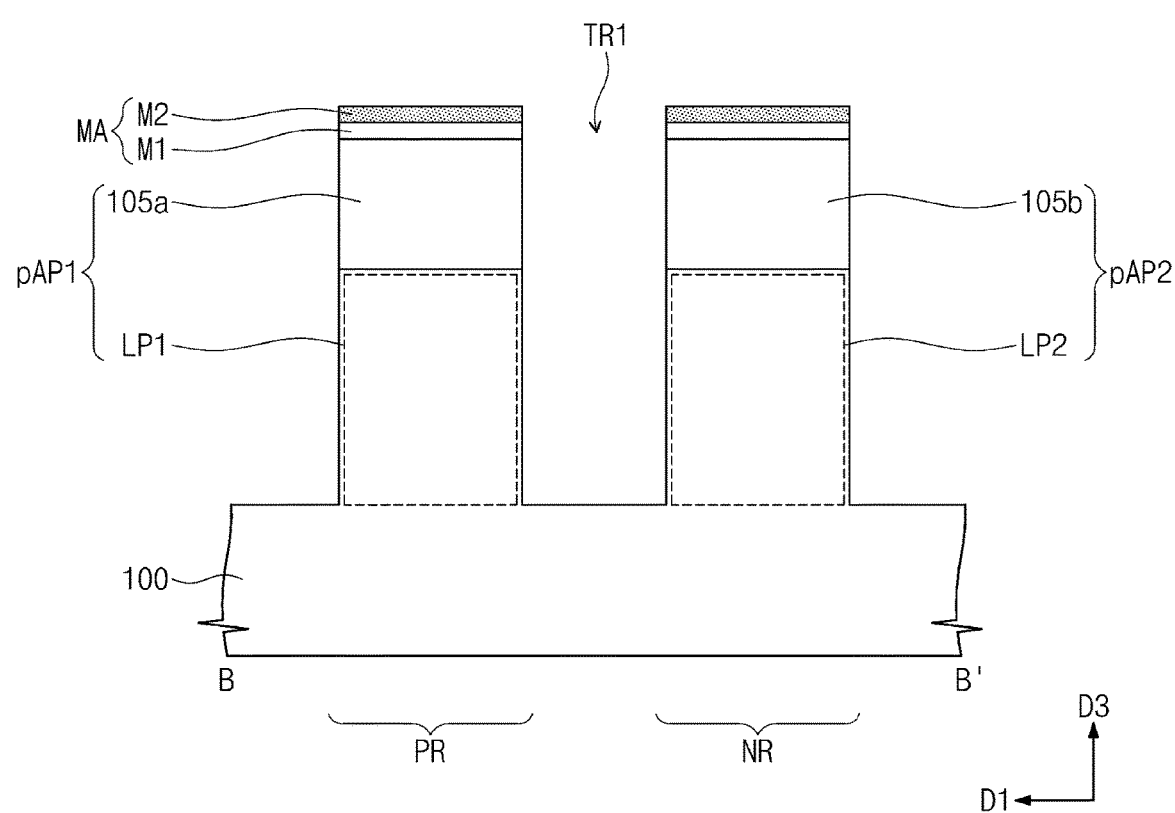

Referring to FIGS. 4A to 4C, the semiconductor layer 103 and an upper portion of the substrate 100 may be patterned to form a first preliminary active pattern pAP1 and a second preliminary active pattern pAP2 on the PMOSFET region PR and the NMOSFET region NR respectively. The first and second preliminary active patterns pAP1 and pAP2 may have line or bar shapes extending in the second direction D2. In an exemplary embodiment of the inventive concept, the formation of the first and second preliminary active patterns pAP1 and pAP2 may be performed using an anisotropic etching process of sequentially etching the semiconductor layer 103 and the substrate 100.

The formation of the first and second preliminary active patterns pAP1 and pAP2 may include forming mask patterns MA on the semiconductor layer 103, and anisotropically etching the semiconductor layer 103 and the upper portion of the substrate 100 by using the mask patterns MA as etch masks. Thus, first trenches TR1 may define the first and second preliminary active patterns pAP1 and pAP2. Each of the mask patterns MA may include a buffer pattern M1 and a hard mask pattern M2, which are sequentially stacked on each other. For example, the buffer pattern M1 may include a silicon oxide layer or a silicon oxynitride layer, and the hard mask pattern M2 may include a silicon nitride layer.

The semiconductor layer 103 may be patterned to form first and second semiconductor patterns 105a and 105b, and the upper portion of the substrate 100 may be patterned to form first and second lower patterns LP1 and LP2. The first and second semiconductor patterns 105a and 105b may be formed on the first and second lower patterns LP1 and LP2, respectively. In an exemplary embodiment of the inventive concept, the first and second lower patterns LP1 and LP2 may be portions of the substrate 100 and may vertically protrude from the substrate 100. The first semiconductor pattern 105a and the first lower pattern LP1 may constitute the first preliminary active pattern pAP1. The second semiconductor pattern 105b and the second lower pattern LP2 may constitute the second preliminary active pattern pAP2.

Figure 5A:
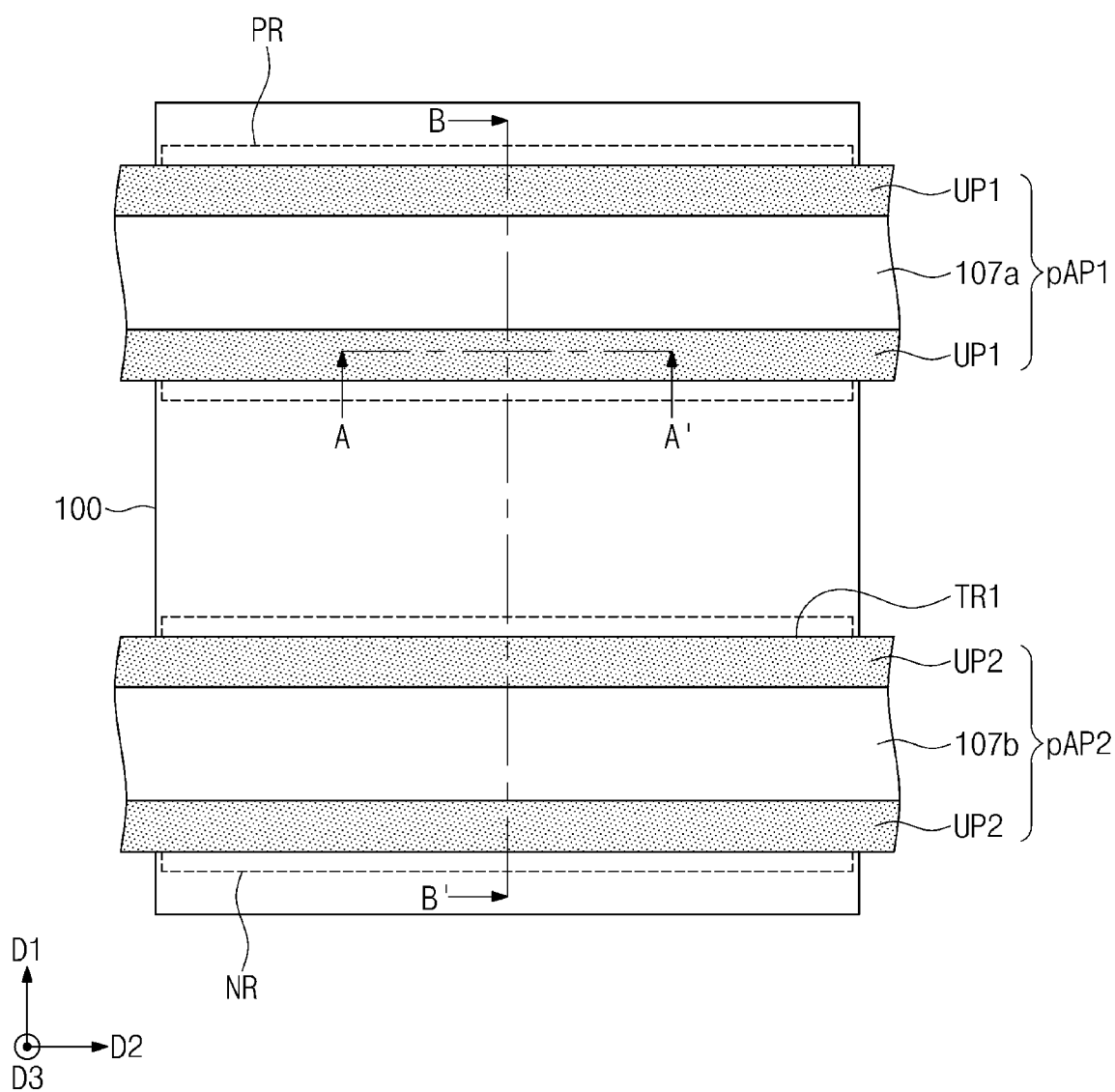
Figure 5B:
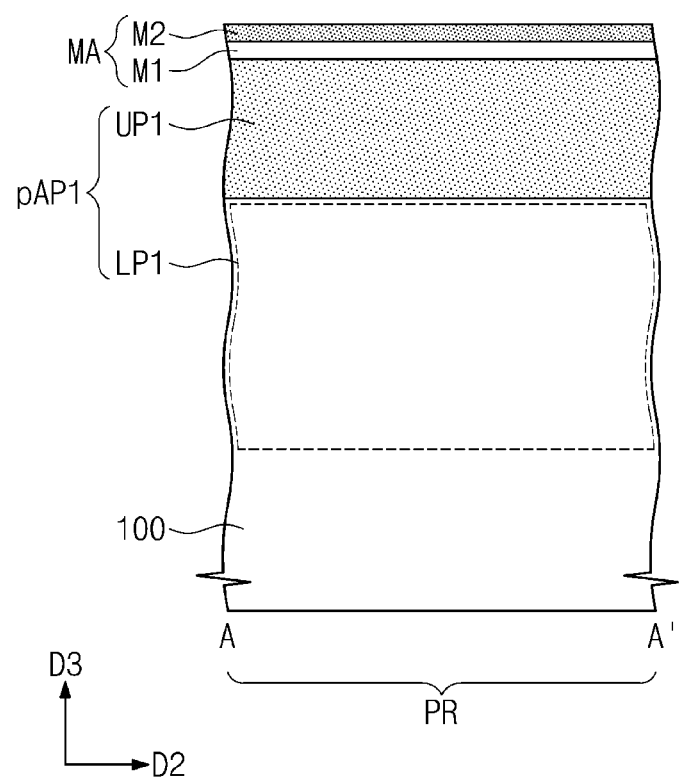
Figure 5C:
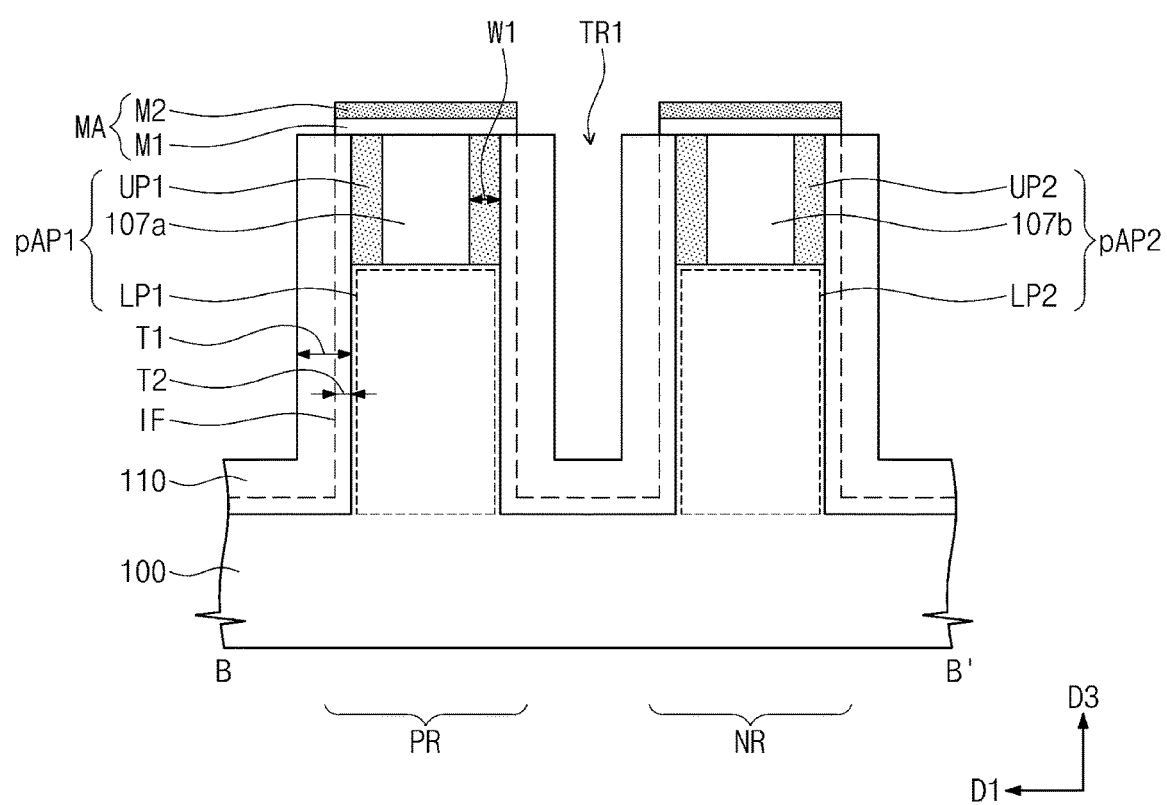

Referring to FIGS. 5A to 5C, an oxidation process may be performed on the substrate 100 to form oxide layers 110. For example, sidewalls of the first and second preliminary active patterns pAP1 and pAP2 and a top surface of the substrate 100, which are exposed by the mask patterns MA, may be oxidized during the oxidation process. Thus, the oxide layers 110 may cover the sidewalls of the first and second preliminary active patterns pAP1 and pAP2 and the top surface of the substrate 100. The oxide layers 110 may fill portions of the first trenches TR1, respectively. The mask patterns MA may protect top surfaces of the first and second preliminary active patterns pAP1 and pAP2 during the oxidation process, and thus, the top surfaces of the first and second preliminary active patterns pAP1 and pAP2 might not be oxidized. In an exemplary embodiment of the inventive concept, the oxidation process may be performed using an oxidation gas including oxygen, water vapor, or ozone.

The first semiconductor material (e.g., silicon) included in the substrate 100 and the first and second preliminary active patterns pAP1 and pAP2 may be selectively oxidized during the oxidation process, and thus, the oxide layers 110 may include an oxide of the first semiconductor material, e.g., silicon oxide. For example, since the substrate 100 and the first and second lower patterns LP1 and LP2 (e.g., corresponding to the portions of the substrate 100) include silicon, the oxide layers 110 may be grown while consuming silicon disposed in the substrate 100, As the oxide layers 110 are grown, a thickness of the substrate 100 and widths of the first and second lower patterns LP1 and LP2 may be reduced. For example, boundaries of the substrate 100 and each of the first and second lower patterns LP1 and LP2 may be reduced by a second distance T2 after the oxidation process, when compared with boundaries IF of the substrate 100 and each the first and second lower patterns LP1 and LP2 before the oxidation process. The oxide layers 110 may be conformally formed to have thicknesses corresponding to a first distance T1, and the first distance T1 may be greater than the second distance T2.

By the oxidation process, a pair of first upper patterns UP1 and a third semiconductor pattern 107a disposed between the pair of first upper patterns UP1 may be formed from the first semiconductor pattern 105a. By the oxidation process, a pair of second upper patterns UP2 and a fourth semiconductor pattern 107b disposed between the pair of second upper patterns UP2 may be formed from the second semiconductor pattern 105b.

In general, when an oxidation process using an oxidation gas is performed on a silicon-germanium layer, the silicon is the material that is mostly oxidized. The oxide layers 110 may be grown by consuming mainly the first semiconductor material (e.g., silicon) of the first and second semiconductor materials (e.g., silicon-germanium being the compound of the first and second semiconductor materials) included in the first and second semiconductor patterns 105a and 105b. The second semiconductor material (e.g., germanium), which is not oxidized during the oxidation process, may be moved into predetermined portions of the first and second semiconductor patterns 105a and 105b. Thus, layers or portions in which the second semiconductor material (e.g., germanium) is concentrated may be disposed under the oxide layers 110 and grown on the first and second semiconductor patterns 105a and 105b. The layers or portions in which the second semiconductor material is concentrated may be the first and second upper patterns UP1 and UP2.

The first and second upper patterns UP1 and UP2 may be portions of the first and second semiconductor patterns 105a and 105b in which the concentration of the second semiconductor material is about 20 at % or more, respectively. In an exemplary embodiment of the inventive concept, the first and second upper patterns UP1 and UP2 may be portions of the first and second semiconductor patterns 105a and 105b in which the concentration of the second semiconductor material is about 50 at % or more, respectively. In an exemplary embodiment of the inventive concept, the concentration of the second semiconductor material may be changed along the first direction D1 in each of the first and second upper patterns UP1 and UP2. For example, the germanium concentration of a portion of the first upper pattern UP1 adjacent to the oxide layer 110 may be higher than the germanium concentration of another portion of the first upper pattern UP1 adjacent to the third semiconductor pattern 107a. The germanium concentration of a portion of the second upper pattern UP2 adjacent to the oxide layer 110 may be higher than the germanium concentration of another portion of the second upper pattern UP2 adjacent to the fourth semiconductor pattern 107b.

The concentration of the second semiconductor material of the third and fourth semiconductor patterns 107a and 107b may be reduced when compared with the concentration of the second semiconductor material of the first and second semiconductor patterns 105a and 105b before the oxidation process. This may occur because the second semiconductor materials of central portions (e.g., 107a and 107b) of the first and second semiconductor patterns 105a and 105b may have moved into the first and second upper patterns UP1 and UP2.

Figure 6A:
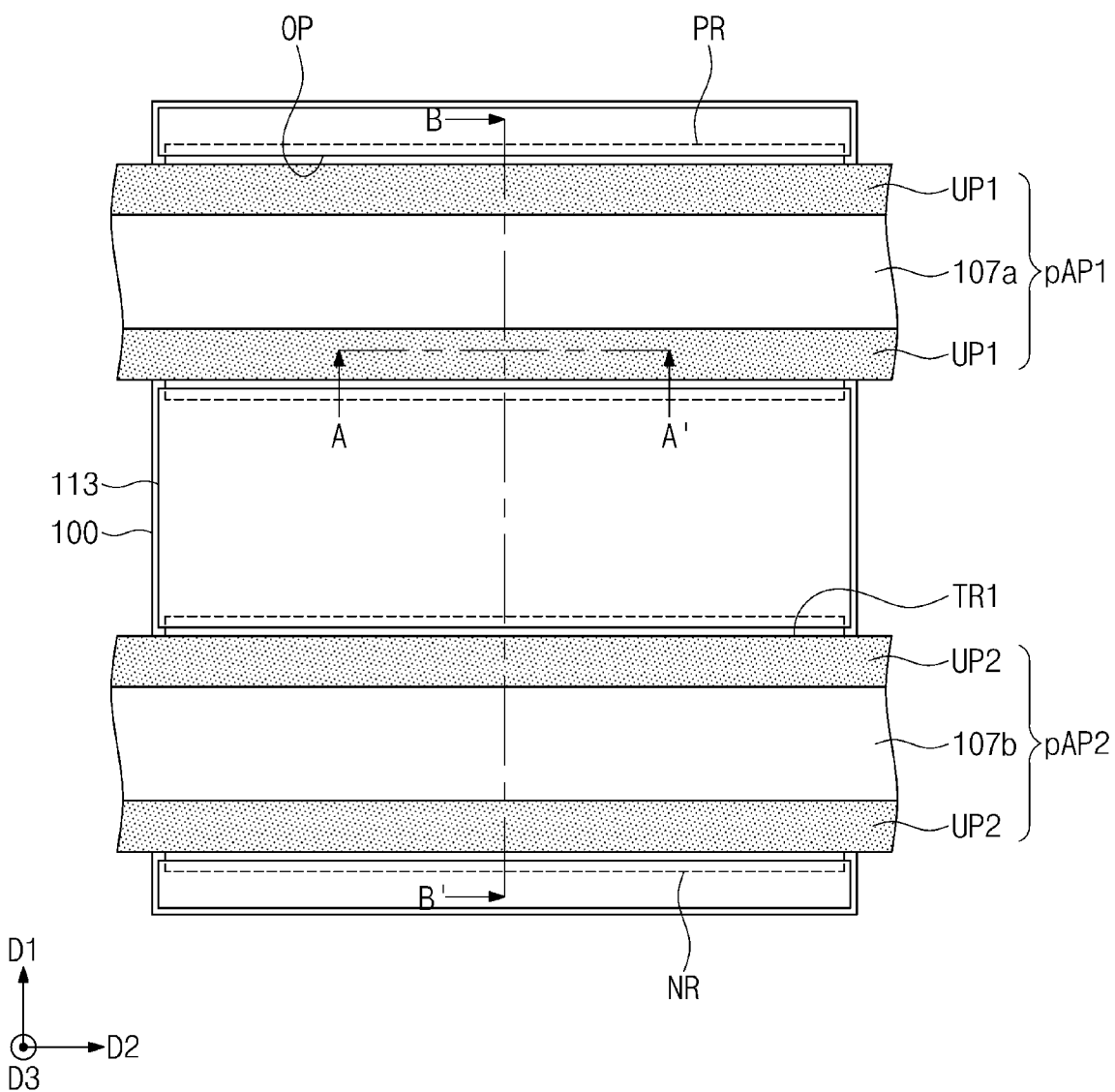
Figure 6B:
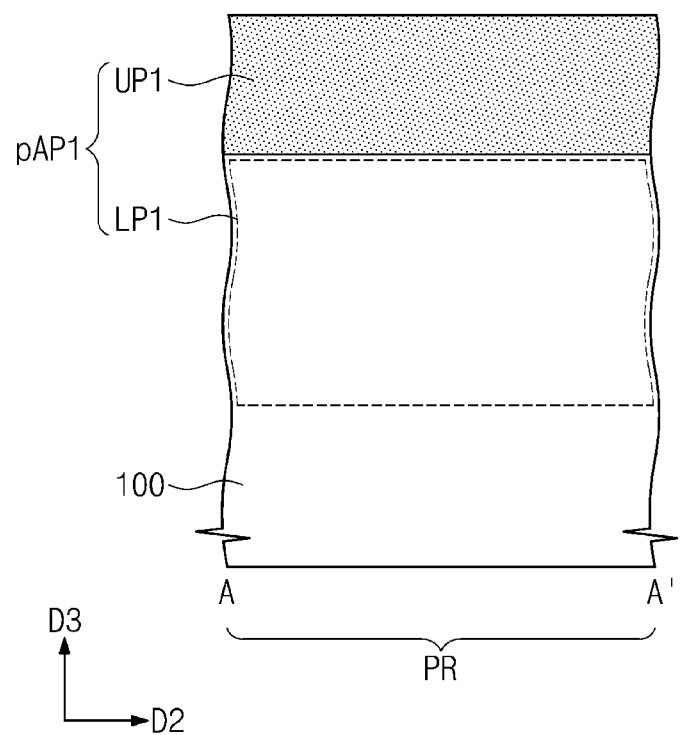
Figure 6C:
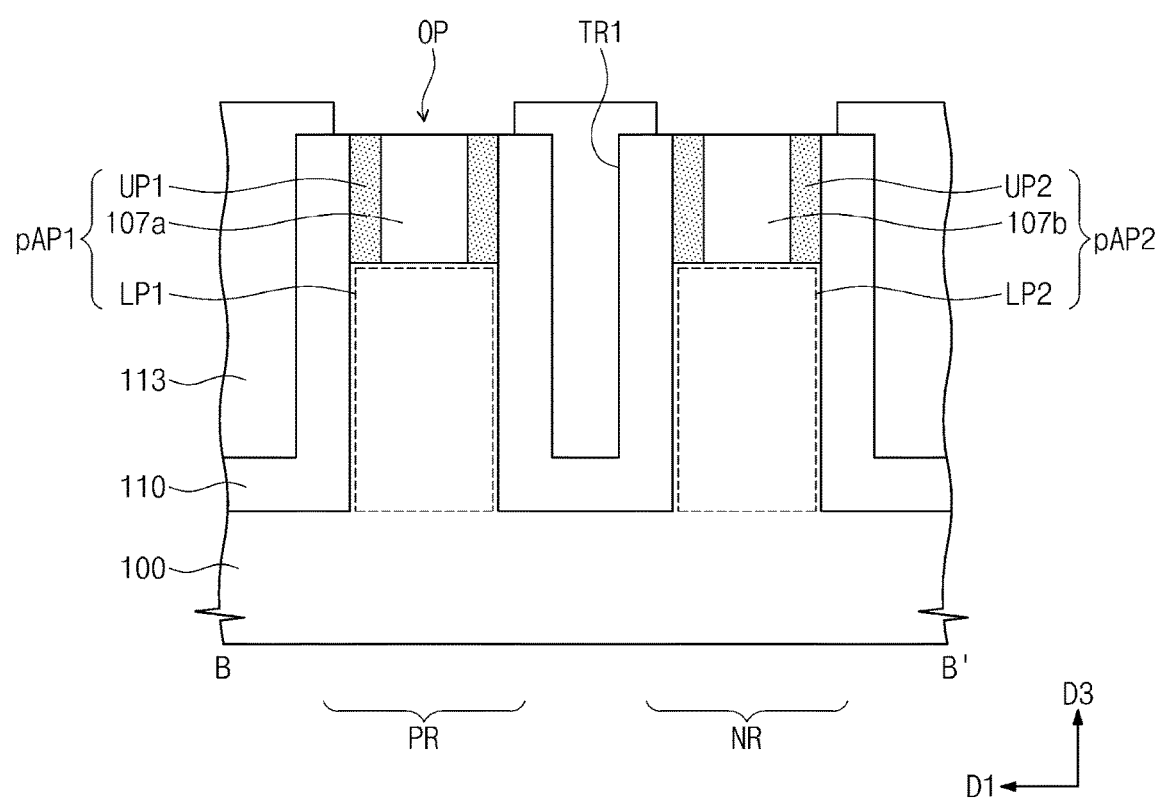

Referring to FIGS. 6A to 6C, a device isolation layer 113 may completely fill the first trenches TR1. The device isolation layer 113 may cover the mask patterns MA. The device isolation layer 113 may include a silicon oxide layer and/or a silicon oxynitride layer. Next, a planarization process may be performed on the device isolation layer 113 until top surfaces of the mask patterns MA are exposed. For example, the planarization process may include an etch-back process and/or a chemical mechanical polishing (CMP) process.

Subsequently, the mask patterns MA exposed by the planarization process may be selectively removed. Openings OP may be formed in the device isolation layer 113 when the mask patterns MA are removed. The openings OP may expose top surfaces of the first and second upper patterns UP1 and UP2 and top surfaces of the third and fourth semiconductor patterns 107a and 107b.

Figure 7A:
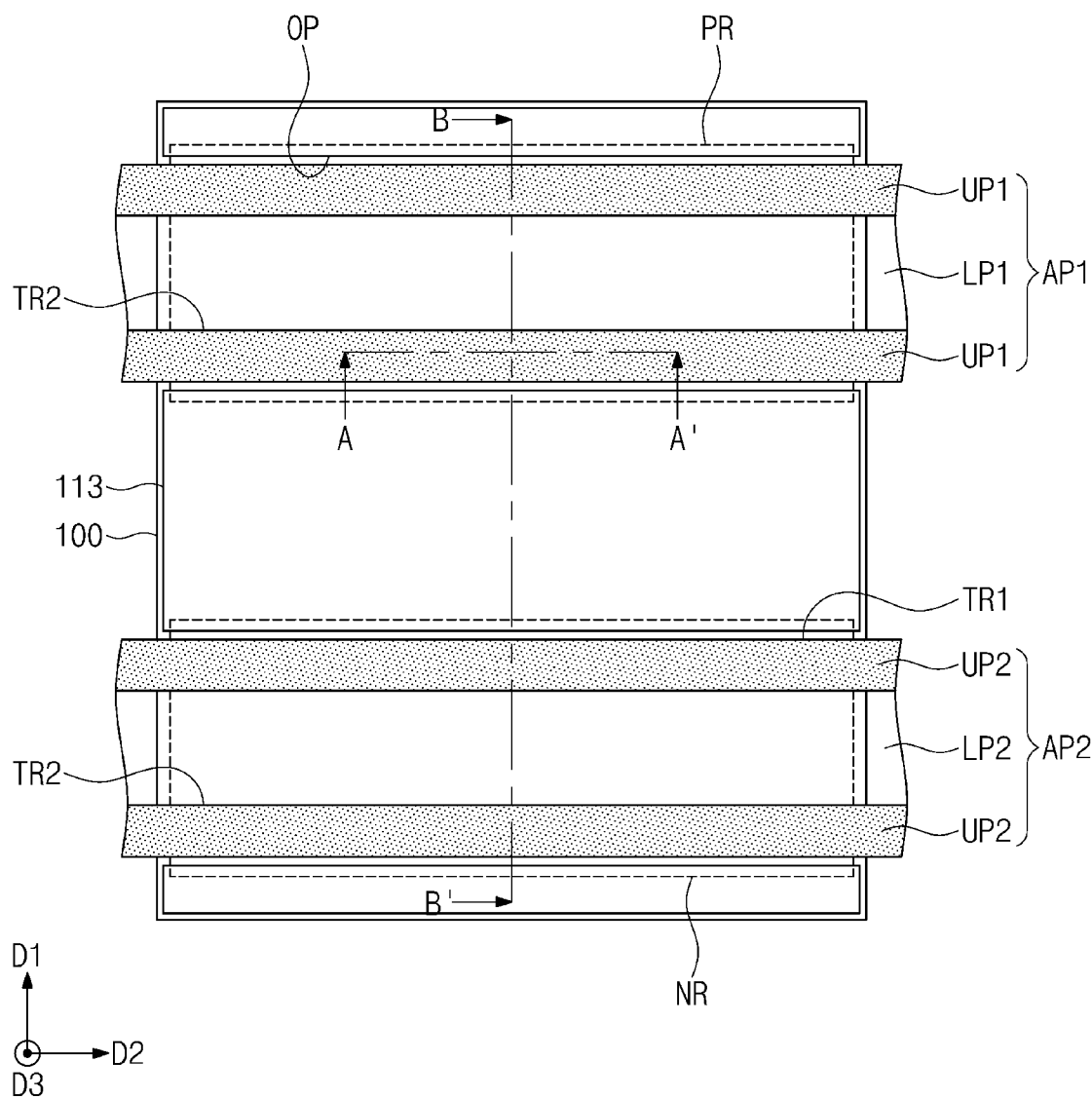
Figure 7B:
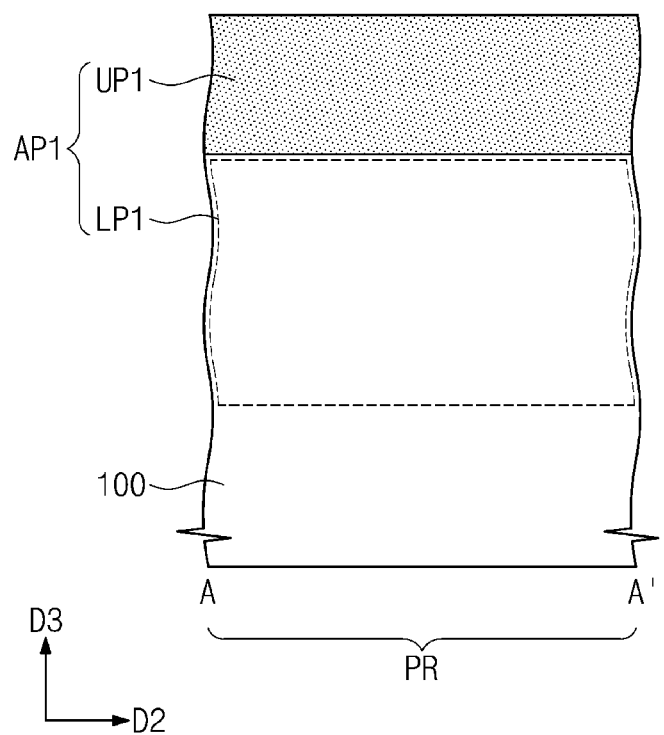
Figure 7C:
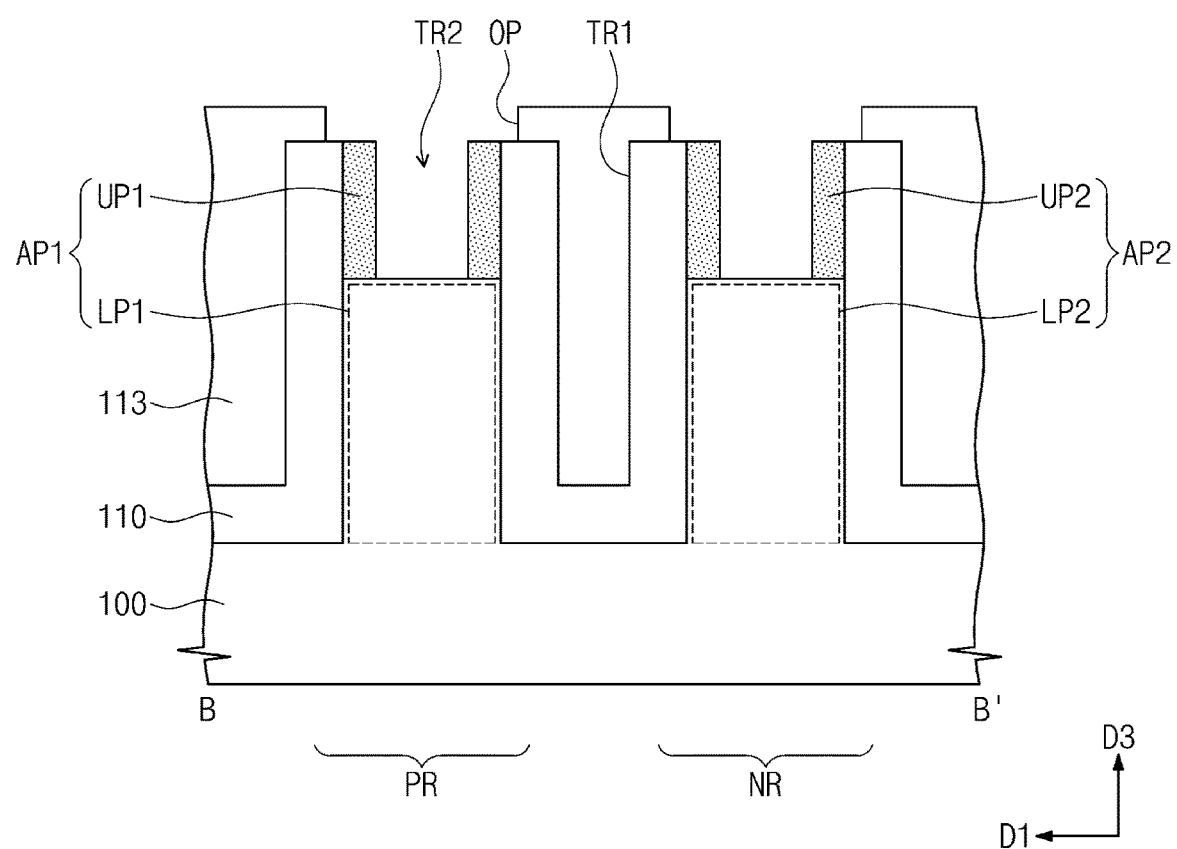

Referring to FIGS. 7A to 7C, the third and fourth semiconductor patterns 107a and 107b, exposed through the openings OP, may be selectively removed to form first and second active patterns AP1 and AP2. The first active pattern AP1 may include the first lower pattern LP1 and a pair of first upper patterns UP1 disposed on the first lower pattern LP1. The second active pattern AP2 may include the second lower pattern LP2 and a pair of second upper patterns UP2 disposed on the second lower pattern LP2. In addition, the third and fourth semiconductor patterns 107a and 107b may be selectively removed to form second trenches TR2 between the pair of first upper patterns UP1 and between the pair of second upper patterns UP2, respectively. The second trenches TR2 may expose top surfaces of the first and second lower patterns LP1 and LP2, respectively.

The process of etching the third and fourth semiconductor patterns 107a and 107b may include using an etchant that allows an etching rate of the third and fourth semiconductor patterns 107a and 107b to be different from an etching rate of the first and second upper patterns UP1 and UP2. For example, in the etching process, the etching rate of the third and fourth semiconductor patterns 107a and 107b may be higher than the etching rate of the first and second upper patterns UP1 and UP2. In the etching process, the etching rate of the third and fourth semiconductor patterns 107a and 107b may be equal to or higher than twice the etching rate of the first and second upper patterns UP1 and UP2. However, the etching rate of the third and fourth semiconductor patterns 107a and 107b of an etchant may be 10 times or more greater than the etching rate of the first and second upper patterns UP1 and UP2 when using of the same etchant.

A difference between the etching rates above may be due to a difference in the concentration of the second semiconductor material in the first and second upper patterns UP1 and UP2 and the concentration of the second semiconductor material in the third and fourth semiconductor patterns 107a and 107b. In an exemplary embodiment of the inventive concept, the etching process may be a wet etching process using an etching solution including, for example, ammonium hydroxide. In an exemplary embodiment of the inventive concept, the etching process may be a dry etching process using, for example, hydrogen bromide. The etching rate of the third and fourth semiconductor patterns 107a and 107b having a high silicon content may be higher than the etching rate of the first and second upper patterns UP1 and UP2 having a high germanium content.

Referring to FIGS. 8A to 8D, the oxide layers 110 and the device isolation layer 113 may be respectively recessed to form oxide patterns 115 and device isolation patterns ST. Thus, the first and second upper patterns UP1 and UP2 may be exposed between the oxide patterns 115 and between the device isolation patterns ST. The first and second upper patterns UP1 and UP2 may have fin shapes vertically protruding between the device isolation patterns ST and between the oxide patterns 115.

Then, sacrificial gate patterns 120 and gate mask patterns 125 may be formed on the first and second active patterns AP1 and AP2. The gate mask patterns 125 may be stacked on the sacrificial gate patterns 120, respectively. Each of the sacrificial gate patterns 120 may have a line or bar shape that intersects the first and second upper patterns UP1 and UP2 and extends in the first direction D1.

In an exemplary embodiment of the inventive concept, a sacrificial gate layer and a gate mask layer may be sequentially formed on an entire top surface of the substrate 100, and a patterning process may be performed on the gate mask layer and the sacrificial gate layer to form the sacrificial gate patterns 120 and the gate mask patterns 125. The sacrificial gate layer may include a poly-silicon layer. The gate mask layer may include a silicon nitride layer or a silicon oxynitride layer.

Gate spacers GS may be formed on both sidewalls of each of the sacrificial gate patterns 120. Forming the gate spacers GS may include conformally forming a gate spacer layer on the substrate 100 including the sacrificial gate patterns 120 thereon, and anisotropically etching the gate spacer layer. For example, the gate spacer layer may include a silicon oxide layer, a silicon nitride layer, or a silicon oxynitride layer.

Referring to FIGS. 9A to 9D, first source/drain patterns SD1 may be formed on the first active pattern AP1 at both sides of each of the sacrificial gate patterns 120. Second source/drain patterns SD2 may be formed on the second active pattern AP2 at both sides of each of the sacrificial gate patterns 120.

Forming the first source/drain patterns SD1 may include etching upper portions of the first upper patterns UP1 using the gate mask patterns 125 and the gate spacers GS as etching masks, and performing an SEG process using residual portions of the first upper patterns UP1 as a seed. Forming the second source/drain patterns SD2 may include etching upper portions of the second upper patterns UP2 using the gate mask patterns 125 and the gate spacers GS as etching masks, and performing an SEG process using residual portions of the second upper patterns UP2 as a seed. For example, the SEC process may include a chemical vapor deposition (CVD) process or a molecular beam epitaxy (MBE) process. The first upper pattern UP1, disposed between a pair of the first source/drain patterns SD1, may be a first channel pattern CH1, and the second upper pattern UP2, disposed between a pair of the second source/drain patterns SD2, may be a second channel pattern CH2.

The pair of first source/drain patterns SD1 may provide a compressive strain to the first channel pattern CH1 disposed therebetween. The pair of second source/drain patterns SD2 may provide a tensile strain to the second channel pattern CH2 disposed therebetween. For example, when the first and second channel patterns CH1 and CH2 include germanium (Ge) or silicon-germanium (SiGe), each of the first and second source/drain patterns SD1 and SD2 may include silicon (Si), germanium (Ge), and/or silicon-germanium (SiGe). A silicon concentration and/or a germanium concentration of the first source/drain patterns SD1 may be adjusted to provide the compressive strain to the first channel pattern CH1, and a silicon concentration and/or a germanium concentration of the second source/drain patterns SD2 may be adjusted to provide the tensile strain to the second channel pattern CH2. The first source/drain patterns SD1 may be doped with P-type dopants during or after the SEC process, and the second source/drain patterns SD2 may be doped with N-type dopants during or after the SEG process.

Referring to FIGS. 10A to 10D, a first interlayer insulating layer 140 may be formed on the entire top surface of the substrate 100. For example, the first interlayer insulating layer 140 may include a silicon oxide layer or a silicon oxynitride layer. Then, a planarization process may be performed on the first interlayer insulating layer 140 until top surfaces of the sacrificial gate patterns 120 are exposed. The planarization process may include an etch-back process and/or a CMP process. When the first interlayer insulating layer 140 is planarized, the gate mask patterns 125 disposed on the sacrificial gate patterns 120 may be removed.

The sacrificial gate patterns 120 may be replaced with gate electrodes GE, respectively. In an exemplary embodiment of the inventive concept, forming the gate electrodes GE may include removing the exposed sacrificial gate patterns 120 to form gap regions, each of which is disposed between the gate spacers GS, sequentially forming a gate insulating layer and a gate conductive layer filling the gap regions, and planarizing the gate conductive layer and the gate insulating layer to form a gate insulating pattern GI and the gate electrode GE in each of the gap regions. For example, the gate insulating layer may include a silicon oxide layer, a silicon oxynitride layer, and/or a high-k dielectric layer having a dielectric constant higher than that of a silicon oxide layer. For example, the gate conductive layer may include a doped semiconductor material, a conductive metal nitride, and/or a metal.

Thereafter, the gate insulating patterns GI and the gate electrodes GE in the gap regions may be recessed, and capping patterns GP may be formed on the recessed gate electrodes GE, respectively. For example, the capping patterns GP may include silicon oxide, silicon nitride, and/or silicon oxynitride.

Referring to FIGS. 1 and 2A to 2C, a second interlayer insulating layer 150 may be formed on the first interlayer insulating layer 140. For example, the second interlayer insulating layer 150 may include a silicon oxide layer and/or a silicon oxynitride layer.

Then, source/drain contacts CA may be formed at both sides of at least one of the gate electrodes GE. The contact holes may penetrate the second interlayer insulating layer 150 and the first interlayer insulating layer 140. The contact holes may expose the first and second source/drain patterns SD1 and SD2. When the contact holes are formed, upper portions of the first and second source/drain patterns SD1 and SD2 may be partially etched. Then, a first conductive pattern 160 and a second conductive pattern 165 may sequentially fill each of the contact holes. The first conductive pattern 160 may be a barrier conductive pattern. For example, the first conductive pattern 160 may include titanium nitride, tungsten nitride, and/or tantalum nitride. The second conductive pattern 165 may be a metal pattern. For example, the second conductive pattern 165 may include tungsten, titanium, and/or tantalum.

Even though not shown in the drawings, interconnection lines may be formed on the second interlayer insulating layer 150 to be connected to the source/drain contacts CA, respectively. The interconnection lines may include a conductive material.

In a method for manufacturing a semiconductor device, according to an exemplary embodiment of the inventive concept, a pair of channel patterns may be formed by oxidizing the sidewalls of the semiconductor pattern including a first semiconductor material and a second semiconductor material. Here, the second semiconductor material may be concentrated at the oxidized sidewalls of the semiconductor pattern during the oxidation process, and thus, the channel patterns may include a high concentration of the second semiconductor material. For example, since the channel patterns including the second semiconductor material are formed without additional processes (e.g., processes of depositing and patterning the second semiconductor material), process costs of manufacturing the semiconductor device may be reduced. In addition, since the channel patterns are formed to have relatively small widths and to occupy little space, the semiconductor device can be highly integrated.

Figure 11A:
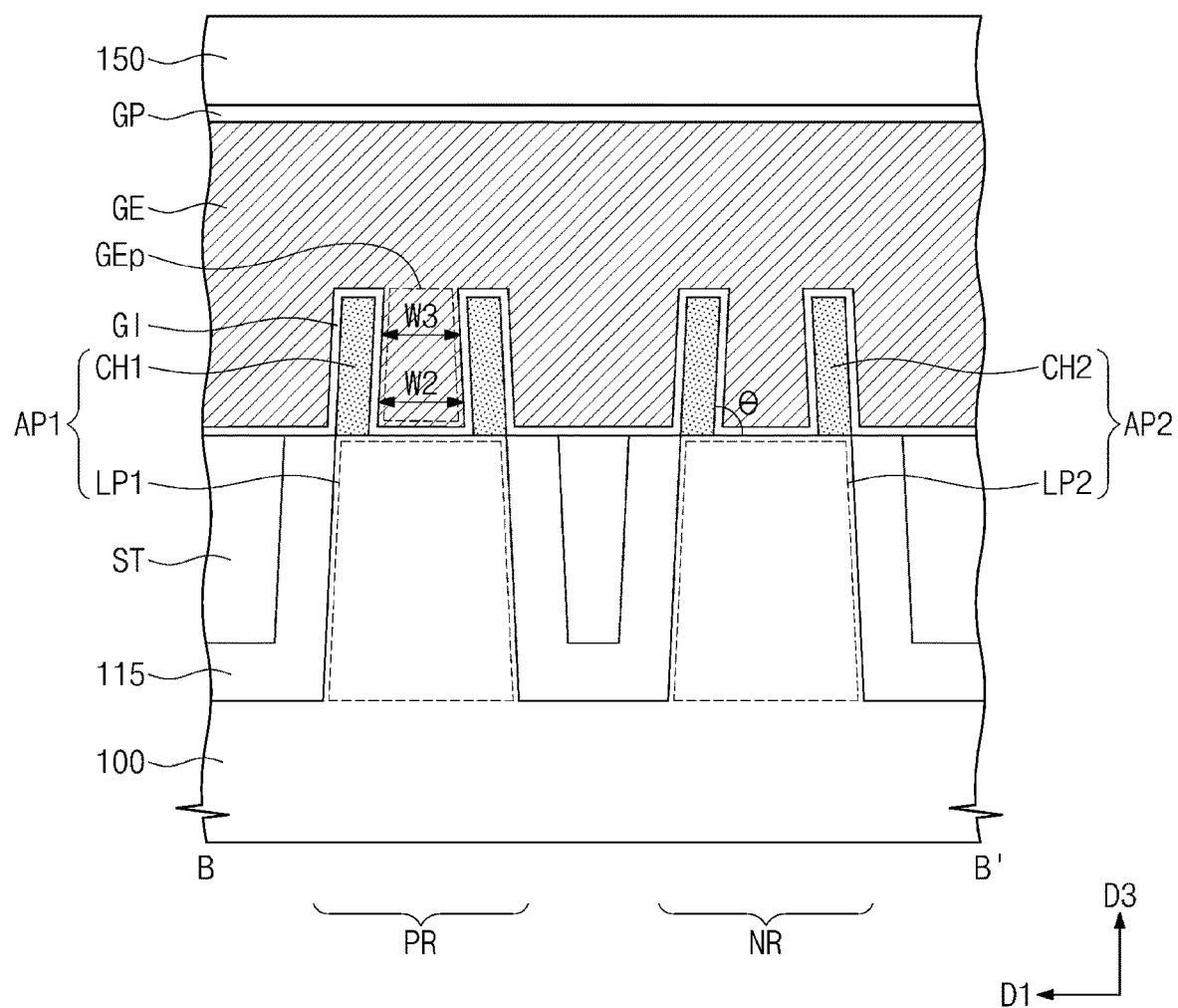
FIGS. 11A and 11B are cross-sectional views taken along lines B-B' and C-C' of FIG. 1, respectively, illustrating a semiconductor device according to an exemplary embodiment of the inventive concept.
Figure 11B:
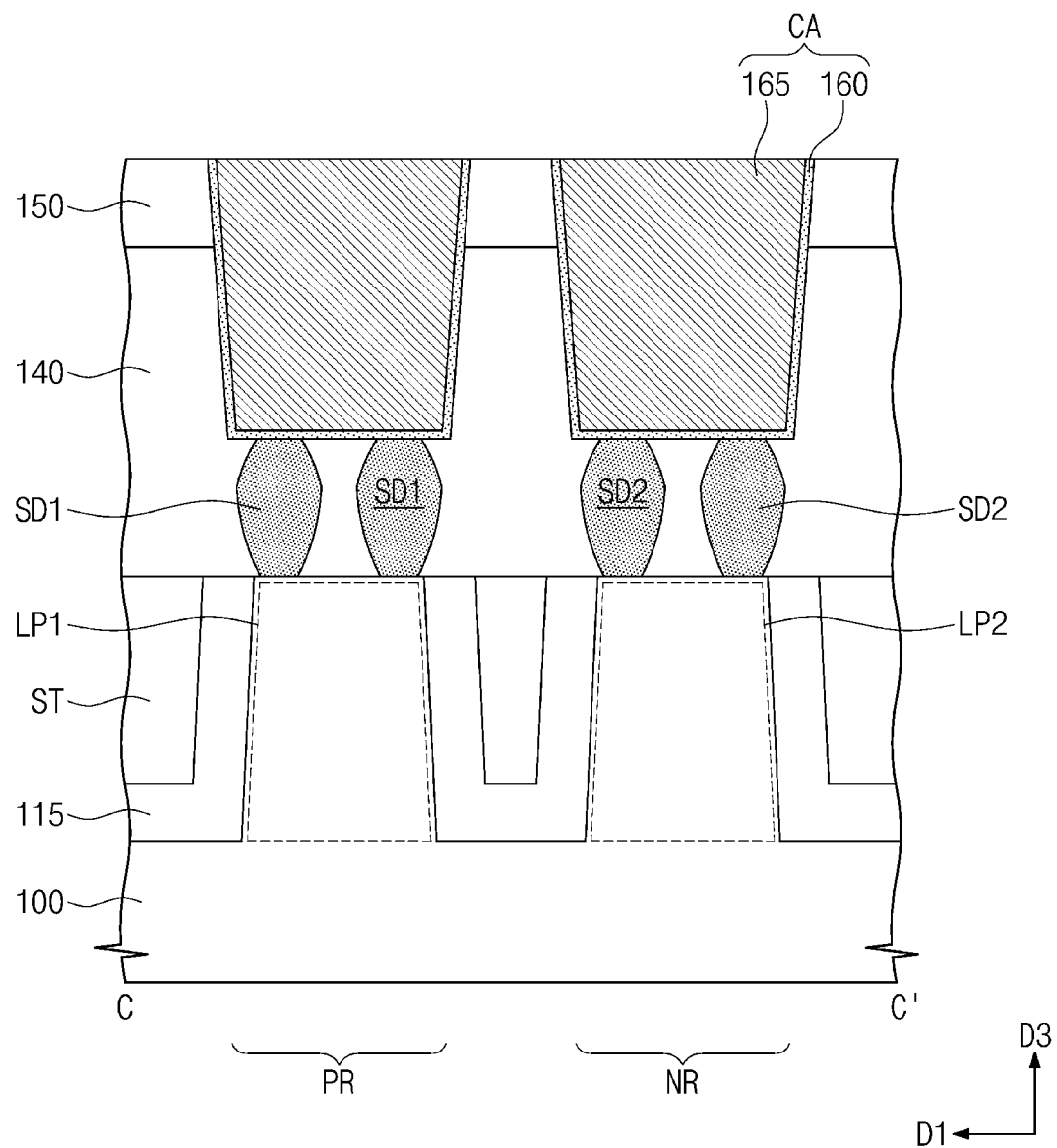

FIGS. 11A and 11B are cross-sectional views taken along lines B-B' and C-C' of FIG. 1, respectively, illustrating a semiconductor device according to an exemplary embodiment of the inventive concept. Features not described again may be assumed to be the same as or similar to corresponding features already described with reference to FIGS. 1 and 2A to 2C.

Referring to FIGS. 1, 2A, 11A, and 11B, a first active pattern AP1 extending in the second direction D2 may be disposed on the PMOSFET region PR, and a second active pattern AP2 extending in the second direction D2 may be disposed on the NMOSFET region NR.

The first active pattern AP1 may include a first lower pattern LP1 and first channel patterns CH1. The second active pattern AP2 may include a second lower pattern LP2 and second channel patterns CH2.

As illustrated in FIGS. 11A and 11B, a width of each of the first and second lower patterns LP1 and LP2 may decrease as a height in a vertical direction (e.g., the third direction D3, or with respect to a surface of the substrate 100 disposed opposite to the oxide patterns 115) increases when viewed from a cross-sectional view taken in the first direction D1. For example, sidewalls of the first and second lower patterns LP1 and LP2 may have a positive gradient.

As illustrated in FIG. 11A, a sidewall of one of a pair of the first channel patterns CH1 may be aligned with a sidewall of the first lower pattern LP1, and a sidewall of the other of the pair of first channel patterns CH1 may be aligned with another sidewall (e.g., an opposite sidewall) of the first lower pattern LP1. For example, the sidewalls of the first channel patterns CH1 may have a positive gradient. Thus, each of the first channel patterns CH1 may form an angle θ with a top surface of the first lower pattern LP1, and the angle θ may range from about 60 degrees to about 89 degrees. A sidewall of one of a pair of the second channel patterns CH2 may be aligned with a sidewall of the second lower pattern LP2, and a sidewall of the other of the pair of second channel patterns CH2 may be aligned with another sidewall (e.g., an opposite sidewall) of the second lower pattern LP2. For example, the sidewalls of the second channel patterns CH2 may have a positive gradient. Thus, each of the second channel patterns CH2 may form the angle θ with a top surface of the second lower pattern LP2.

Gate electrodes GE may extend in the first direction D1 on the substrate 100 and may intersect the first and second channel patterns CH1 and CH2. Referring again to FIG. 11A, each of the gate electrodes GE may include a portion GEp disposed between the pair of first channel patterns CH1 when viewed in a cross-sectional view taken along the first direction D1. Here, a width of the portion GEp may decrease as a height from the substrate 100 increases. For example, a lower portion of the portion GEp may have a second width W2, and an upper portion of the portion GEp may have a third width W3 smaller than the second width W2. Each of the gate electrodes GE may further include another portion disposed between the pair of second channel patterns CH2, and features of the another portion may be similar to or the same as the features of the portion GEp.

Figure 12:
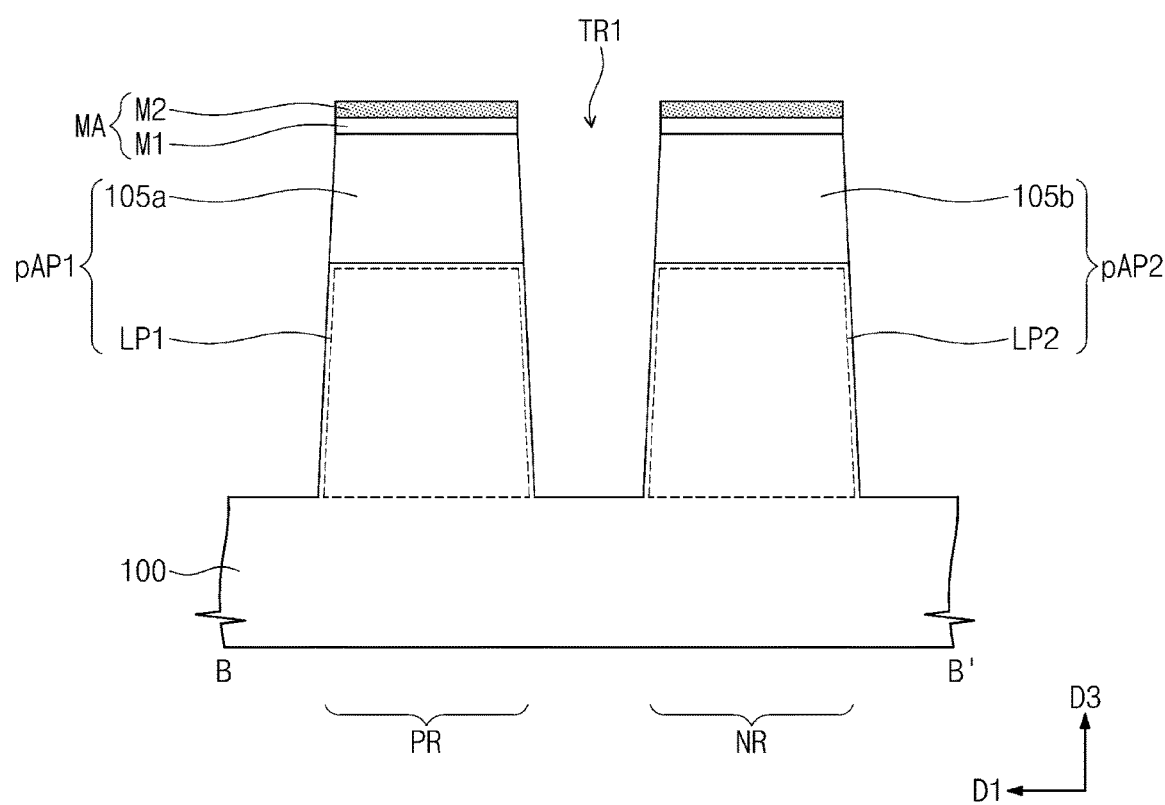
FIGS. 12 and 13 are cross-sectional views taken along lines B-B' of FIGS. 4A and 5A, respectively, illustrating a method for manufacturing a semiconductor device according to an exemplary embodiment of the inventive concept.
Figure 13:
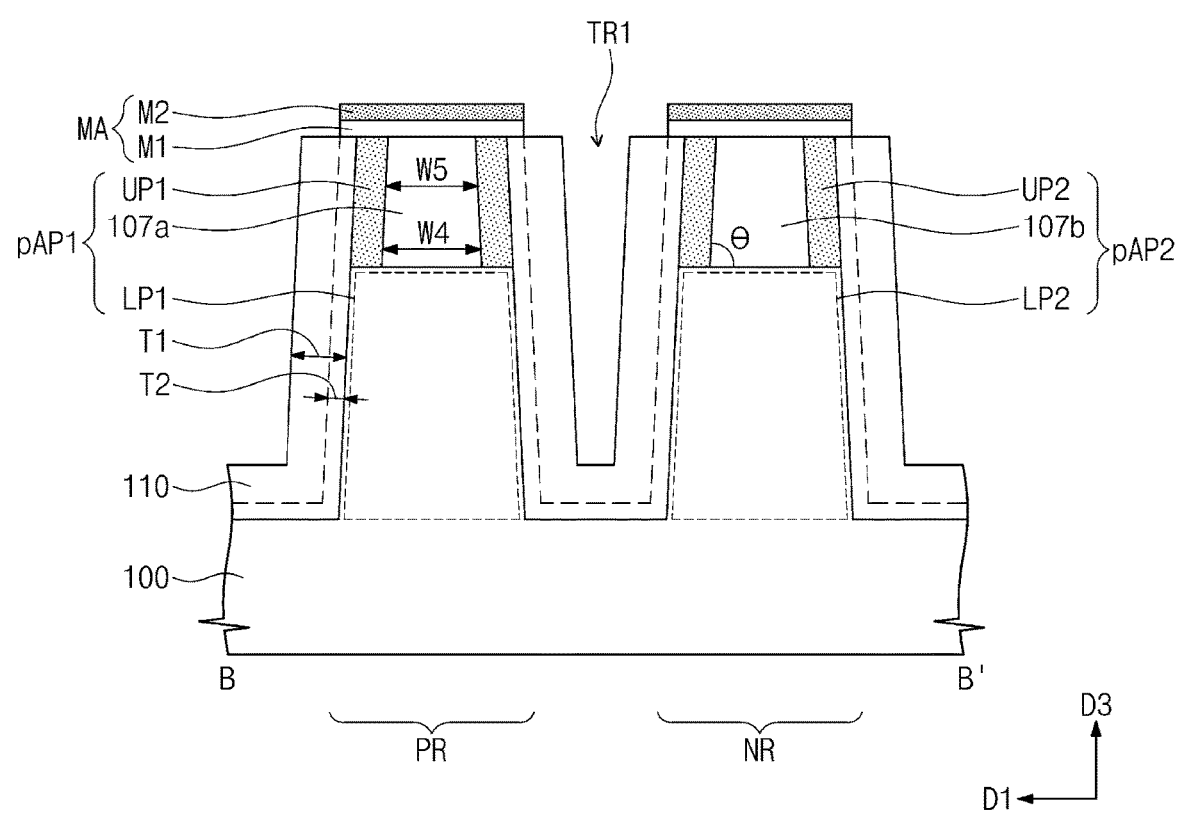

FIGS. 12 and 13 are cross-sectional views taken along lines B-B' of FIGS. 4A and 5A, respectively, illustrating a method for manufacturing a semiconductor device according to an exemplary embodiment of the inventive concept. Features not described again may be assumed to be the same as or similar to corresponding features already described with reference to FIGS. 3A to 10A, 3B to 10B, 3C to 10C, and 8D to 10D.

Referring to FIGS. 4A, 4B, and 12, the semiconductor layer 103 and the upper portion of the substrate 100 of FIGS. 3A to 3C may be patterned to form first and second preliminary active patterns pAP1 and pAP2. Unlike as shown in FIG. 4C, a width in the first direction D1 of each of the first and second preliminary active patterns pAP1 and pAP2 may decrease as a height in a vertical direction (e.g., the third direction D3, or with respect to a surface of the substrate 100 disposed opposite to the first and second preliminary active patterns pAP1 and pAP2) increases. For example, the width of each of the first and second preliminary active patterns pAP1 and pAP2 may become progressively smaller in a direction toward a top surface of each of the first and second preliminary active patterns pAP1 and pAP2. Sidewalls of the first and second preliminary active patterns pAP1 and pAP2 may have a positive gradient.

Referring to FIGS. 5A, 5B, and 13, the oxidation process may be performed on the substrate 100 to form oxide layers 110. When the oxide layers 110 are formed, a pair of first upper patterns UP1 and a third semiconductor pattern 107a disposed between the pair of first upper patterns UP1 may be formed from the first semiconductor pattern 105a. In addition, a pair of second upper patterns UP2 and a fourth semiconductor pattern 107b disposed between the pair of second upper patterns UP2 may be formed from the second semiconductor pattern 105b.

The first and second upper patterns UP1 and UP2 may be formed along the inclined profiles of the first and second preliminary active patterns pAP1 and pAP2 described above with reference to FIGS. 4A, 4B, and 12. Thus, each of the first upper patterns UP1 may form an angle θ with a top surface of the first lower pattern LP1, and the angle θ may range from about 60 degrees to about 89 degrees. Each of the second upper patterns UP2 may form the angle θ with a top surface of the second lower pattern LP2.

A width of each of the third and fourth semiconductor patterns 107a and 107b may decrease as a height from the substrate 100 increases (e.g., as a distance with respect to a surface of the substrate 100 disposed opposite to the first and second preliminary active patterns pAP1 and pAP2 increases). For example, a lower portion of each of the third and fourth semiconductor patterns 107a and 107b may have a fourth width W4 in the first direction D1, and an upper portion of each of the third and fourth semiconductor patterns 107a and 107b may have a fifth width W5 in the first direction D1. The fifth width W5 may be smaller than the fourth width W4.

Then, the same or similar processes as described with reference to FIGS. 6A to 10D may be performed to manufacture the semiconductor device described with reference to FIGS. 1, 2A, 11A, and 11B.

Figure 14A:
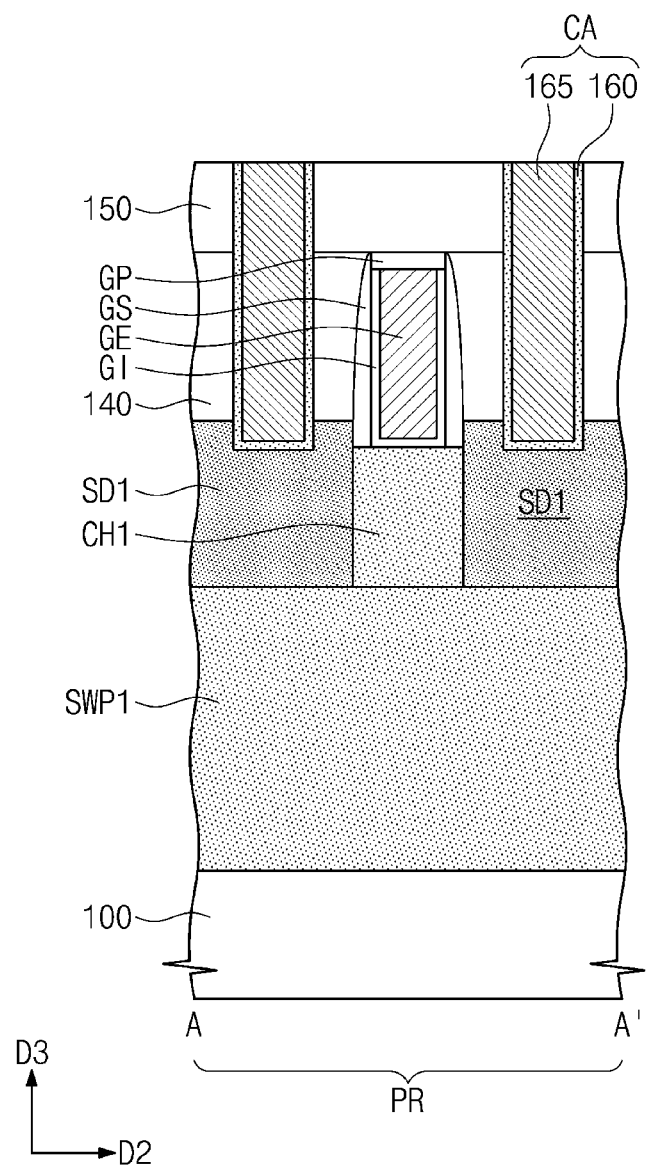
Figure 14C:
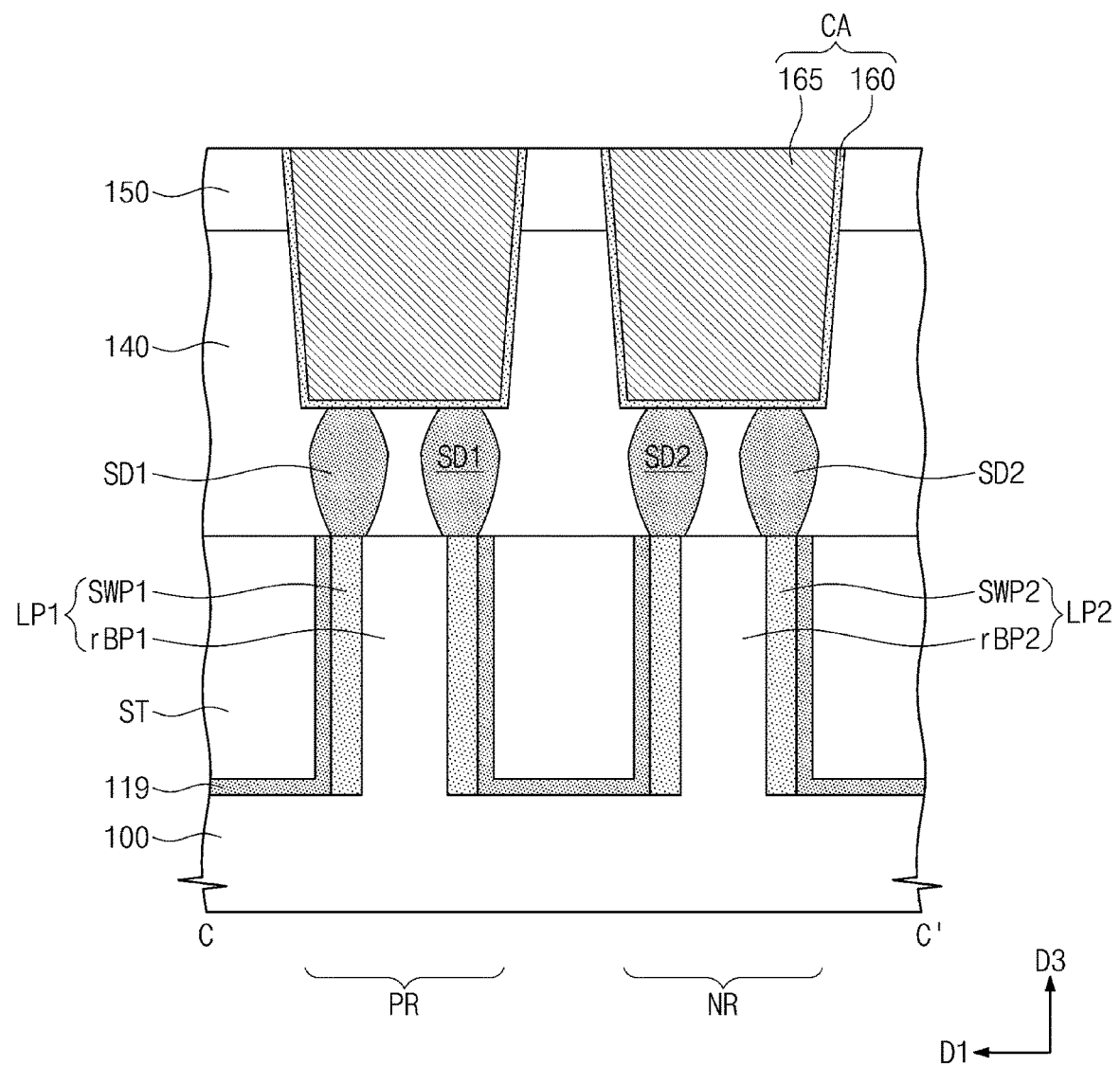

FIGS. 14A, 14B, and 14C are cross-sectional views taken along lines A-A', B-B', and C-C' of FIG. 1, respectively, illustrating a semiconductor device according to an exemplary embodiment of the inventive concept. Features not described again may be assumed to be the same as or similar to corresponding features already described with reference to FIGS. 1 and 2A to 2C.

Referring to FIGS. 1 and 14A to 14C, a first active pattern AP1 extending in the second direction D2 may be disposed on the PMOSFET region PR, and a second active pattern AP2 extending in the second direction D2 may be disposed on the NMOSFET region NR.

The first active pattern AP1 may include a first lower pattern LP1 and a pair of first channel patterns CH1 disposed on the first lower pattern LP1. The first lower pattern LP1 may include a first recessed base pattern rBP1 and first sidewall patterns SWP1 disposed on both sidewalls of the first recessed base pattern rBP1. The second active pattern AP2 may include a second lower pattern LP2 and a pair of second channel patterns CH2 disposed on the second lower pattern LP2. The second lower pattern LP2 may include a second recessed base pattern rBP2 and second sidewall patterns SWP2 disposed on both sidewalls of the second recessed base pattern rBP2.

The first and second lower patterns LP1 and LP2 may extend in the third direction D3 perpendicular to the top surface of the substrate 100. For example, the first and second lower patterns LP1 and LP2 may vertically protrude from the substrate 100. In addition, each of the first and second lower patterns LP1 and LP2 may have a line or bar shape extending in the second direction D2 when viewed in a plan view.

According to an exemplary embodiment of the inventive concept, the first and second recessed base patterns rBP1 and rBP2 may be portions of the substrate 100. For example, the first and second recessed base patterns rBP1 and rBP2 may include the same semiconductor material as the substrate 100. The first and second recessed base patterns rBP1 and rBP2 may include a first semiconductor material. For example, the first semiconductor material may be silicon (Si). The first and second sidewall patterns SWP1 and SWP2 may include a second semiconductor material. The second semiconductor material may be different from the first semiconductor material. For example, the first and second sidewall patterns SWP1 and SWP2 may include a different semiconductor material from the semiconductor material included in first and second recessed base patterns rBP1 and rBP2. The first and second sidewall patterns SWP1 and SWP2 may further include the first semiconductor material. For example, the first and second sidewall patterns SWP1 and SWP2 may include a compound of the first semiconductor material and the second semiconductor material. In the first and second sidewall patterns SWP1 and SWP2, a concentration (e.g., atomic percentage (at %)) of the second semiconductor material may be higher than a concentration (e.g., atomic percentage (at %)) of the first semiconductor material. However, the inventive concept is not limited thereto. For example, the second semiconductor material may be germanium (Ge). In this case, an average concentration of germanium of the first and second sidewall patterns SWP1 and SWP2 may range from about 20 at % to about 100 at %. For example, the first and second sidewall patterns SWP1 and SWP2 may include, silicon-germanium (SiGe) or germanium (Ge).

Device isolation patterns ST may be disposed at both sides of each of the first and second lower patterns LP1 and LP2. Liner patterns 119 may be disposed between the device isolation patterns ST and the lower patterns LP1 and LP2 and between the substrate 100 and the device isolation patterns ST. The liner patterns 119 may include silicon nitride (SiN), silicon carbonitride (SiCN), silicon-boron nitride (SiBN), and/or silicon-carbon-boron nitride (SiCBN).

A top surface of the first lower pattern LP1 may be disposed at substantially the same elevation or level as a top surface of the second lower pattern LP2. For example, the top surfaces of the first and second lower patterns LP1 and LP2 may be coplanar. Top surfaces of the liner patterns 119 may be substantially coplanar with top surfaces of the device isolation patterns ST. In an exemplary embodiment of the inventive concept, the top surfaces of the first and second lower patterns LP1 and LP2 may be disposed at substantially the same elevation or level as the top surfaces of the device isolation patterns ST and the top surfaces of the liner patterns 119. In an exemplary embodiment of the inventive concept, even though not shown in the drawings, the top surfaces of the first and second lower patterns LP1 and LP2 may be disposed at a higher elevation or level with respect to a surface of the substrate 100 than the top surfaces of the device isolation patterns ST and the top surfaces of the liner patterns 119. In an exemplary embodiment of the inventive concept, even though not shown in the drawings, the top surfaces of the first and second lower patterns LP1 and LP2 may be disposed at a lower elevation or level than the top surfaces of the device isolation patterns ST and the top surfaces of the liner patterns 119. For example, the top surfaces of the first and second lower patterns LP1 and LP2 may be closer to a surface of the substrate 100 facing the liner patterns 119 than the top surfaces of the device isolation patterns ST and the top surfaces of the liner patterns 119.

The first channel patterns CH1 may vertically protrude from between the device isolation patterns ST and between the liner patterns 119. For example, the first channel patterns CH1 may have fin shapes. The second channel patterns CH2 may vertically protrude from between the device isolation patterns ST and between the liner patterns 119. For example, the second channel patterns CH2 may have fin shapes.

As illustrated in FIG. 14B, the pair of first channel patterns CH1 may be spaced apart from each other in the first direction D1 on the first lower pattern LP1. For example, the pair of first channel patterns CH1 may be disposed on both side portions (e.g., the first sidewall patterns SWP1) of the first lower pattern LP1, respectively, when viewed in a cross-sectional view taken in the first direction D1. In an exemplary embodiment of the inventive concept, a side wall of one of the pair of first channel patterns CH1 may be aligned with a sidewall of one of the first sidewall patterns SWP1, and a sidewall of the other of the pair of first channel patterns CH1 may be aligned with a sidewall of the other of the first sidewall patterns SWP1. The pair of second channel patterns CH2 may be spaced apart from each other in the first direction D1 on the second lower pattern LP2. For example, the pair of second channel patterns CH2 may be disposed on both side portions (e.g., the second sidewall patterns SWP2) of the second lower pattern LP2, respectively, when viewed from a cross-sectional view taken in the first direction D1. In an exemplary embodiment of the inventive concept, a sidewall of one of the pair of second channel patterns CH2 may be aligned with a sidewall of one of the second sidewall patterns SWP2, and a sidewall of the other of the pair of second channel patterns CH2 may be aligned with a sidewall of the other of the second sidewall patterns SWP2. Each of the first channel patterns CH1 may have a first width W1 in the first direction D1 and may be connected to the first sidewall pattern SWP1 disposed thereunder. The first channel pattern CH1 and the first sidewall pattern SWP1 connected to each other may constitute one body (e.g., a continuous structure). Each of the second channel patterns CH2 may have the first width W1 in the first direction D1 and may be connected to the second sidewall pattern SWP2 disposed thereunder. The second channel pattern CH2 and the second sidewall pattern SWP2 connected to each other may constitute one body (e.g., a continuous structure). For example, the second channel patterns CH2 may have substantially the same width as the first channel patterns CH1.

The first and second channel patterns CH1 and CH2 may include the same material as the first and second sidewall patterns SWP1 and SWP2. For example, the first and second channel patterns CH1 and CH2 may include the second semiconductor material or the compound of the first and second semiconductor materials. For example, the first and second channel patterns CH1 and CH2 may include germanium (Ge) or silicon-germanium (SiGe). In this case, an average concentration of germanium of the first and second channel patterns CH1 and CH2 may range from about 20 at % to about 100 at %. The first channel patterns CH1 may have an N-type conductivity, and the second channel patterns CH2 may have a P-type conductivity.

Gate electrodes GE may extend in the first direction D1 to intersect the first and second active patterns AP1 and AP2. Each of the gate electrodes GE may cover top surfaces and sidewalls of the first channel patterns CH1 and top surfaces and sidewalls of the second channel patterns CH2. In addition, each of the gate electrodes GE may also cover the top surface of the first lower pattern LP1 disposed between the pair of first channel patterns CH1 and the top surface of the second lower pattern LP2 disposed between the pair of second channel patterns CH2. Furthermore, each of the gate electrodes GE may extend in the first direction D1 to intersect the device isolation patterns ST.

First source/drain patterns SD1 may be disposed on the first lower pattern LP1 at both sides of the gate electrode GE, and second source/drain patterns SD2 may be disposed on the second lower pattern LP2 at both sides of the gate electrode GE. For example, each of the first channel patterns CH1 may be disposed under the gate electrode GE in a cross-sectional view and may be disposed between the first source/drain patterns SD1 adjacent to each other in a plan view. Each of the second channel patterns CH2 may be disposed under the gate electrode GE in a cross-sectional view and may be disposed between the second source/drain patterns SD2 adjacent to each other in a plan view. As illustrated in FIG. 14C, a pair of the first source/drain patterns SD1 may be disposed on the both side portions (e.g., the first sidewall patterns SWP1) of the first lower pattern LP1, respectively, when viewed from a cross-sectional view taken in the first direction D1. In addition, a pair of the second source/drain patterns SD2 may be disposed on the both side portions (e.g., the second sidewall patterns SWP2) of the second lower pattern LP2, respectively. In an exemplary embodiment of the inventive concept, unlike FIG. 14C, the pair of first source/drain patterns SD1 may be connected to each other to constitute a single first source/drain pattern SD1. In this case, the pair of first channel patterns CH1 may be in contact with the single first source/drain pattern SD1. In addition, the pair of second source/drain patterns SD2 may be connected to each other to constitute a single second source/drain pattern SD2.

Other elements of the semiconductor device may be similar to or substantially the same as elements of the semiconductor device of FIGS. 2A to 2C. Thus, detailed descriptions thereof may be omitted for brevity.

FIGS. 15A, 16A, 17A, 18A, 19A, 20A, 21A, and 22A are plan views illustrating a method for manufacturing a semiconductor device according to an exemplary embodiment of the inventive concept. FIGS. 15B, 16B, 17B, 18B, 19B, 20B, 21B, and 22B are cross-sectional views taken along lines A-A' of FIGS. 15A, 16A, 17A, 18A, 19A, 20A, 21A, and 22A, respectively. FIGS. 15C, 16C, 17C, 18C, 19C, 20C, 21C, and 22C are cross-sectional views taken along lines B-B' of FIGS. 15A, 16A, 17A, 18A, 19A, 20A, 21A, and 22A, respectively.

Figure 15A:
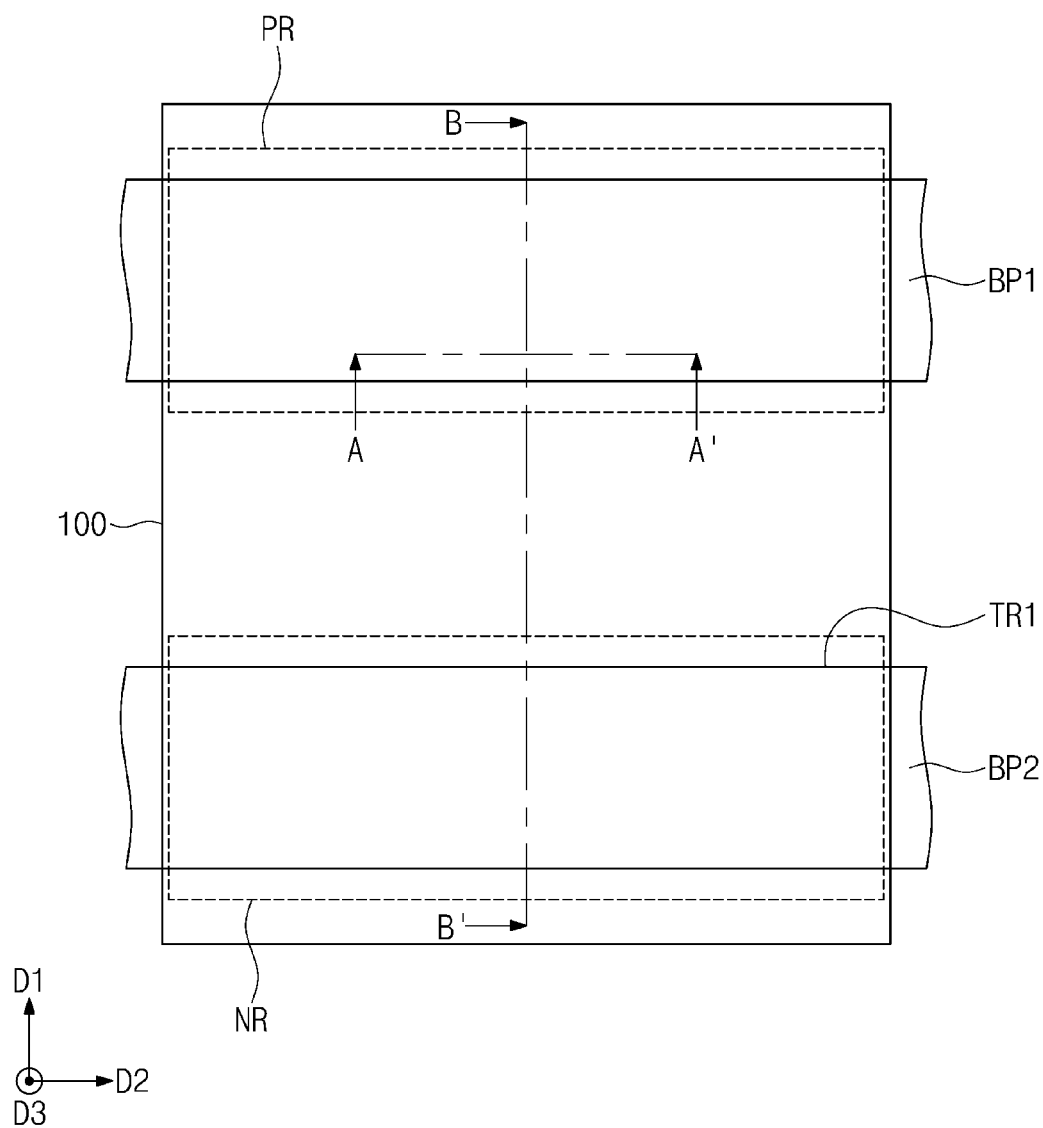
FIGS. 15A, 16A, 17A, 18A, 19A, 20A, 21A, and 22A are plan views illustrating a method for manufacturing a semiconductor device according to an exemplary embodiment of the inventive concept.
Figure 15B:
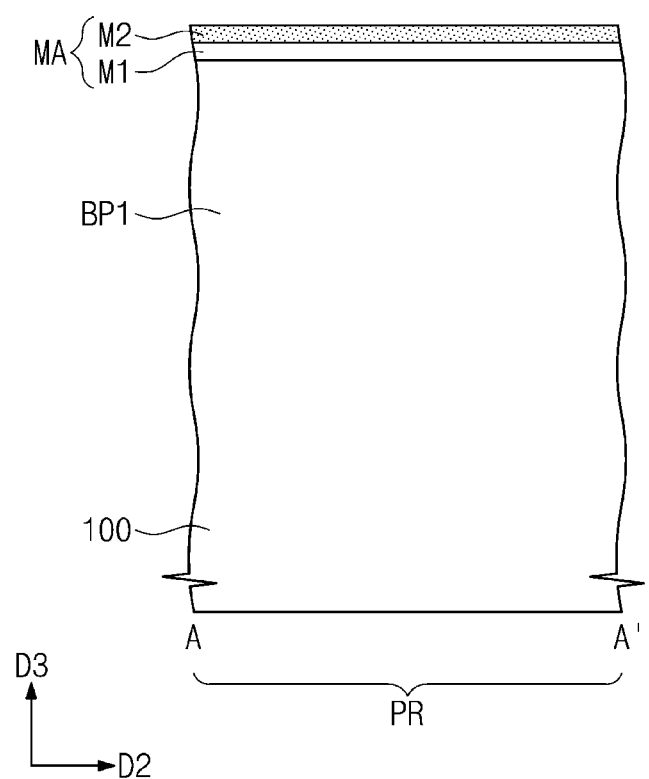

Referring to FIGS. 15A to 15C, an upper portion of the substrate 100 may be patterned to form a first base pattern BP1 and a second base pattern BP2 on the PMOSFET region PR and the NMOSFET region NR, respectively. The first and second base patterns BP1 and BP2 may have line or bar shapes extending in the second direction D2 and may be spaced apart from each other in the first direction D1. In addition, the first and second base patterns BP1 and BP2 may vertically protrude from the substrate 100. In an exemplary embodiment of the inventive concept, widths of the first and second base patterns BP1 and BP2 in the first direction D1 may be substantially uniform. However, the inventive concept not limited thereto.

Forming the first and second base patterns BP1 and BP2 may include forming mask patterns MA on the substrate 100, and anisotropically etching the upper portion of the substrate 100 by using the mask patterns MA as etch masks. Thus, first trenches TR1 may define the first and second base patterns BP1 and BP2. Hereinafter, bottom surfaces of the first trenches TR1 may be defined as a top surface of the substrate 100, and the first and second base patterns BP1 and BP2 may vertically protrude from the top surface of the substrate 100. Each of the mask patterns MA may include a buffer pattern M1 and a hard mask pattern M2, which are sequentially stacked. For example, the buffer pattern M1 may include a silicon oxide layer or a silicon oxynitride layer, and the hard mask pattern M2 may include a silicon nitride layer.

Figure 16A:
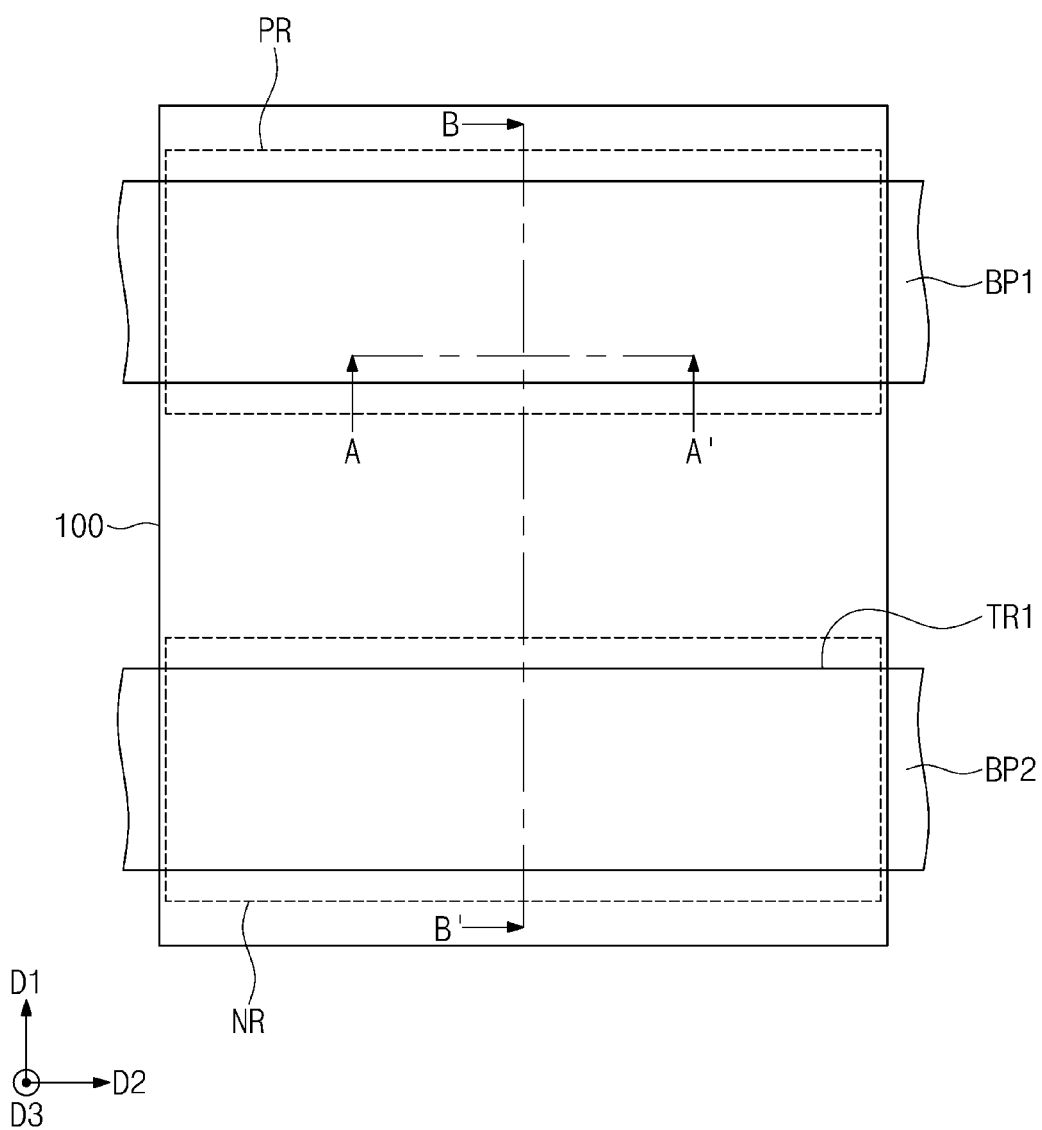
Figure 16B:
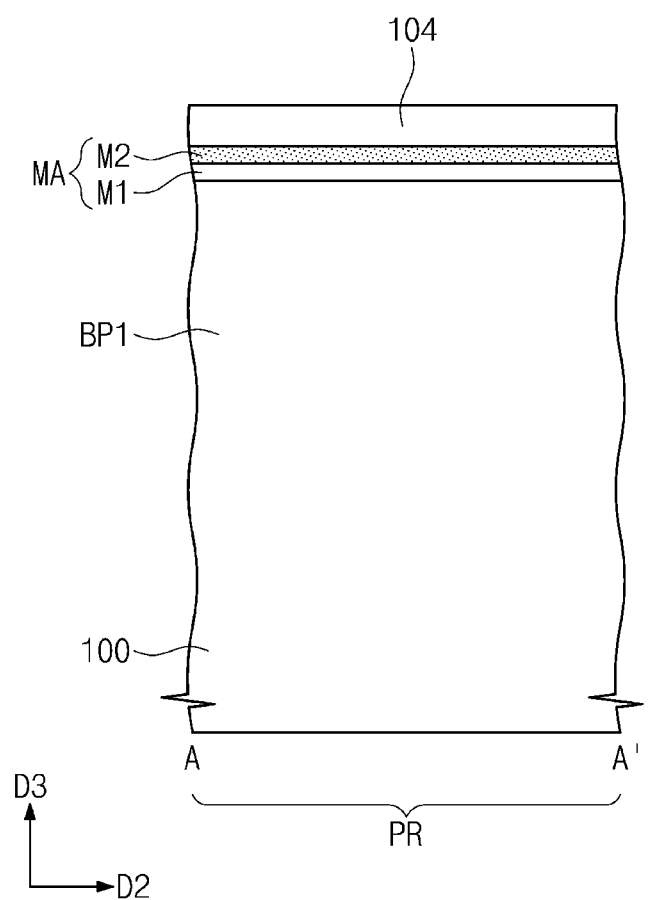
Figure 16C:
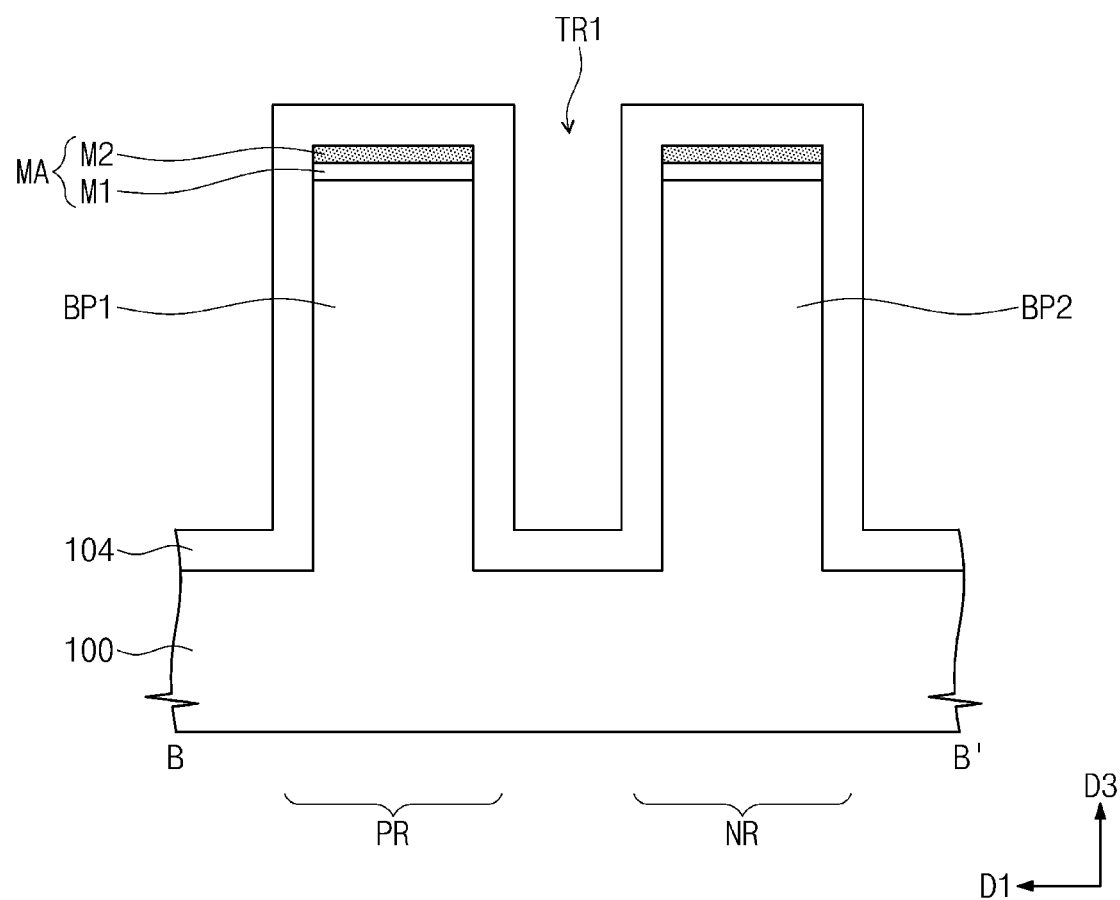

Referring to FIGS. 16A to 16C, a semiconductor layer 104 may be formed on the substrate 100. The semiconductor layer 104 may cover the top surface of the substrate 100, sidewalls of the first and second base patterns BP1 and BP2, and sidewalls and top surfaces of the mask patterns MA. In an exemplary embodiment of the inventive concept, the semiconductor layer 104 may be formed using an epitaxial growth process. For example, the epitaxial growth process may include a CVD process or an MBE process. The semiconductor layer 104 might not be selectively epitaxially grown on the substrate 100 but may be conformally grown on the substrate 100 including the first and second base patterns BP1 and BP2. Like the semiconductor layer 103 of FIGS. 3A to 3C, the semiconductor layer 104 may include a first semiconductor material (e.g., silicon) and a second semiconductor material (e.g., germanium). For example, the semiconductor layer 104 may include a compound of the first semiconductor material and the second semiconductor material. For example, the semiconductor layer 104 may include silicon-germanium (SiGe). In this case, to reduce or minimize occurrence of defects caused by a difference in lattice constant between the substrate 100 and the semiconductor layer 104, an average concentration of germanium in the semiconductor layer 104 may be lower than 20 at %.

Figure 17A:
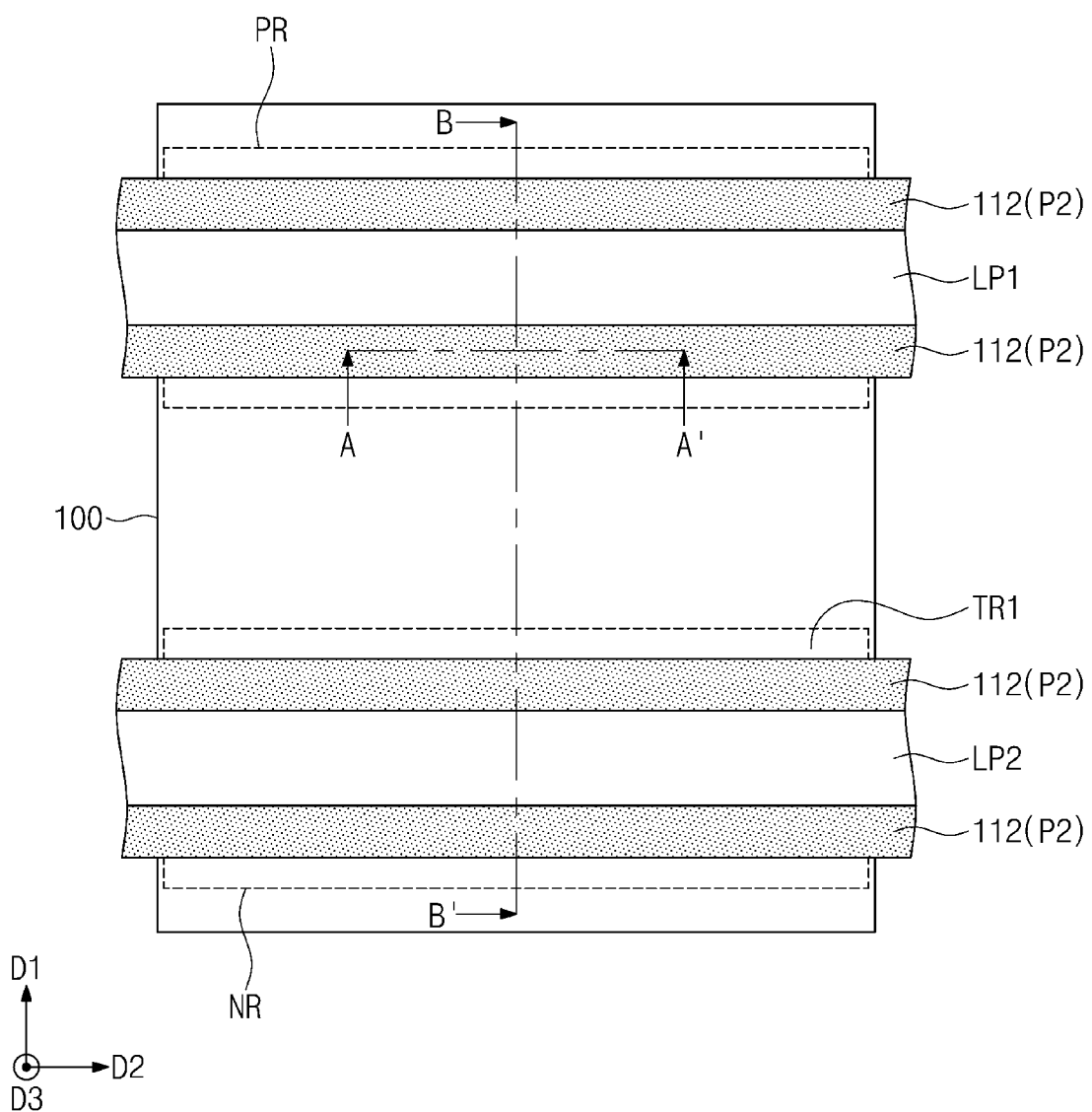
Figure 17C:
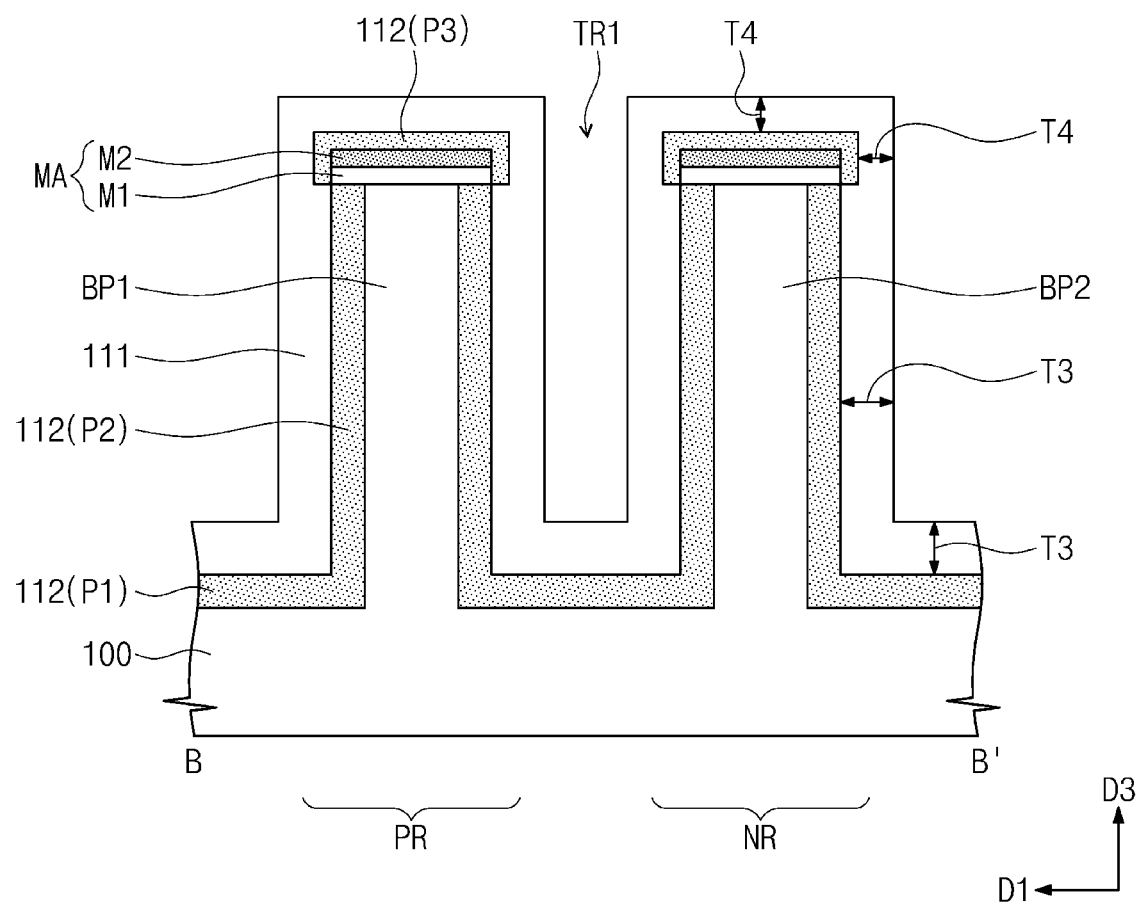

Referring to FIGS. 17A to 17C, the semiconductor layer 104 may be oxidized to form an oxide layer 111. The oxide layer 111 may cover the top surface of the substrate 100, the sidewalls of the first and second base patterns BP1 and BP2, and the sidewalls and top surfaces of the mask patterns MA along a profile of the semiconductor layer 104.

In an exemplary embodiment of the inventive concept, forming the oxide layer 111 may include performing a process cycle on the substrate 100 at least once. The process cycle may include an oxidation process and a thermal treatment process, which may be sequentially performed. For example, the oxidation process may be performed using an oxidation gas including oxygen, water vapor, or ozone. The thermal treatment process may be performed at a temperature of about 400 degrees Celsius to about 1200 degrees Celsius. However, the oxide layer 111 may also be formed by performing the process cycle a plurality of times.

The first semiconductor material (e.g., silicon) included in the semiconductor layer 104 may be selectively oxidized during the oxidation process, and thus the oxide layer 111 may be formed of an oxide of the first semiconductor material, e.g., silicon oxide. For example, the oxide layer 111 may be grown by mainly consuming the first semiconductor material (e.g., silicon) of the first and second semiconductor materials (e.g., silicon-germanium being the compound of the first and second semiconductor materials) included in the semiconductor layer 104. The subsequent thermal treatment process may accelerate the movement of the first semiconductor material (e.g., silicon) from the substrate 100 and the base patterns BP1 and BP2 into the semiconductor layer 104. Thus, when the process cycle is repeatedly performed, the first semiconductor material (e.g., silicon) included in the substrate 100 and the base patterns BP1 and BP2 may be supplied into the semiconductor layer 104 to participate in the oxidation reaction. For example, since the substrate 100 and the first and second base patterns BP1 and BP2 are the portions of the substrate 100 which are formed of silicon, the oxide layer 111 may be grown by consuming the silicon supplied from the first and second base patterns BP1 and BP2 during the repetition of the process cycle. As a result, the oxide layer 111 disposed on the top surface of the substrate 100 and the sidewalls of the base patterns BP1 and BP2 may be thicker than the oxide layer 111 disposed on the surfaces of the mask patterns MA. For example, a third thickness T3 of the oxide layer 111 may be greater than a fourth thickness T4 of the oxide layer 111.

During the process cycle, the second semiconductor material (e.g., germanium) of the semiconductor layer 104, which does not participate in the oxidation reaction, may be moved into the substrate 100 and the base patterns BP1 and BP2 to be concentrated in the substrate 100 and the base patterns BP1 and BP2 and/or may be moved to the surfaces of the mask patterns MA to be concentrated in the mask patterns MA. Thus, layers in which the second semiconductor material (e.g., germanium) is concentrated may be formed under and/or beside (e.g., adjacent to) the oxide layer 111 formed by oxidizing the semiconductor layer 104. The layers in which the second semiconductor material (e.g., germanium) is concentrated may be defined as a channel semiconductor layer 112. For example, an average concentration of germanium in the channel semiconductor layer 112 may range from about 20 at % to about 100 at %. For example, the channel semiconductor layer 112 may be a silicon-germanium (SiGe) layer or a germanium (Ge) layer.

The channel semiconductor layer 112 may include a first portion P1 disposed on the top surface of the substrate 100, a second portion P2 disposed on the sidewalls of the base patterns BP1 and BP2, and a third portion P3 disposed on the surfaces of the mask patterns MA. For example, the first portion P1 of the channel semiconductor layer 112 may be disposed between the oxide layer 111 and the substrate 100, the second portion P2 of the channel semiconductor layer 112 may be disposed between the oxide layer 111 and the base patterns BP1 and BP2, and the third portion P3 of the channel semiconductor layer 112 may be disposed between the oxide layer 111 and the mask patterns MA. At least a portion of the second portion P2 of the channel semiconductor layer 112 may overlap with the mask patterns MA.

Figure 18A:
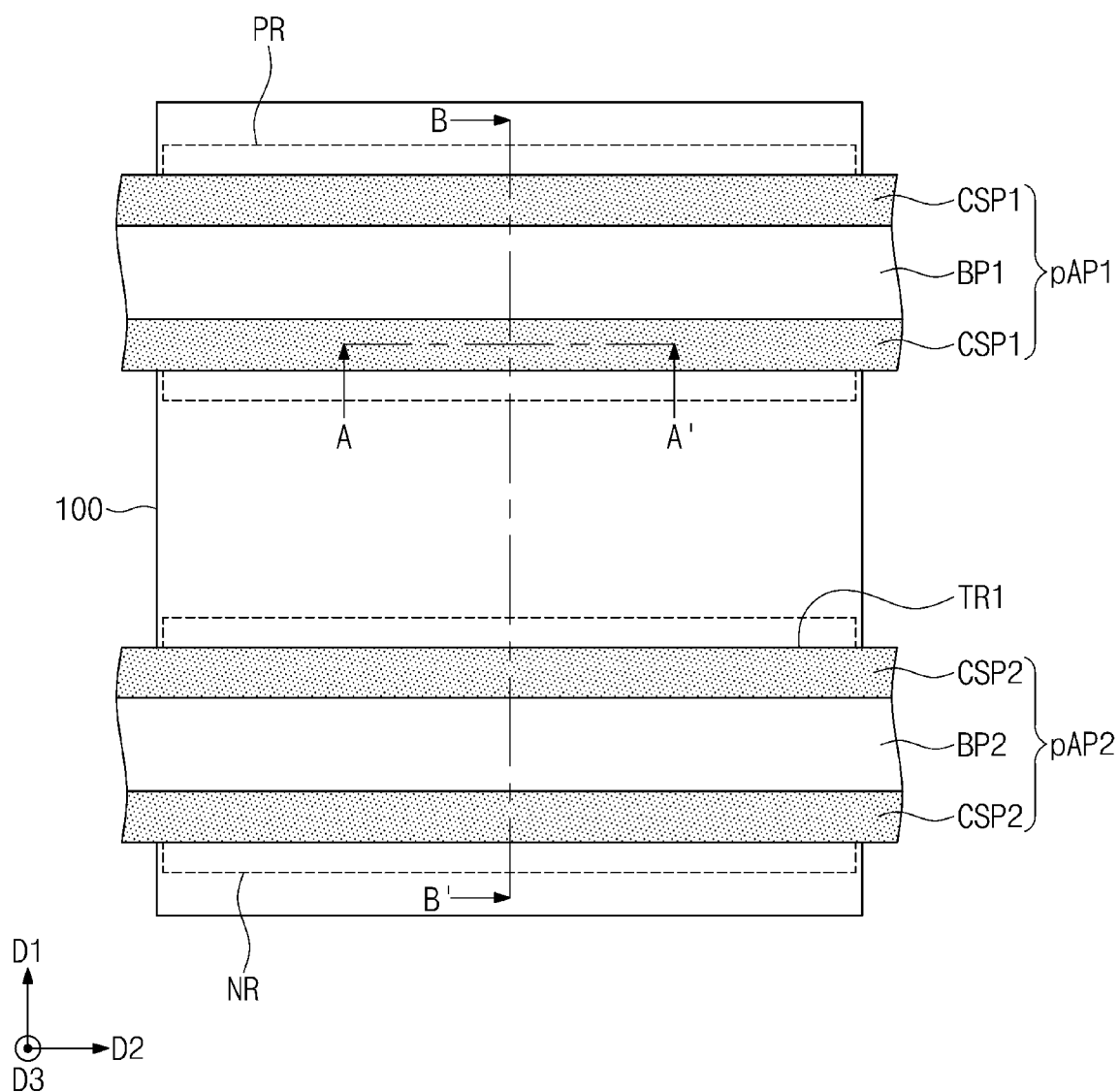
Figure 18B:
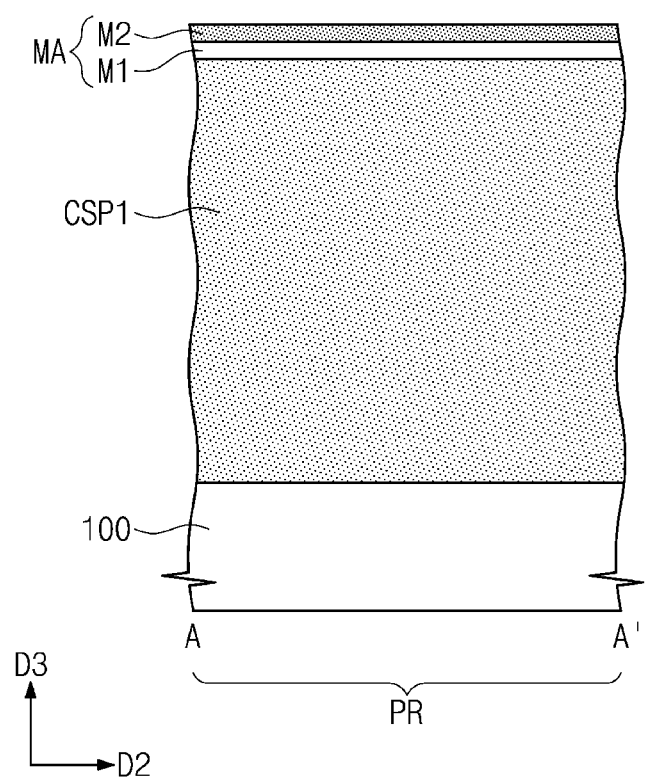
Figure 18C:
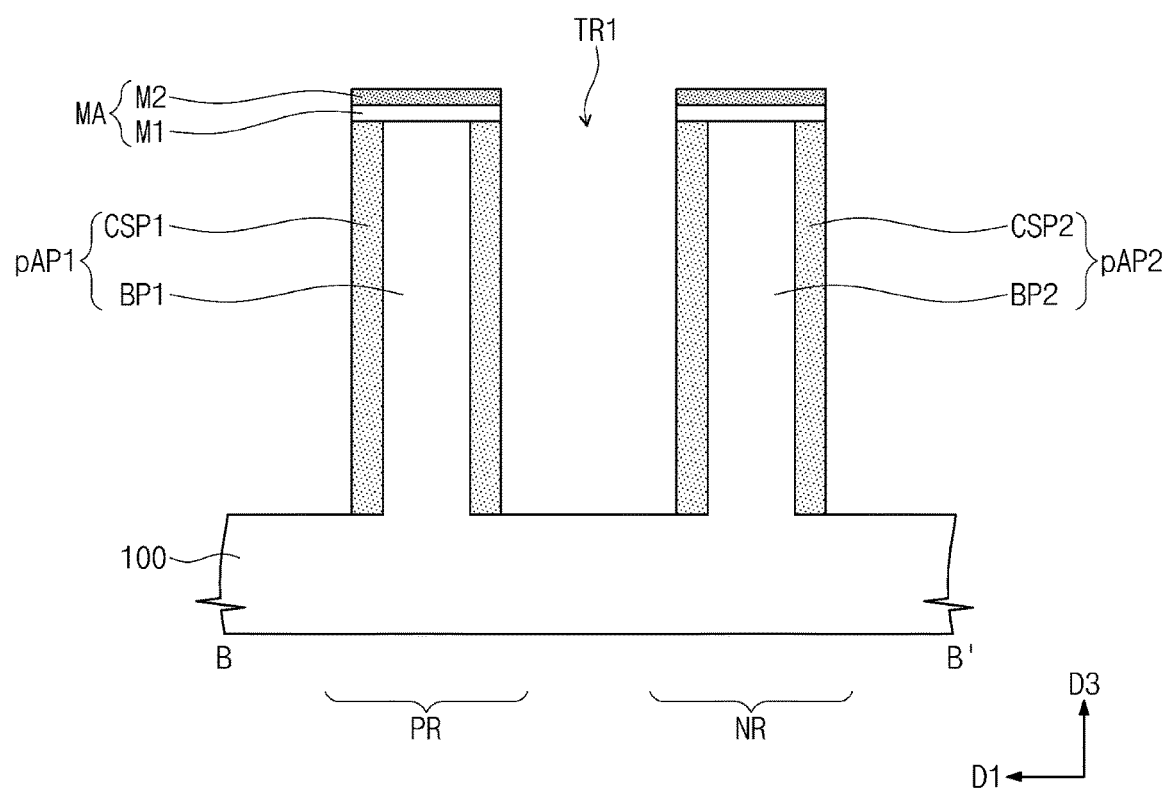

Referring to FIGS. 18A to 18C, a blanket anisotropic etching process may be performed on the substrate 100 to form first channel semiconductor patterns CSP1 on the sidewalls of the first base pattern BP1 and to form second channel semiconductor patterns CSP2 on the sidewalls of the second base pattern BP2. The blanket anisotropic etching process may be performed until the oxide layer 111 and the channel semiconductor layer 112 are sequentially etched to expose the top surface of the substrate 100 and the top surfaces of the mask patterns MA. As a result of the blanket anisotropic etching process, the oxide layer 111 and the first and third portions P1 and P3 of the channel semiconductor layer 112 may be completely removed but the second portion P2 of the channel semiconductor layer 112 under the mask patterns MA may remain to form the first and second channel semiconductor patterns CSP1 and CSP2. The first and second channel semiconductor patterns CSP1 and CSP2 may have sidewalls aligned with the sidewalls of the mask patterns MA. For example, the first and second channel semiconductor patterns CSP1 and CSP2 may be self-aligned with the mask patterns MA.

The first channel semiconductor patterns CSP1 may extend along the sidewalls of the first base pattern BP1 in the second direction D2. Likewise, the second channel semiconductor patterns CSP2 may extend along the sidewalls of the second base pattern BP2 in the second direction D2. Hereinafter, the first base pattern BP1 and the first channel semiconductor patterns CSP1 may be defined as a first preliminary active pattern pAP1, and the second base pattern BP2 and the second channel semiconductor patterns CSP2 may be defined as a second preliminary active pattern pAP2.

Figure 19A:
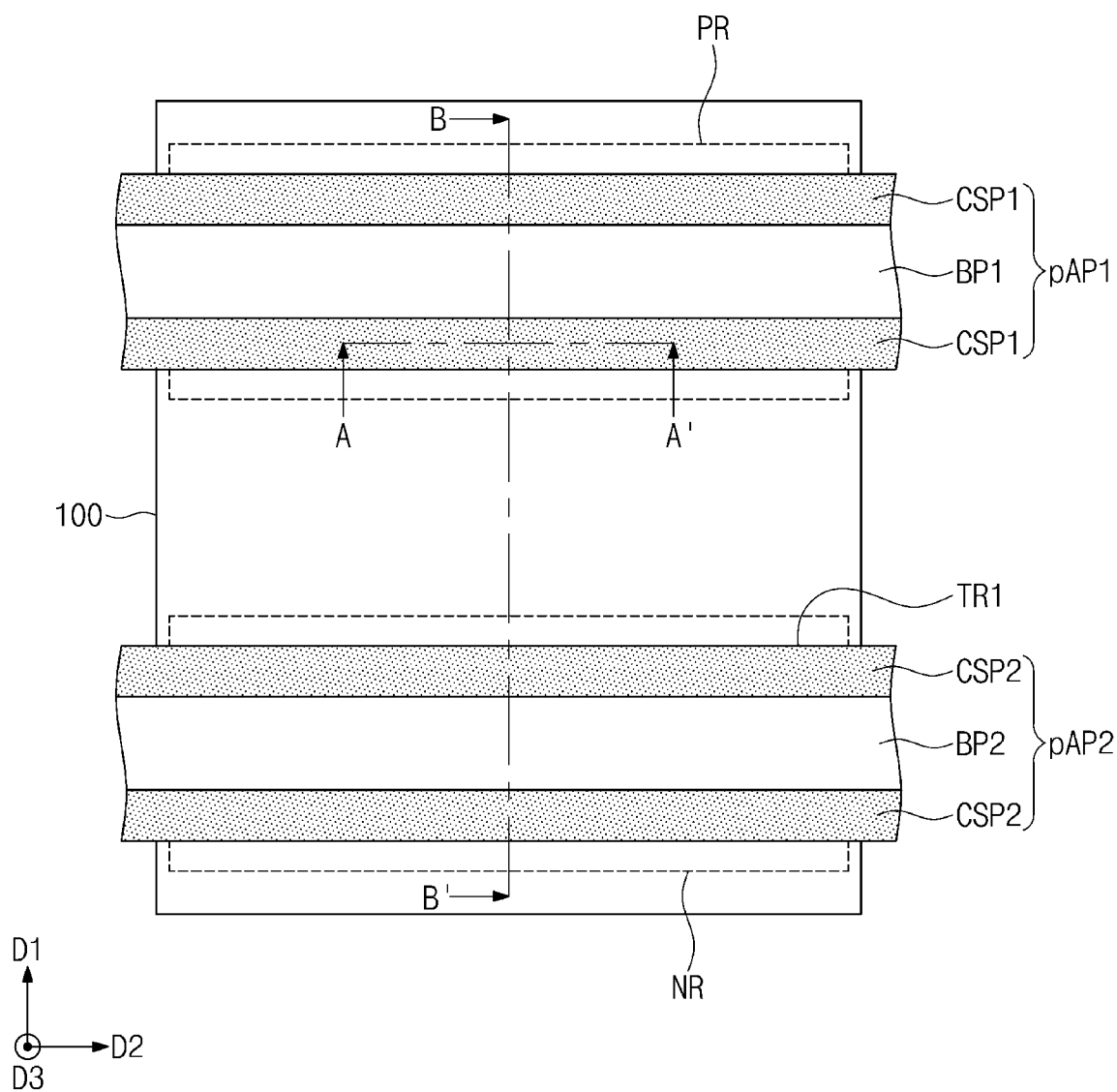
Figure 19B:
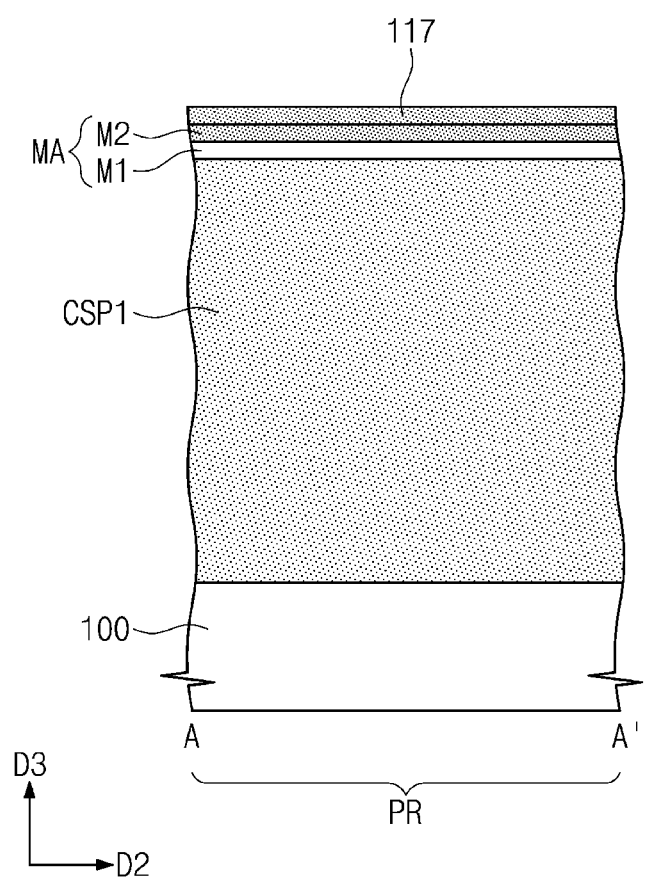
Figure 19C:
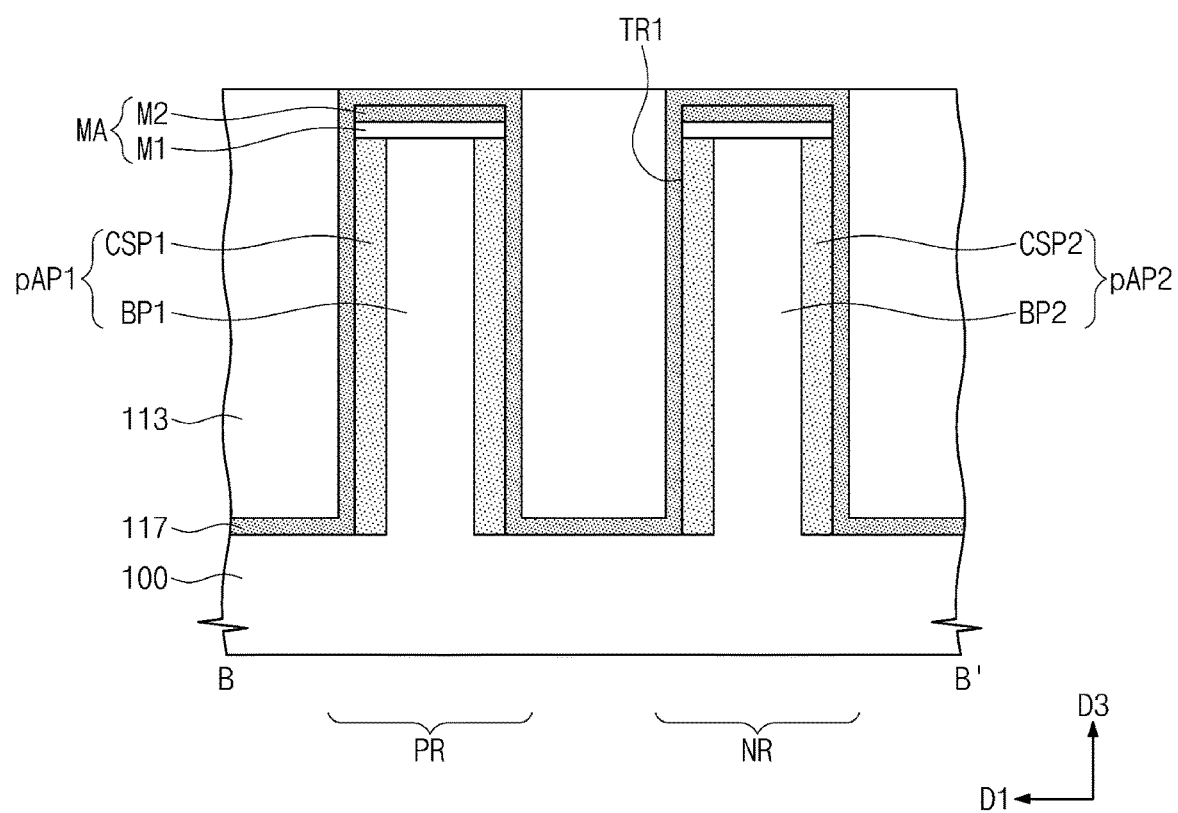

Referring to FIGS. 19A to 19C, a liner layer 117 may be formed on an entire top surface of the substrate 100. For example, the liner layer 117 may cover the top surface of the substrate 100, sidewalls of the first and second preliminary active patterns pAP1 and pAP2, and the top surfaces and sidewalls of the mask patterns MA. In an exemplary embodiment of the inventive concept, the liner layer 117 may include a nitride-based material. For example, the liner layer 117 may include silicon nitride (SiN), silicon carbonitride (SiCN), silicon-boron nitride (SiBN), and/or silicon-carbon-boron nitride (SiCBN). The liner layer 117 may be formed by using an atomic layer deposition (ALD) process, a low-pressure CVD (LPCVD) process, a plasma-enhanced CVD (PECVD) process, or a plasma nitration process. The liner layer 117 may inhibit or prevent the first and second channel semiconductor patterns CSP1 and CSP2 from being damaged in a subsequent process. For example, the liner layer 117 may reduce or prevent oxidation of exposed sidewalls of the first and second channel semiconductor patterns CSP1 and CSP2 by the heat generated in a subsequent process of forming a device isolation layer 113 and/or by oxygen atoms included in the device isolation layer 113.

Then, a device isolation layer 113 may completely fill the first trenches TR1. The device isolation layer 113 may cover the mask patterns MA. For example, the device isolation layer 113 may include a silicon oxide layer and/or a silicon oxynitride layer. Then, a planarization process may be performed on the device isolation layer 113 until the liner layer 117, disposed on the top surfaces of the mask patterns MA, is exposed. For example, the planarization process may include an etch-back process and/or a CMP process.

Figure 20A:
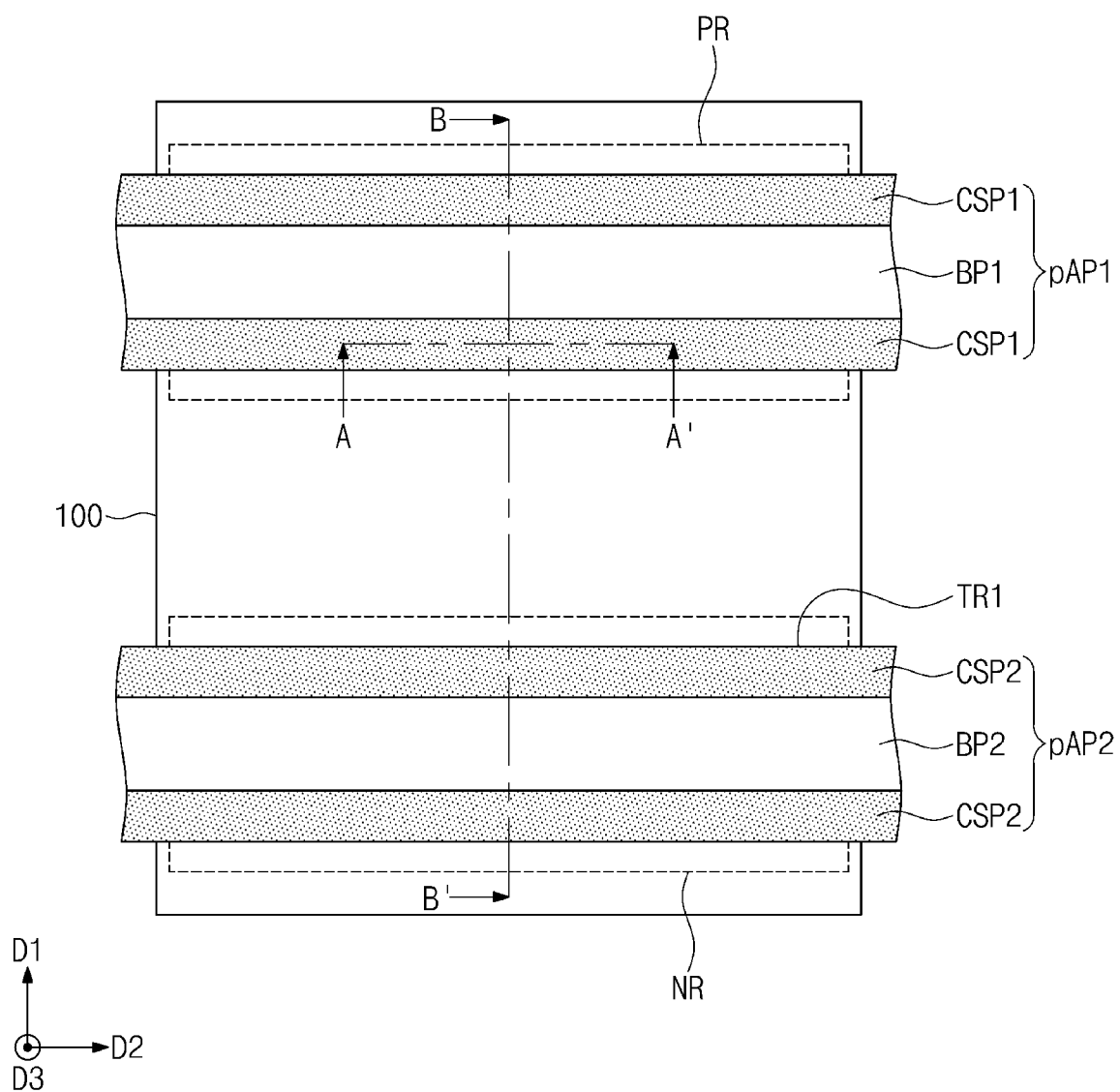
Figure 20B:
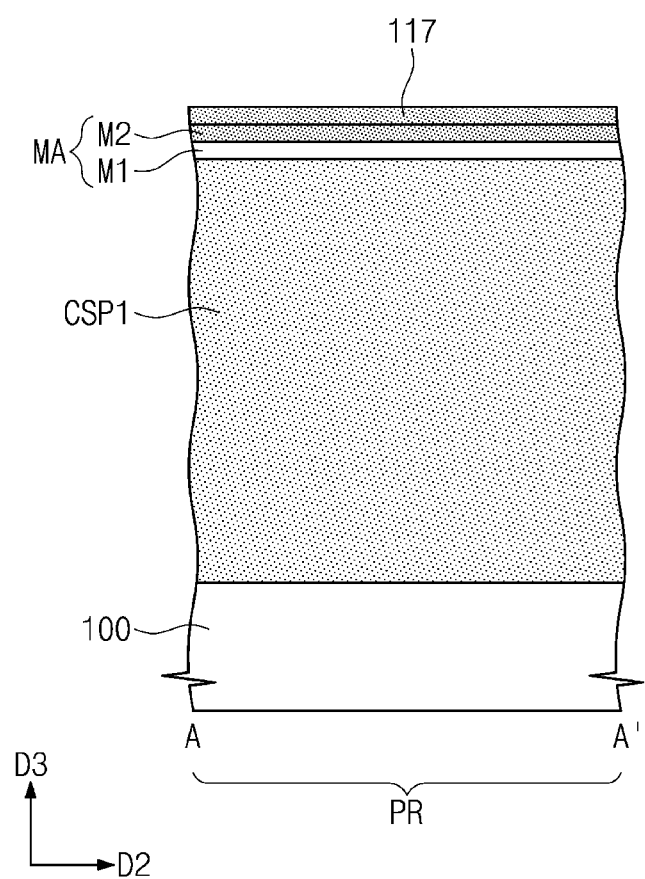
Figure 20C:
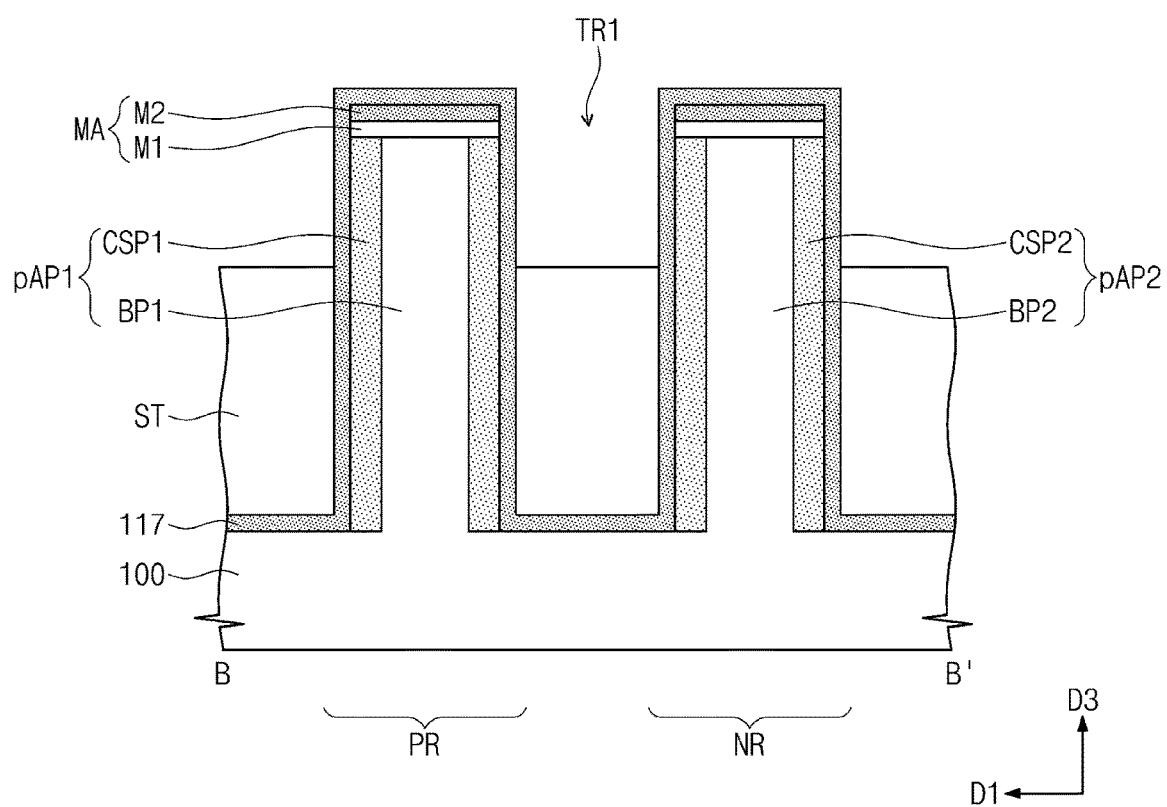

Referring to FIGS. 20A to 20C, the device isolation layer 113 may be recessed to form device isolation patterns ST. The device isolation patterns ST may have top surfaces that are higher than the top surface of the substrate 100 (e.g., the bottom surface of the first trench TR1) and are lower than top surfaces of the first and second preliminary active patterns pAP1 and pAP2. Thus, upper portions of the first and second preliminary active patterns pAP1 and pAP2 may vertically protrude from between the device isolation patterns ST. In addition, the liner layer 117 covering the protruding upper portions of the first and second preliminary active patterns pAP1 and pAP2 may be exposed by the recessed device isolation patterns ST.

Figure 21A:
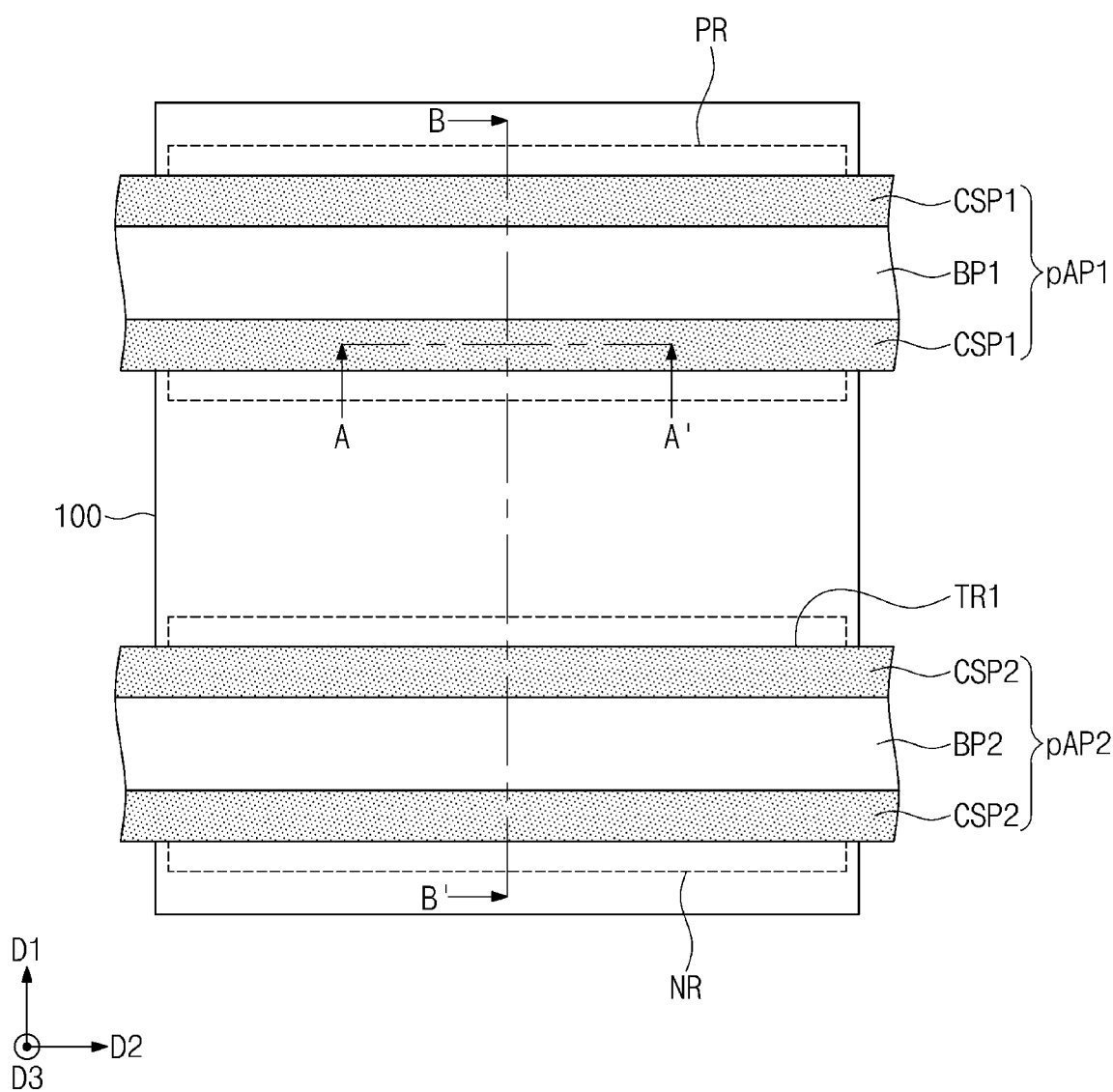
Figure 21B:
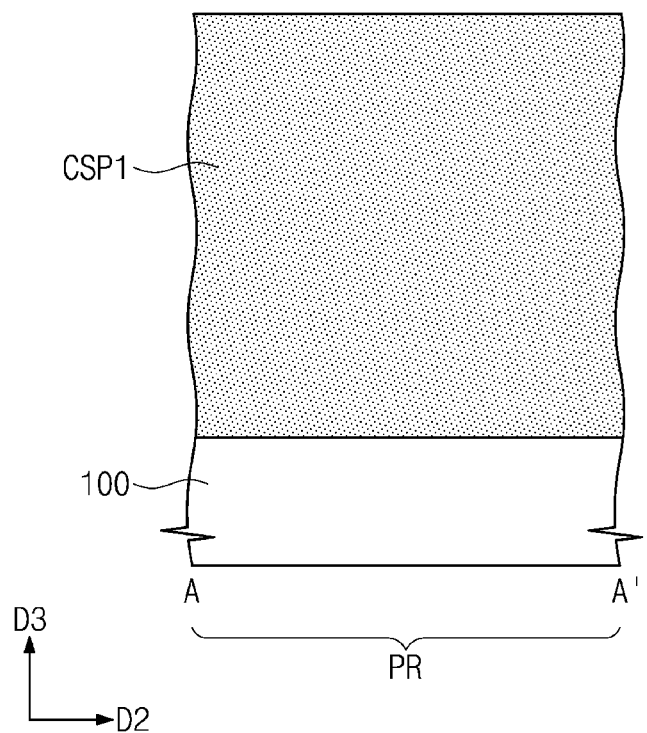
Figure 21C:
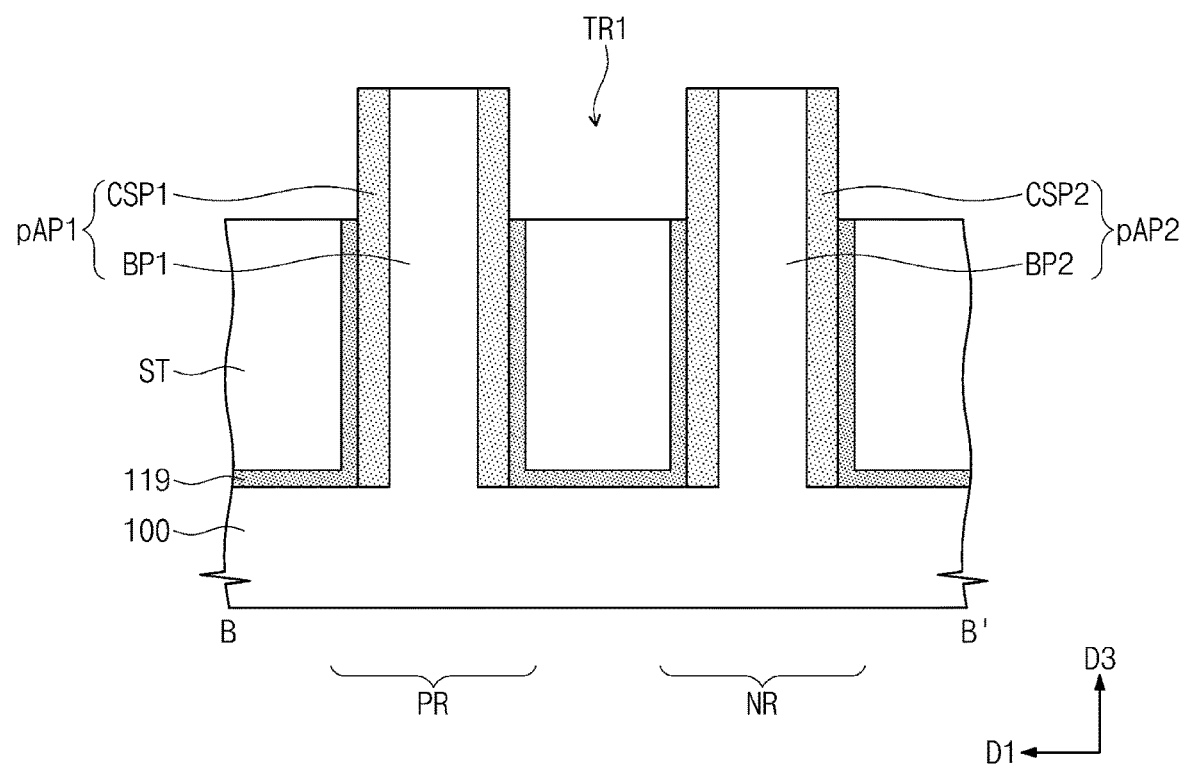

Referring to FIGS. 21A to 21C, the liner layer 117, exposed by the device isolation patterns ST, may be selectively removed to form liner patterns 119. Topmost surfaces of the liner patterns 119 may be substantially coplanar with the top surfaces of the device isolation patterns ST. In addition, the mask patterns MA may be selectively removed to expose the top surfaces of the first and second preliminary active patters pAP1 and pAP2. For example, the top surfaces of the first and second base patterns BP1 and BP2 may be exposed.

Figure 22A:
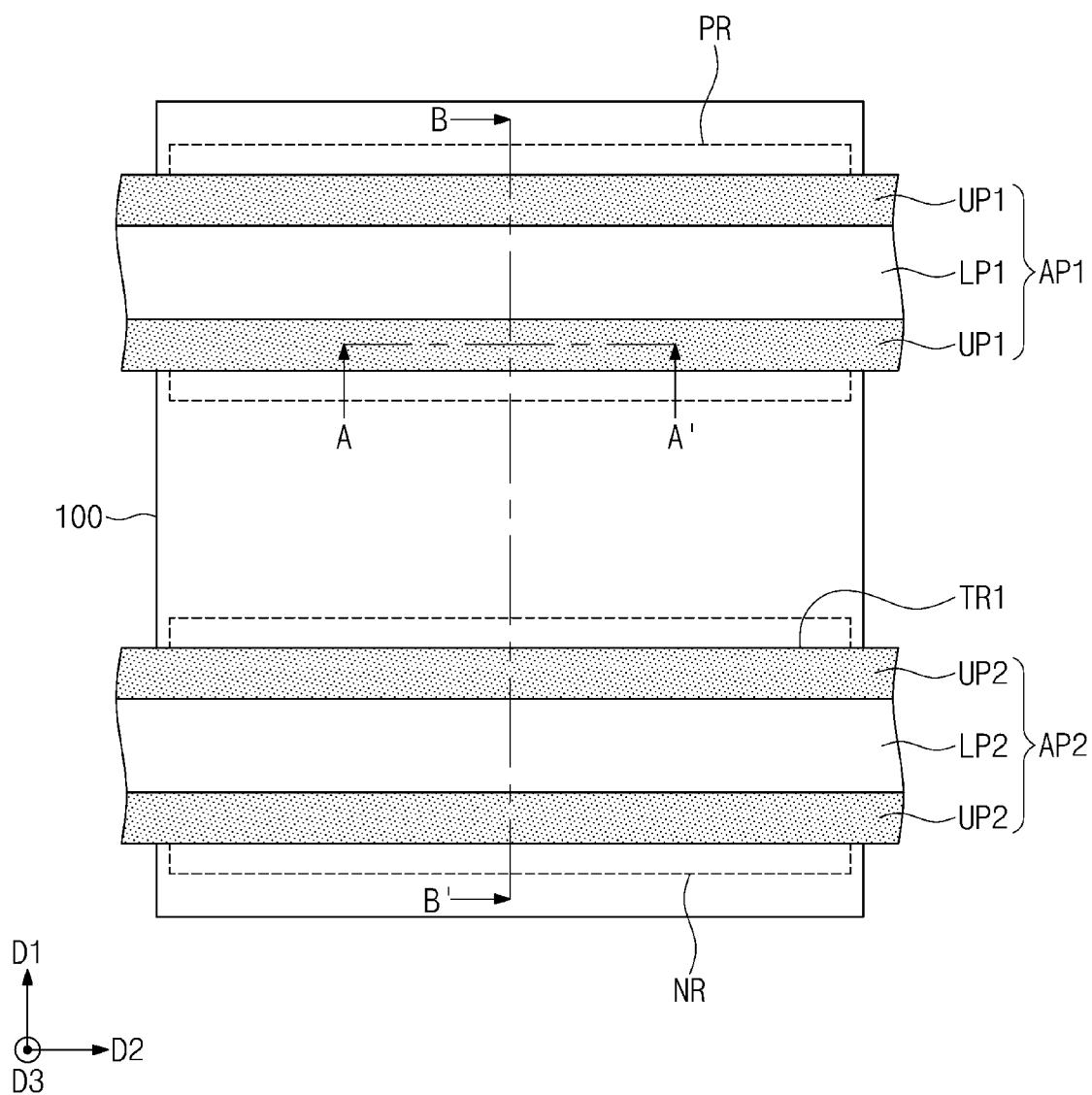
Figure 22B:
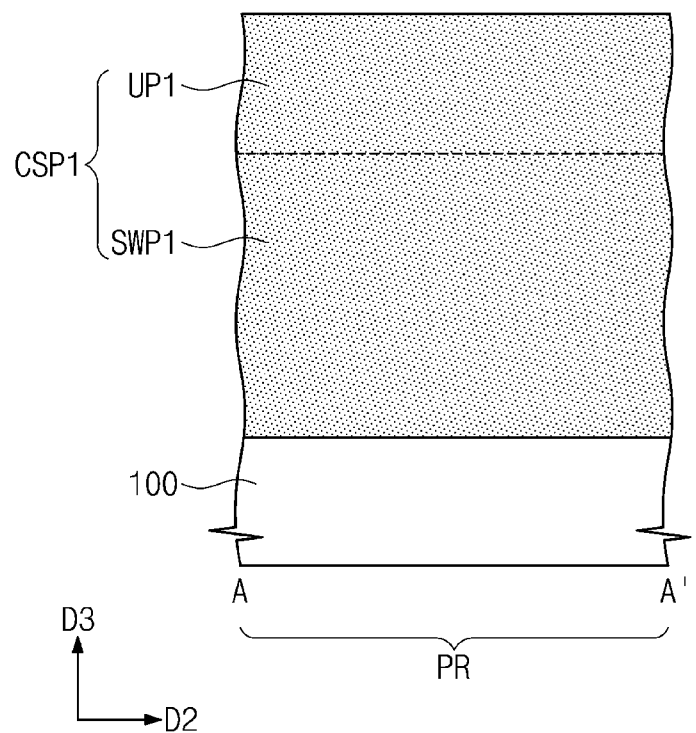
Figure 22C:
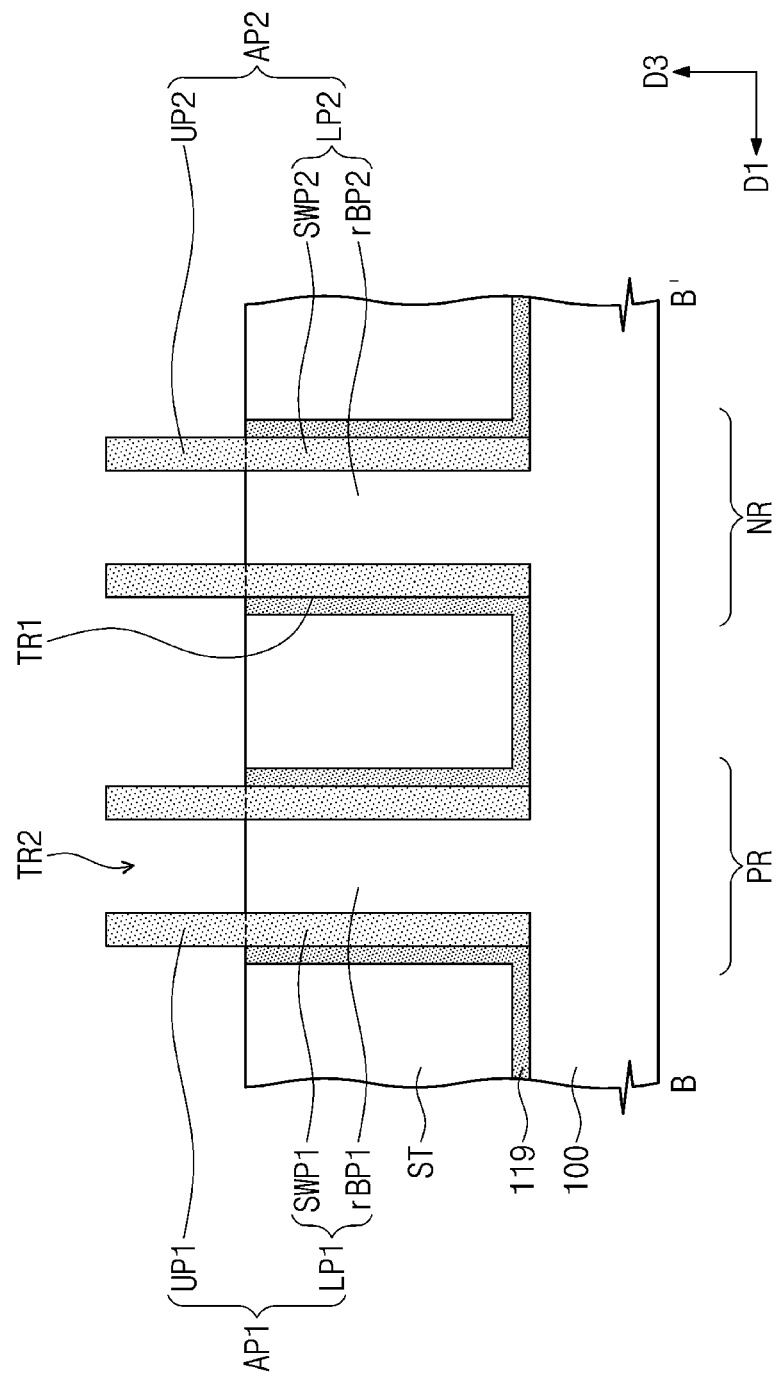

Referring to FIGS. 22A to 22C, the first and second exposed base patterns BP1 and BP2 may be selectively recessed to form second trenches TR2 between a pair of the first channel semiconductor patterns CSP1 and between a pair of the second channel semiconductor patterns CSP2, respectively. The second trenches TR2 may have bottom surfaces that are defined by top surfaces of first and second recessed base patterns rBP1 and rBP2. In an exemplary embodiment of the inventive concept, the top surfaces of the first and second recessed base patterns rBP1 and rBP2 may be lower in elevation or level, with respect to a surface of the substrate 100 facing the first and second recessed base patterns rBP1 and rBP2, than top surfaces of the first and second channel semiconductor patterns CSP1 and CSP2, and higher in elevation or level than the top surface of the substrate 100 (e.g., the bottom surface of the first trench TR1). In an exemplary embodiment of the inventive concept, the top surfaces of the first and second recessed base patterns rBP1 and rBP2 may be disposed at substantially the same elevation or level as the top surfaces of the device isolation patterns ST. In an exemplary embodiment of the inventive concept, even though not shown in the drawings, the top surfaces of the first and second recessed base patterns rBP1 and rBP2 may be disposed at a higher elevation or level than the top surfaces of the device isolation patterns ST, with respect to a surface of the substrate 100 facing the first and second recessed base patterns rBP1 and rBP2. In an exemplary embodiment of the inventive concept, even though not shown in the drawings, the top surfaces of the first and second recessed base patterns rBP1 and rBP2 may be disposed at a lower elevation or level than the top surfaces of the device isolation patterns ST.

The formation of first and second active patterns AP1 and AP2 may be completed when forming the second trenches TR2. The first active pattern AP1 may include a first lower pattern LP1 and a pair of first upper patterns UP1 disposed on the first lower pattern LP1. The first lower pattern LP1 may include the first recessed base pattern rBP1 and first sidewall patterns SWP1 disposed on both sidewalls of the first recessed base pattern rBP1. The first sidewall pattern SWP1 may be defined as a portion of the first channel semiconductor pattern CSP1, which is disposed under the elevation or level of the top surface of the first recessed base pattern rBP1. The first upper pattern UP1 may be defined as another portion of the first channel semiconductor pattern CSP1, which is disposed on the elevation or level of the top surface of the first recessed base pattern rBP1. The second active pattern AP2 may include a second lower pattern LP2 and a pair of second upper patterns UP2 disposed on the second lower pattern LP2. The second lower pattern LP2 may include the second recessed base pattern rBP2 and second sidewall patterns SWP2 disposed on both sidewalls of the second recessed base pattern rBP2. The second sidewall pattern SWP2 may be defined as a portion of the second channel semiconductor pattern CSP2, which is disposed under the elevation or level of the top surface of the second recessed base pattern rBP2. The second upper pattern UP2 may be defined as another portion of the second channel semiconductor pattern CSP2, which is disposed on the elevation or level of the top surface of the second recessed base pattern rBP2.

The first and second base patterns BP1 and BP2 may be selectively recessed by an etching process having an etch selectivity with respect to the first and second channel semiconductor patterns CSP1 and CSP2. For example, in the etching process, an etching rate of the first and second base patterns BP1 and BP2 may be higher than an etching rate of the first and second channel semiconductor patterns CSP1 and CSP2. The first and second base patterns BP1 and BP2, being the portions of the substrate 100, may include the first semiconductor material (e.g., silicon), and the first and second channel semiconductor patterns CSP1 and CSP2 may include the second semiconductor material (e.g., germanium). Thus, the etching rate of the first and second base patterns BP1 and BP2 by an etchant may be 10 times or more higher than the etching rate of the first and second channel semiconductor patterns CSP1 and CSP2 by using the same etchant. In an exemplary embodiment of the inventive concept, the etching process may be a wet etching process using an etching solution including, for example, ammonium hydroxide. In an exemplary embodiment of the inventive concept, the etching process may be a dry etching process using, for example, hydrogen bromide. The etching rate of the first and second base patterns BP1 and BP2, formed of silicon, may be higher than the etching rate of the first and second channel semiconductor patterns CSP1 and CSP2, including a high germanium content. Thus, the first and second base patterns BP1 and BP2 may be recessed to increase a margin of the process of forming the first and second active patterns AP1 and AP2 including the first and second upper patterns UP1 and UP2.

Subsequently, the same or similar processes as described with reference to FIGS. 8A to 10D may be performed to manufacture the semiconductor device described with reference to FIGS. 1 and 14A to 14C.

Figure 23:
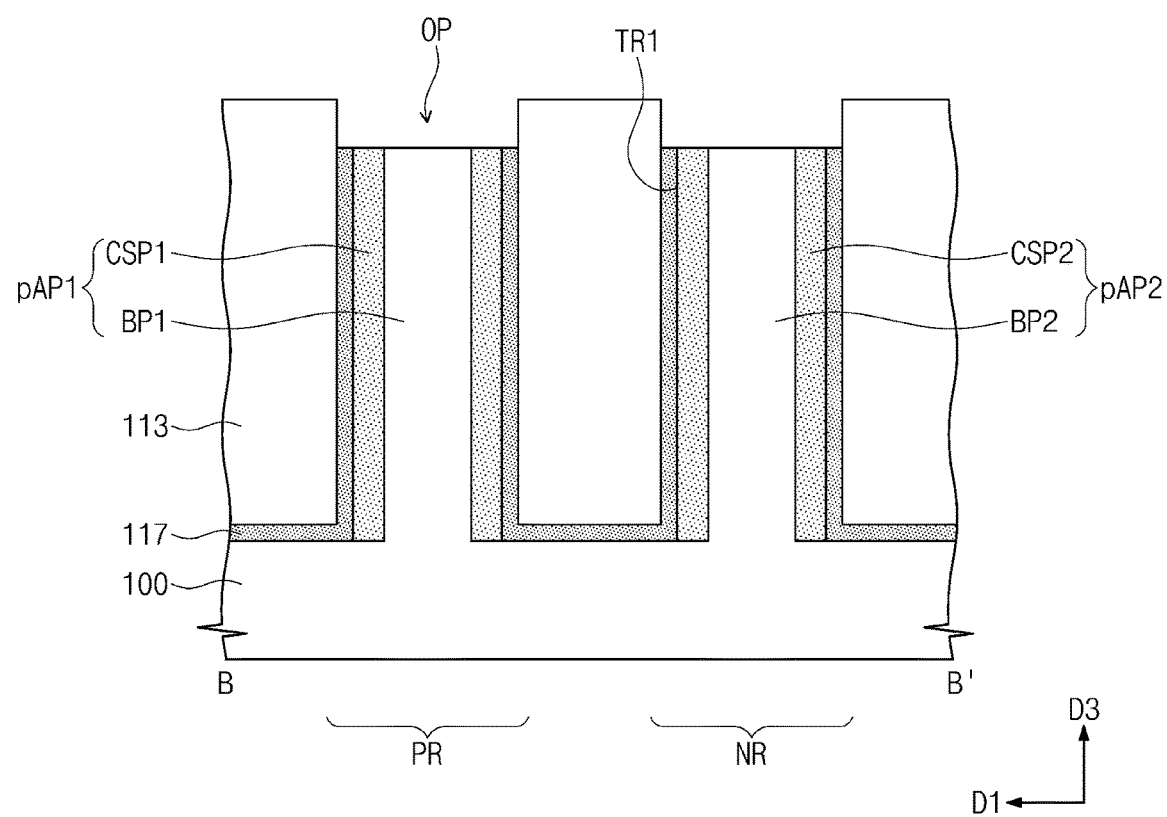
FIGS. 23 and 24 are cross-sectional views corresponding to the line B-B' of FIG. 22A illustrating a method for manufacturing a semiconductor device according to an exemplary embodiment of the inventive concept.
Figure 24:
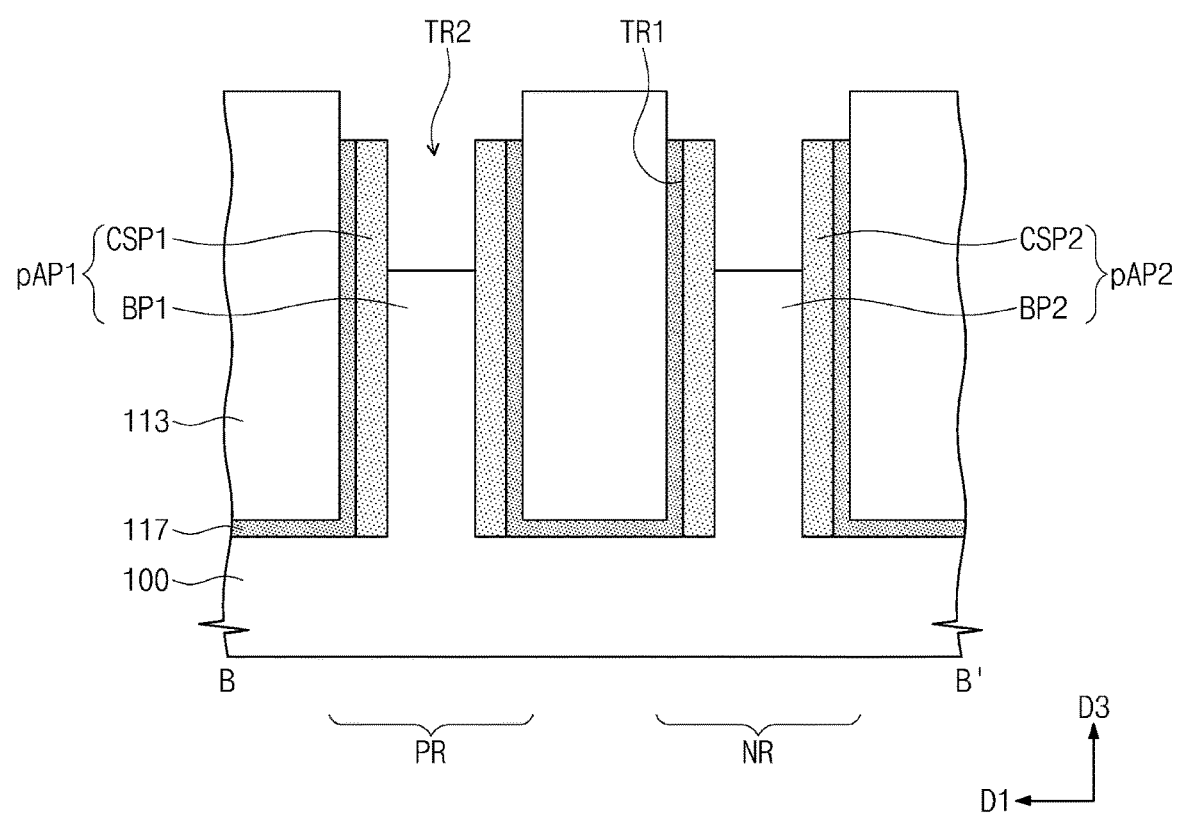

FIGS. 23 and 24 are cross-sectional views corresponding to the line B-B' of FIG. 22A illustrating a method for manufacturing a semiconductor device according to an exemplary embodiment of the inventive concept. Features not described again may be assumed to be the same as or similar to corresponding features already described with reference to FIGS. 15A to 22C.

Referring to FIG. 23, after the processes described with reference to FIGS. 19A to 19C, portions of the liner layer 117 and the mask patterns MA may be removed to form openings OP in the device isolation layer 113. The openings OP may expose top surfaces of the first and second channel semiconductor patterns CSP1 and CSP2 and top surfaces of the first and second base patterns BP1 and BP2.

Referring to FIG. 24, the first and second base patterns BP1 and BP2, exposed through the openings OP, may be selectively recessed to form second trenches TR2 between a pair of the first channel semiconductor patterns CSP1 and between a pair of the second channel semiconductor patterns CSP2, respectively. The second trenches TR2 may have bottom surfaces that are defined by top surfaces of first and second recessed base patterns rBP1 and rBP2. The first and second base patterns BP1 and BP2 may be selectively recessed using the same method described with reference to FIGS. 22A to 22C.

Then, the liner layer 117 and the device isolation layer 113 may be recessed to form the liner patterns 119 and the device isolation patterns ST. At the same time, the formation of the first and second active patterns AP1 and AP2 of FIGS. 22A to 22C may be completed.

Figure 25A:
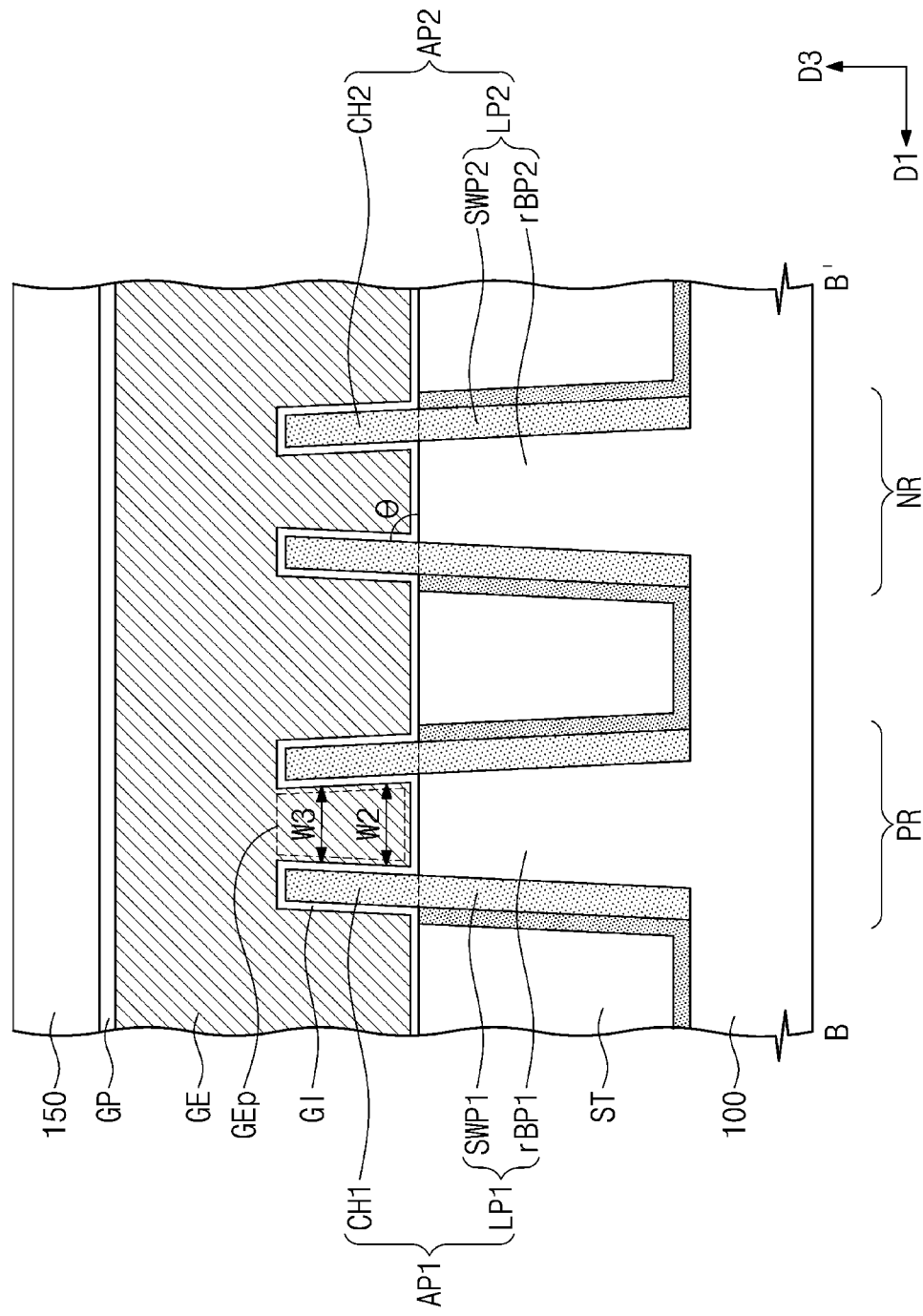
FIGS. 25A and 25B are cross-sectional views taken along lines B-B' and C-C' of FIG. 1, respectively, illustrating a semiconductor device according to an exemplary embodiment of the inventive concept.
Figure 25B:
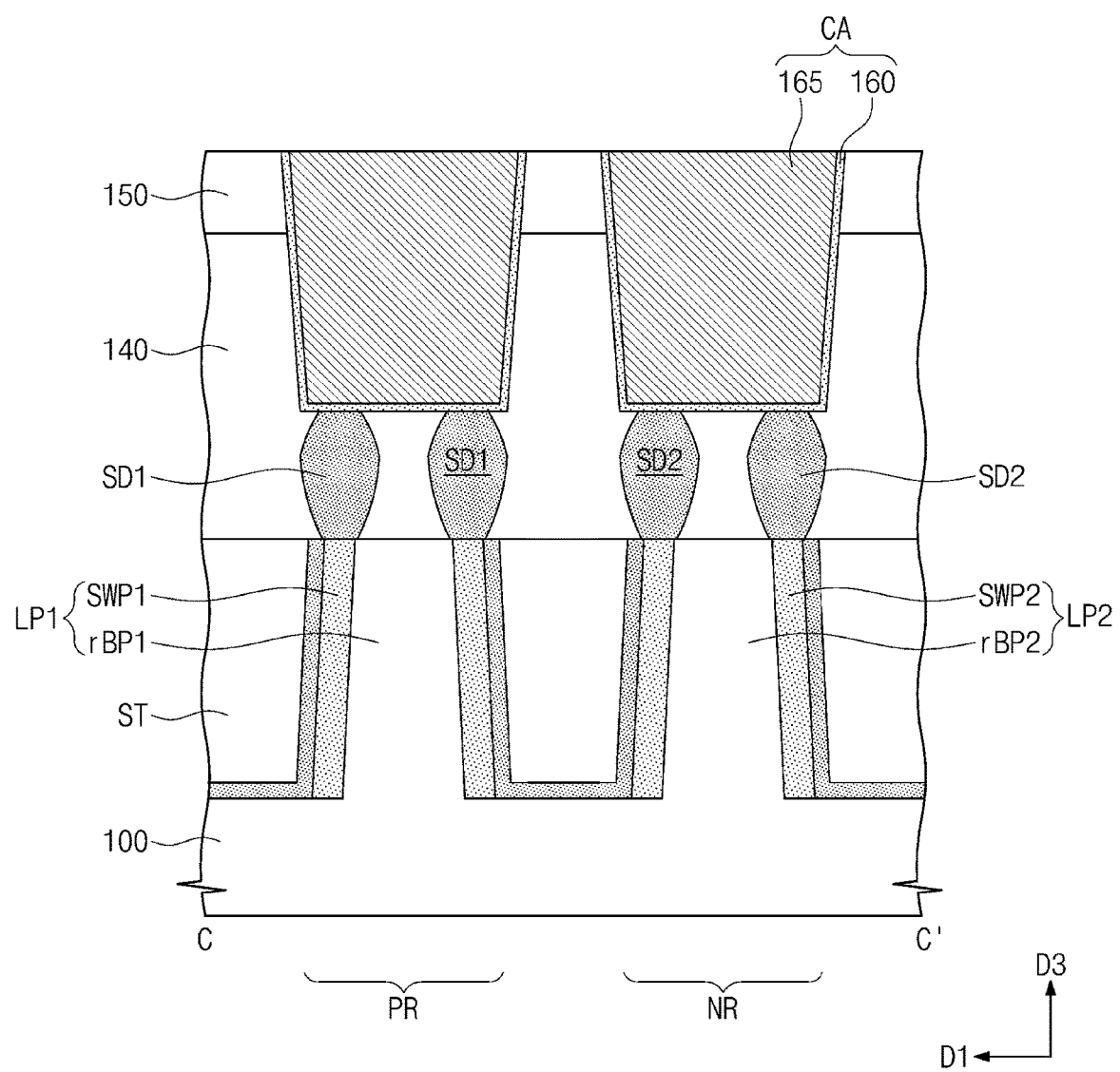

FIGS. 25A and 25B are cross-sectional views taken along lines B-B' and C-C' of FIG. 1, respectively, illustrating a semiconductor device according to an exemplary embodiment of the inventive concept. Features not described again may be assumed to be the same as or similar to corresponding features already described with reference to FIGS. 1 and 14A to 14C.

Referring to FIGS. 1, 14A, 25A, and 25B, a first active pattern AP1 extending in the second direction D2 may be disposed in the PMOSFET region PR, and a second active pattern AP2 extending in the second direction D2 may be disposed in the NMOSFET region NR.

The first active pattern AP1 may include a first lower pattern LP1 and a pair of first channel patterns CH1 disposed on the first lower pattern LP1. The first lower pattern LP1 may include a first recessed base pattern rBP1 and first sidewall patterns SWP1 disposed on both sidewalls of the first recessed base pattern rBP1. The second active pattern AP2 may include a second lower pattern LP2 and a pair of second channel patterns CH2 disposed on the second lower pattern LP2. The second lower pattern LP2 may include a second recessed base pattern rBP2 and second sidewall patterns SWP2 disposed on both sidewalls of the second recessed base pattern rBP2.

As illustrated in FIGS. 25A and 25B, a width of each of the first and second lower patterns LP1 and LP2 may decrease as a height in a vertical direction (e.g., the third direction D3) increases when viewed in a cross-sectional view taken in the first direction D1. For example, sidewalls of the first and second lower patterns LP1 and LP2 may have a positive gradient. As illustrated in FIG. 25A, a sidewall of one of the pair of first channel patterns CH1 may be aligned with a sidewall of the first lower pattern LP1 (e.g., a sidewall of one of the first sidewall patterns SWP1), and a sidewall of the other of the pair of first channel patterns CH1 may be aligned with another sidewall of the first lower pattern LP1 (e.g., a sidewall of the other of the first sidewall patterns SWP1). For example, the sidewalls of the first channel patterns CH1 may have a positive gradient. Thus, each of the first channel patterns CH1 may form an angle θ with a top surface of the first lower pattern LP1, and the angle θ may range from about 60 degrees to about 89 degrees. A sidewall of one of the pair of second channel patterns CH2 may be aligned with a sidewall of the second lower pattern LP2 (e.g., a sidewall of one of the second sidewall patterns SWP2), and a sidewall of the other of the pair of second channel patterns CH2 may be aligned with another sidewall of the second lower pattern LP2 (e.g., a sidewall of the other of the second sidewall patterns SWP2). For example, the sidewalls of the second channel patterns CH2 may have a positive gradient. Thus, each of the second channel patterns CH2 may form the angle θ with a top surface of the second lower pattern LP2.

Gate electrodes GE may extend in the first direction D1 on the substrate 100 and may intersect the first and second channel patterns CH1 and CH2. Referring to FIG. 25A, each of the gate electrodes GE may include a portion GEp disposed between the pair of first channel patterns CH1 when viewed in a cross-sectional view taken along the first direction D1. Here, a width of the portion GEp may decrease as a height from the substrate 100 increases. For example, a lower portion of the portion GEp may have a second width W2, and an upper portion of the portion GEp may have a third width W3 smaller than the second width W2. Each of the gate electrodes GE may further include another portion disposed between the pair of second channel patterns CH2, and features of the another portion may be the same or similar as the aforementioned features of the portion GEp.

Figure 26:
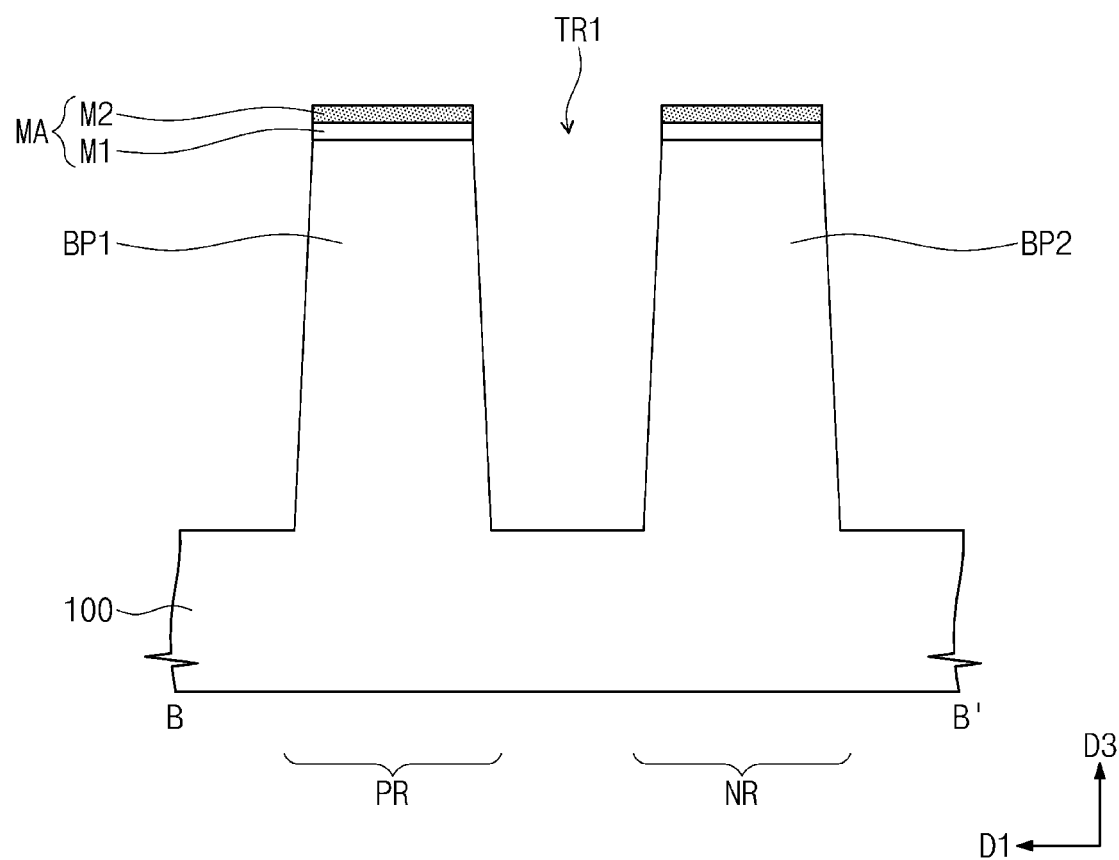
FIGS. 26, 27, and 28 are cross-sectional views taken along lines B-B' of FIGS. 15A, 16A, and 17A, respectively, illustrating a method for manufacturing a semiconductor device according to an exemplary embodiment of the inventive concept.
Figure 27:
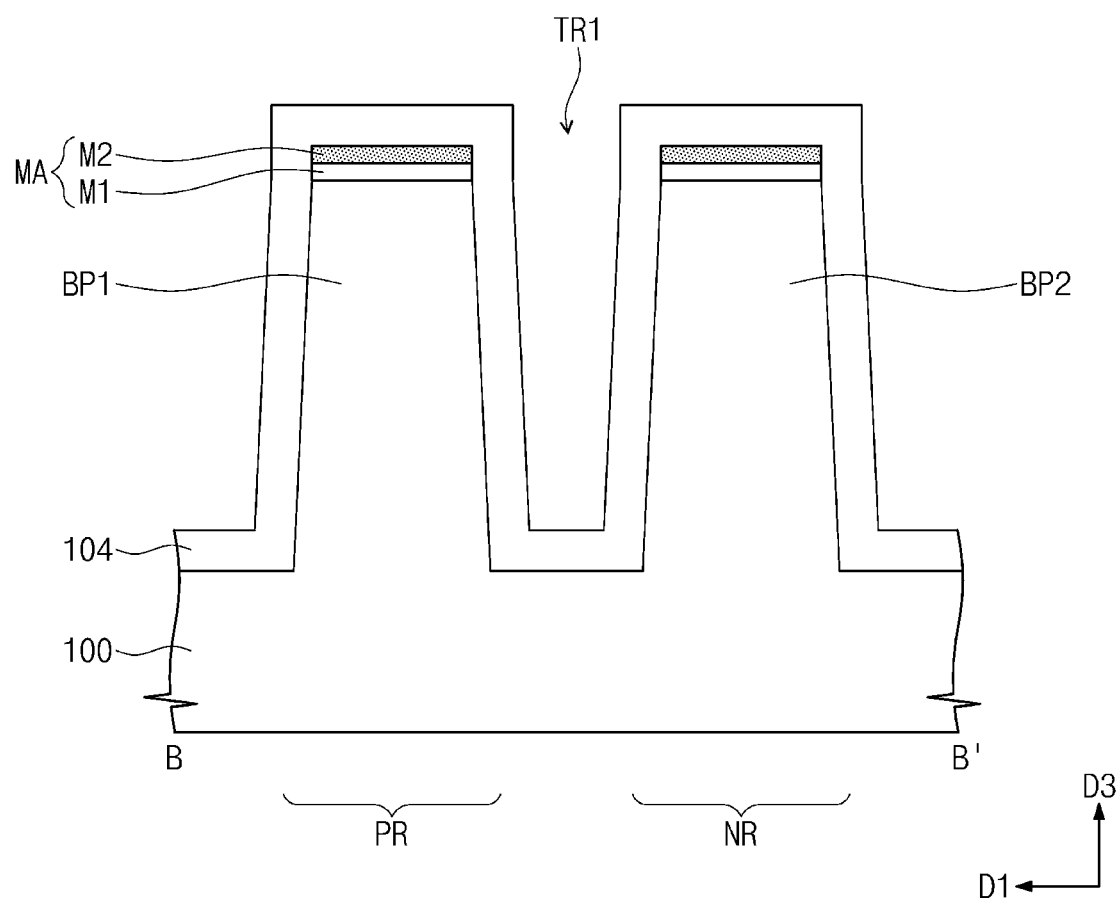
Figure 28:
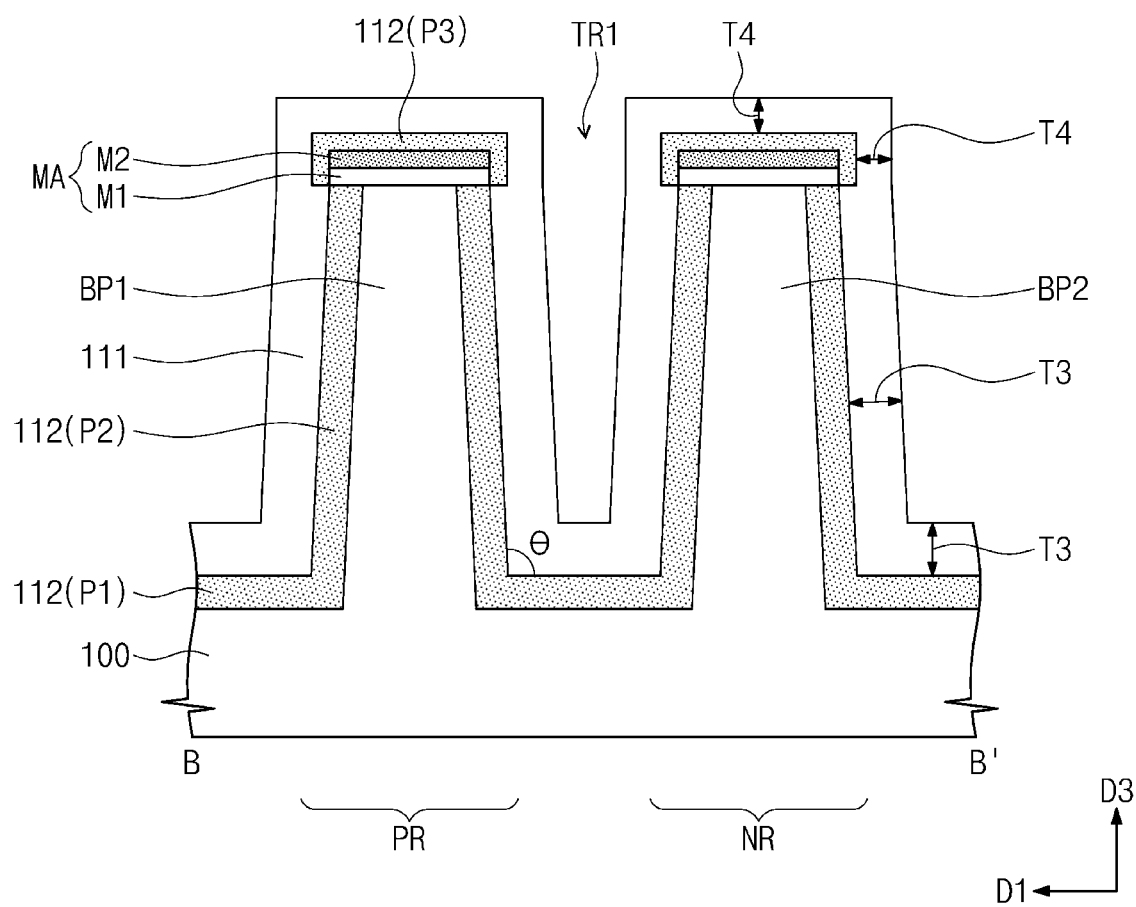

FIGS. 26, 27, and 28 are cross-sectional views taken along lines B-B' of FIGS. 15A, 16A, and 17A, respectively, illustrating a method for manufacturing a semiconductor device according to an exemplary embodiment of the inventive concept. Features not described again may be assumed to be the same as or similar to corresponding features already described with reference to FIGS. 15A to 22C.

Referring to FIGS. 15A, 15B, and 26, an upper portion of the substrate 100 may be patterned to form a first base pattern BP1 in the PMOSFET region PR and a second base pattern BP2 in the NMOSFET region NR. Unlike in FIG. 15C, a width in the first direction D1 of each of the first and second base patterns BP1 and BP2 may decrease as an elevation or level with respect to the substrate 100 in a vertical direction (e.g., the third direction D3) increases. For example, the width of each of the first and second base patterns BP1 and BP2 may become progressively smaller toward a top surface of each of the first and second base patterns BP1 and BP2. Sidewalls of the first and second base patterns BP1 and BP2 may have a positive gradient.

Referring to FIGS. 16A, 16B, and 27, a semiconductor layer 104 may be formed on the substrate 100. The semiconductor layer 104 may cover the top surface of the substrate 100, inclined sidewalls of the first and second base patterns BP1 and BP2, and sidewalls and top surfaces of the mask patterns MA.

Referring to FIGS. 17A, 17B, and 28, a process cycle including an oxidation process and a thermal treatment process, which may be sequentially performed, may be performed at least one time on the substrate 100. Accordingly, the oxide layer 111 and a channel semiconductor layer 112 may be formed. The channel semiconductor layer 112 may include a first portion P1 disposed between the oxide layer 111 and the substrate 100, a second portion P2 disposed between the oxide layer 111 and the base patterns BP1 and BP2, and a third portion P3 disposed between the oxide layer 111 and the mask patterns MA.

The second portion P2 of the channel semiconductor layer 112 may be formed along the inclined profiles of the first and second base patterns BP1 and BP2 described above with reference to FIGS. 15A, 15B, and 26. Thus, the second portion P2 of the channel semiconductor layer 112 may form an angle θ with a top surface of the first portion P1 of the channel semiconductor layer 112, and the angle θ may range from about 60 degrees to 89 about degrees.

Subsequently, the same or similar processes as described with reference to FIGS. 18A to 22C may be performed to manufacture the semiconductor device described with reference to FIGS. 1, 14A, 25A, and 25B.

According to an exemplary embodiment of the inventive concept, the semiconductor layer including the first and second semiconductor materials may be oxidized to form a pair of the channel patterns. During the oxidation process, the second semiconductor material may be concentrated in the channel patterns. Thus, the channel patterns may include a high concentration of the second semiconductor material. Accordingly, since the channel patterns, including the second semiconductor material, are formed without additional processes (e.g., processes of depositing and patterning the second semiconductor material), process costs of the semiconductor device may be reduced. In addition, since the channel patterns are formed to have relatively small widths and to occupy little space, the semiconductor device can be highly integrated.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. A method for manufacturing a semiconductor device, comprising:
   forming a base pattern protruding from a substrate;
   forming a semiconductor layer covering the base pattern;
   oxidizing the semiconductor layer to form an oxide layer, and forming a channel semiconductor layer between the oxide layer and the substrate and between the oxide layer and the base pattern;
   patterning the channel semiconductor layer to form a pair of channel semiconductor patterns on opposing sidewalk of the base pattern; and
   removing a portion of the base pattern disposed between the pair of channel semiconductor patterns to form an active pattern, the active pattern comprising the pair of channel semiconductor patterns,
   wherein the base pattern includes a first semiconductor material, and
   wherein the semiconductor layer includes a compound of the first semiconductor material and a second semiconductor material different from the first semiconductor material.

2. The method of claim 1, wherein the oxide layer includes an oxide of the first semiconductor material, and
   wherein the second semiconductor material is concentrated on the oxide layer or at a side surface of the oxide layer to form the channel semiconductor layer when the oxide layer is formed.

3. The method of claim 1, wherein the oxidizing of the semiconductor layer comprises performing an oxidation process cycle at least once,
   wherein the oxidation process cycle comprises an oxidation process and a thermal treatment process, and
   wherein the oxidation and thermal treatment processes are sequentially performed.

4. The method of claim 1, wherein the forming of the base pattern comprises:
   forming a mask pattern on the substrate; and
   etching an upper portion of the substrate using the mask pattern as an etching mask to form a pair of trenches adjacent to the base pattern.

5. The method of claim 4, wherein the mask pattern remains on a top surface of the base pattern after the formation of the trenches, and
   wherein the semiconductor layer is formed to cover a top surface of the mask pattern.

6. The method of claim 5, wherein the channel semiconductor layer comprises:
   a first portion formed in the substrate and facing the oxide layer, wherein at least a part of the first portion does not overlap the base pattern;
   a second portion formed in the base pattern adjacent to a side of the oxide layer; and
   a third portion formed between the oxide layer and the mask pattern,
   wherein at least a part of the second portion overlaps the mask pattern.

7. The method of claim 6, wherein the patterning of the channel semiconductor layer comprises performing an anisotropic etching process on an entire top surface of the substrate,
   wherein, during the anisotropic etching process, the oxide layer and the first and third portions are completely removed but the second portion remains in place, and
   wherein the second portion forms the pair of channel semiconductor patterns.

8. The method of claim 1, further comprising forming a liner layer covering the channel semiconductor patterns before the removing of the portion of the base pattern,
   wherein the liner layer includes silicon nitride (SiN), silicon carbonitride (SiCN), silicon-boron nitride (SiBN), or silicon-carbon-boron nitride (SiCBN).

9. The method of claim 1, wherein a width of the base pattern decreases as a distance with respect to a first surface of the substrate increases, the first surface of the substrate facing the base pattern.

* * * * *